(12) United States Patent
Rajashekhar et al.

(10) Patent No.: US 11,049,880 B2
(45) Date of Patent: Jun. 29, 2021

(54) THREE-DIMENSIONAL MEMORY DEVICE CONTAINING EPITAXIAL FERROELECTRIC MEMORY ELEMENTS AND METHODS FOR FORMING THE SAME

(71) Applicant: SANDISK TECHNOLOGIES LLC, Addison, TX (US)

(72) Inventors: Adarsh Rajashekhar, Santa Clara, CA (US); Fei Zhou, San Jose, CA (US); Rahul Sharangpani, Fremont, CA (US); Raghuveer S. Makala, Campbell, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 52 days.

(21) Appl. No.: 16/530,256

(22) Filed: Aug. 2, 2019

(65) Prior Publication Data
US 2021/0036018 A1    Feb. 4, 2021

(51) Int. Cl.
*H01L 27/11597* (2017.01)
*H01L 27/1157* (2017.01)
*H01L 27/11582* (2017.01)
*H01L 27/11587* (2017.01)
*H01L 27/11565* (2017.01)
*H01L 27/11519* (2017.01)
(Continued)

(52) U.S. Cl.
CPC .... *H01L 27/11597* (2013.01); *H01L 27/1157* (2013.01); *H01L 27/1159* (2013.01); *H01L 27/11519* (2013.01); *H01L 27/11524* (2013.01); *H01L 27/11556* (2013.01); *H01L 27/11565* (2013.01); *H01L 27/11582* (2013.01); *H01L 27/11587* (2013.01)

(58) Field of Classification Search
CPC ......... H01L 27/11597; H01L 27/11582; H01L 27/1159; H01L 27/11565; H01L 27/11587; H01L 27/11519; H01L 27/11556; H01L 27/1157; H01L 27/11524
See application file for complete search history.

(56) References Cited

U.S. PATENT DOCUMENTS

| 5,915,167 A | 6/1999 | Leedy |
| 8,349,681 B2 | 1/2013 | Alsmeier et al. |

(Continued)

FOREIGN PATENT DOCUMENTS

| KR | 10-2018-0059271 A | 6/2018 |
| KR | 20180059271 | * 6/2018 |

OTHER PUBLICATIONS

Notification of Transmittal of the International Search Report and Written Opinion of the International Search Authority for International Patent Application No. PCT/US2020/024394, dated Jul. 23, 2020, 10 pages.

(Continued)

*Primary Examiner* — Karen Kusumakar
(74) *Attorney, Agent, or Firm* — The Marbury Law Group PLLC

(57) ABSTRACT

A three-dimensional memory device includes an alternating stack of insulating layers and electrically conductive layers located over a substrate, and memory stack structures extending through the alternating stack. Each of the memory stack structures includes a vertical stack of single crystalline ferroelectric dielectric layers and a respective vertical semiconductor channel.

6 Claims, 52 Drawing Sheets

(51) Int. Cl.
    *H01L 27/11524*     (2017.01)
    *H01L 27/11556*     (2017.01)
    *H01L 27/1159*     (2017.01)

(56) References Cited

U.S. PATENT DOCUMENTS

| | | | |
|---|---|---|---|
| 9,230,980 | B2 | 1/2016 | Rabkin et al. |
| 9,252,151 | B2 | 2/2016 | Chien et al. |
| 9,397,093 | B2 * | 7/2016 | Makala ............... H01L 21/8239 |
| 9,627,395 | B2 | 4/2017 | Zhang et al. |
| 9,691,884 | B2 | 6/2017 | Makala et al. |
| 9,870,945 | B2 | 1/2018 | Pachamuthu |
| 9,941,299 | B1 | 4/2018 | Chen et al. |
| 10,121,794 | B2 | 11/2018 | Gunji-Yoneoka et al. |
| 10,121,965 | B1 | 11/2018 | Uno et al. |
| 2005/0189571 | A1 * | 9/2005 | Karasawa ............ H01L 27/101 |
| | | | 257/213 |
| 2014/0220750 | A1 * | 8/2014 | Sohn .................. H01L 29/7926 |
| | | | 438/269 |
| 2018/0130823 | A1 | 5/2018 | Kim |
| 2018/0323214 | A1 | 11/2018 | Karda et al. |
| 2019/0198525 | A1 | 6/2019 | Arreghini |

OTHER PUBLICATIONS

Kobayashi et al, "Selective Germanium Epitaxial Growth on Silicon Using CVD Technology with Ultra-Pure Gases", J. Crystal Growth, 99 (1990) pp. 259-262.

P. D. Lomenzo et al, "Ferroelectric Si-Doped HfO2 Device Properties on Highly Doped Germanium", IEEE EDL, vol. 36, No. 8, Aug. 2015, 3 pages.

Endoh, T. et al., "Novel Ultra High Density Flash Memory with a Stacked-Surrounding Gate Transistor (S-GT) Structured Cell," IEDM Proc., pp. 33-36, (2001).

M. H. Park et al., J. Mater. Chem. C, 2017, 5,-4677-4690.

Migita et al., "Preparation of Epitaxial HfO2 Film (EOT=0.5 nm) on Si Substrate Using Atomic-Layer Deposition of Amorphous Film and Rapid Thermal Crystallization (RTC) in an Abrupt Temperature Gradient," IEDM (2010).

Y. Morita et al., "Two-step Annealing Effects on Ultrathin EOT higher-k (k=40) ALD HfO2 Gate Stacks," Solid State Electronics, vol. 84 (2013).

S. J. Wang and C. K. Ong, "Epitaxial Y-stabilized ZrO2 Films on Silicon: Dynamic Growth Process and Interface Structure," Applied Physics Letters, vol. 80, No. 14, Apr. 8, 2002.

J.Y. Dai et al., "Epitaxial Growth of Yttrium-Stabilized HfO2 high-k gate Dielectric Thin Films on Si," Journal of Applied Physics, vol. 94, No. 2, Jul. 15, 2003.

U.S. Appl. No. 16/200,115, filed Nov. 26, 2018, Sandisk Technologies LLC.
U.S. Appl. No. 16/227,889, filed Dec. 20, 2018, Sandisk Technologies LLC.
U.S. Appl. No. 16/249,300, filed Jan. 16, 2019, Sandisk Technologies LLC.
U.S. Appl. No. 16/268,132, filed Feb. 5, 2019, Sandisk Technologies LLC.
U.S. Appl. No. 16/268,183, filed Feb. 5, 2019, Sandisk Technologies LLC.
U.S. Appl. No. 16/290,277, filed Mar. 1, 2019, Sandisk Technologies LLC.
U.S. Appl. No. 16/291,673, filed Mar. 4, 2019, Sandisk Technologies LLC.
U.S. Appl. No. 16/295,206, filed Mar. 7, 2019, Sandisk Technologies LLC.
U.S. Appl. No. 16/407,310, filed May 9, 2019, Sandisk Technologies LLC.
U.S. Appl. No. 16/412,764, filed May 15, 2019, Sandisk Technologies LLC
U.S. Appl. No. 16/454,458, filed Jun. 27, 2019, Sandisk Technologies LLC.
U.S. Appl. No. 16/454,475, filed Jun. 27, 2019, Sandisk Technologies LLC.
U.S. Appl. No. 16/456,736, filed Jun. 28, 2019, Sandisk Technologies LLC.
U.S. Appl. No. 16/457,687, filed Jun. 28, 2019, Sandisk Technologies LLC.
U.S. Appl. No. 16/457,721, filed Jun. 28, 2019, Sandisk Technologies LLC.

* cited by examiner

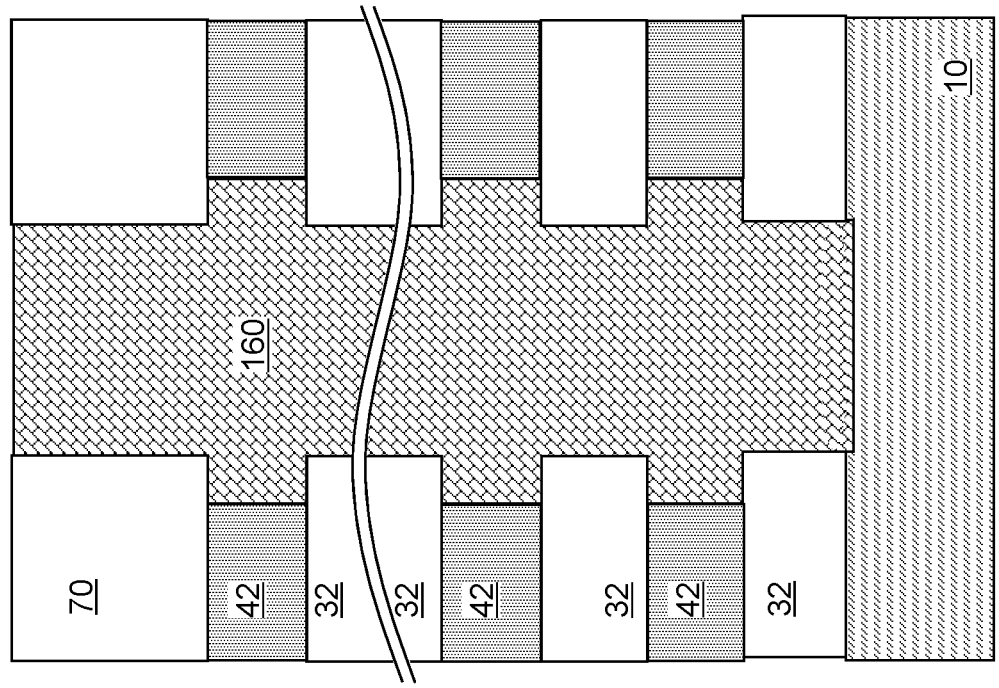
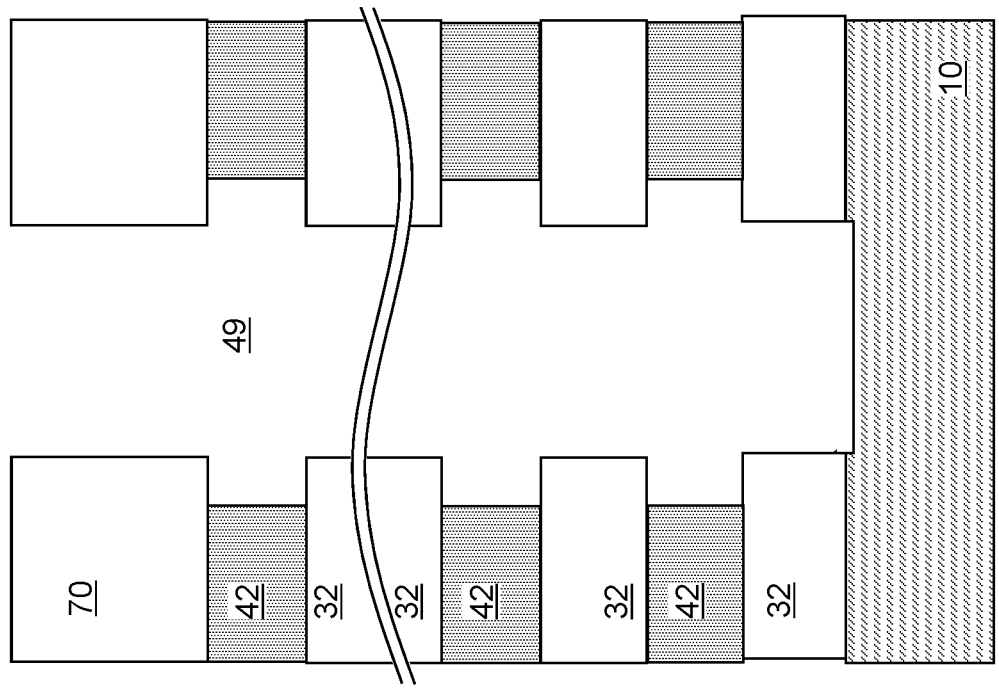

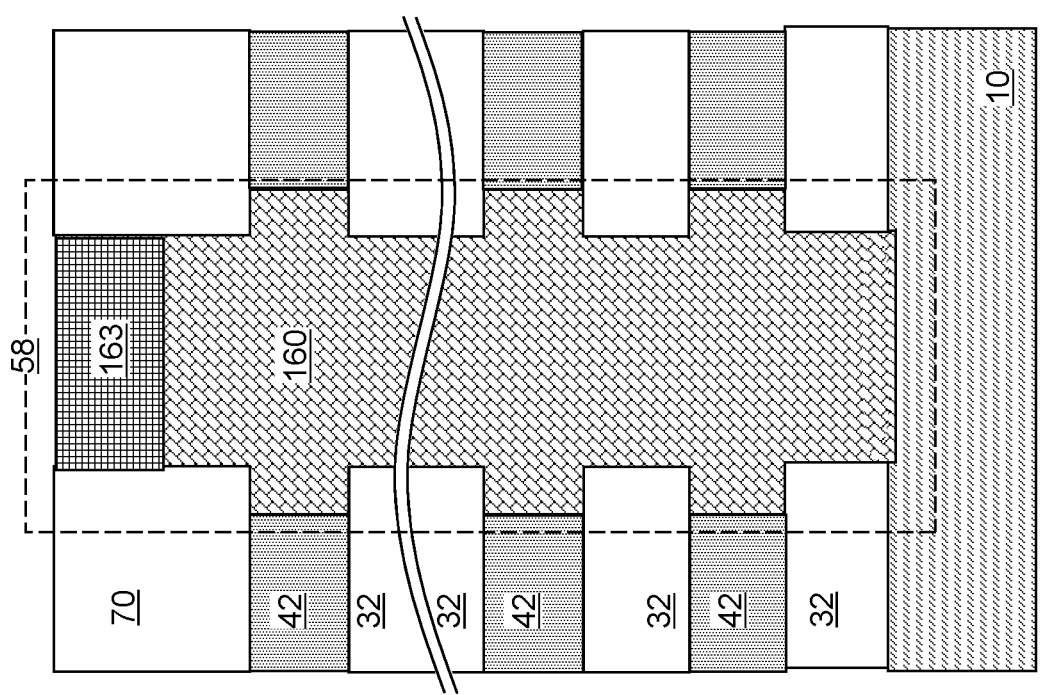

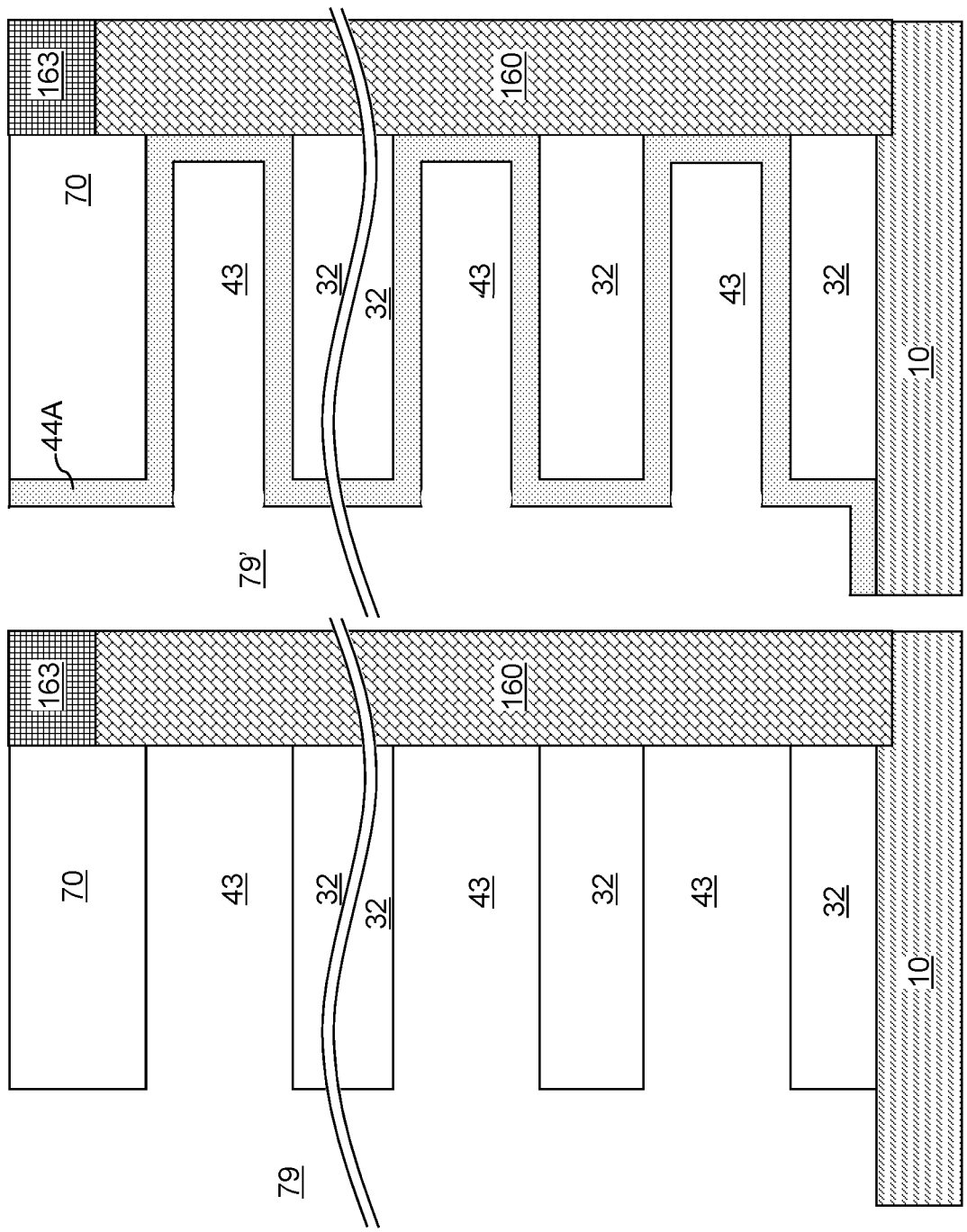

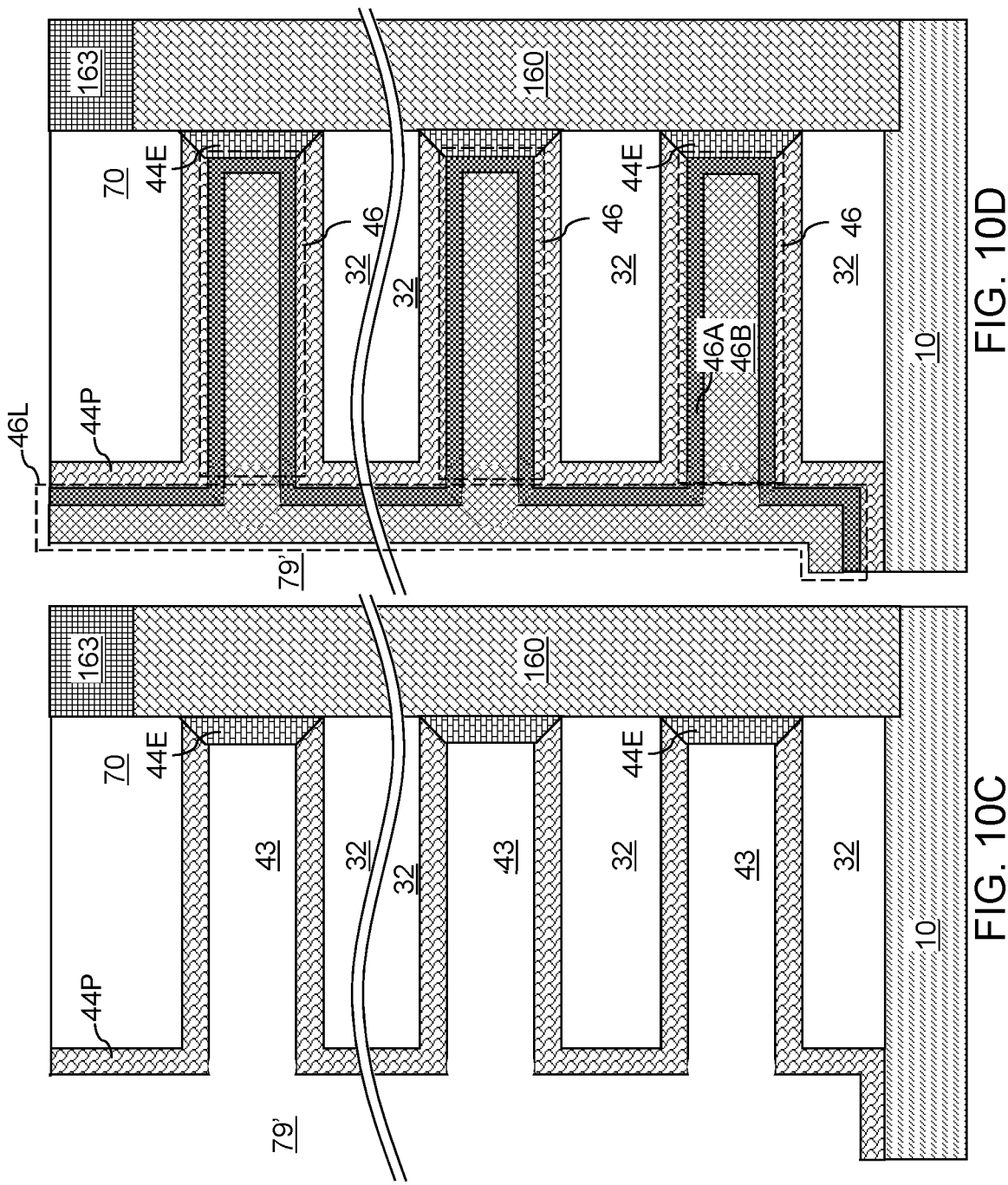

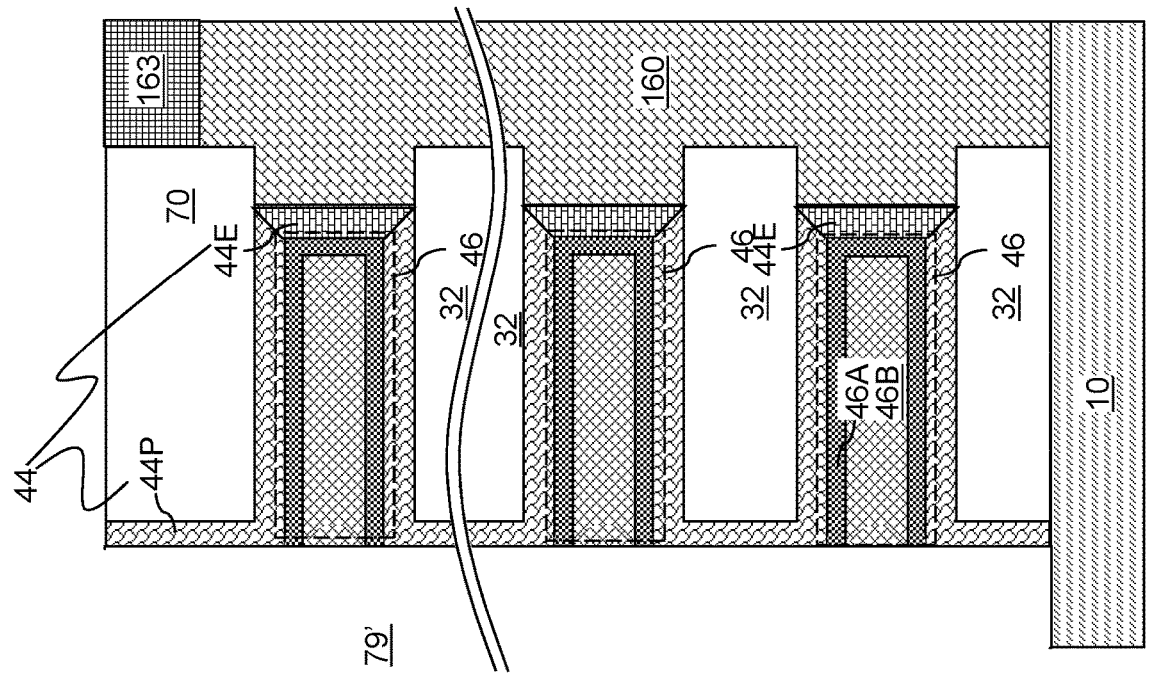
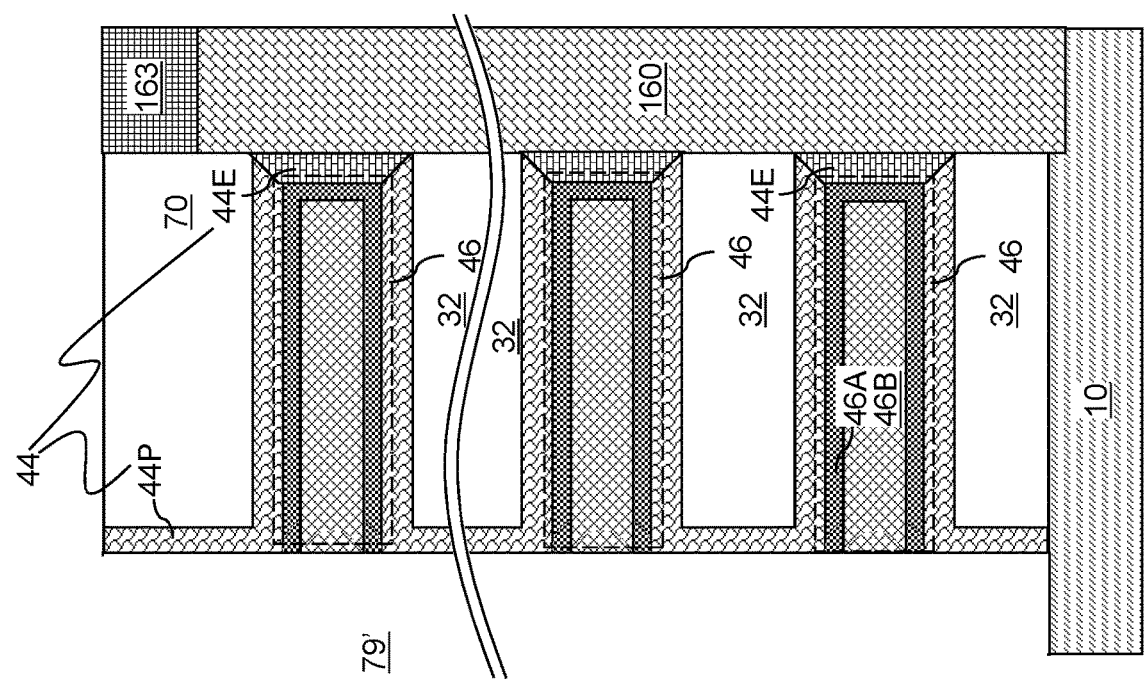

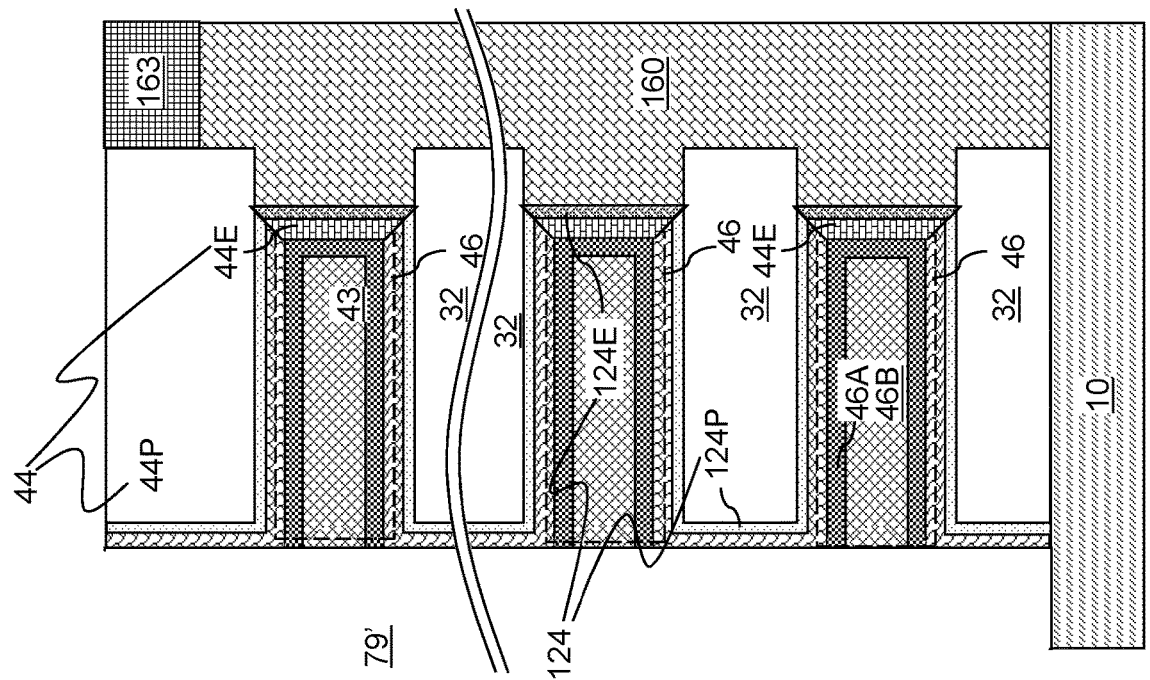
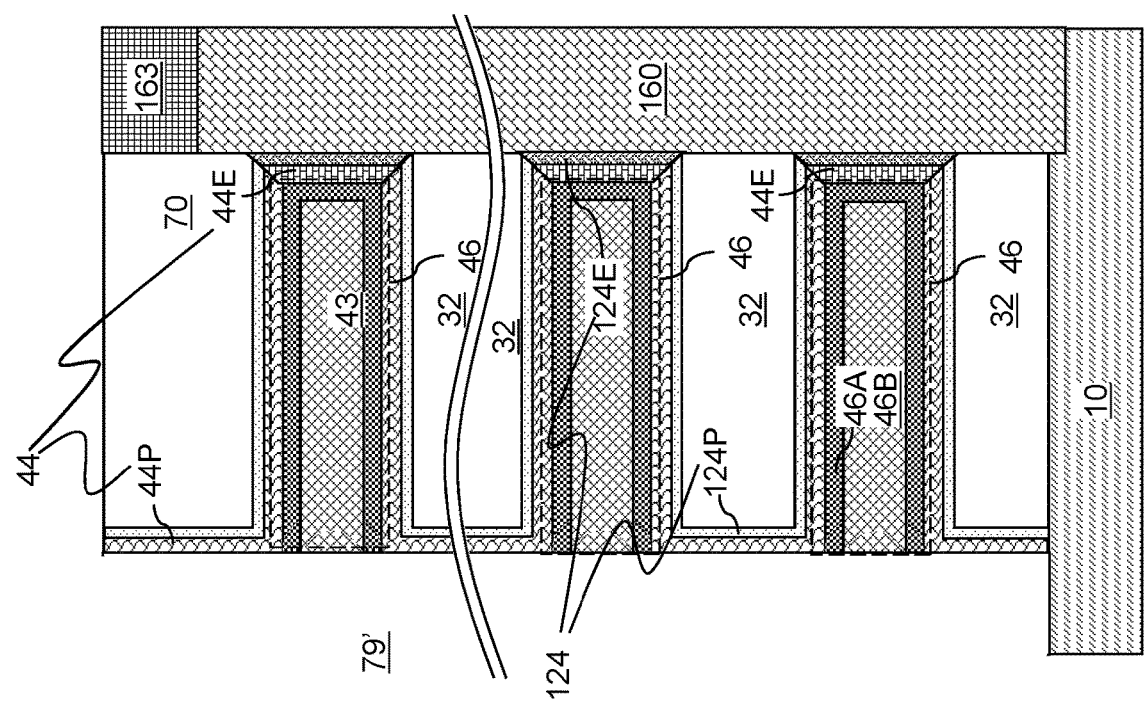

THREE-DIMENSIONAL MEMORY DEVICE CONTAINING EPITAXIAL FERROELECTRIC MEMORY ELEMENTS AND METHODS FOR FORMING THE SAME

FIELD

The present disclosure relates generally to the field of semiconductor devices, and particular to a three-dimensional memory device containing epitaxial ferroelectric memory elements and methods for manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device includes an alternating stack of insulating layers and electrically conductive layers located over a substrate, and memory stack structures extending through the alternating stack. Each of the memory stack structures includes a vertical stack of single crystalline ferroelectric dielectric layers and a respective vertical semiconductor channel.

According to another aspect of the present disclosure, a method of forming a three-dimensional memory device is provided, which comprises: forming an alternating stack of insulating layers and sacrificial material layers over a substrate; forming openings through the alternating stack; forming vertical semiconductor channels comprising a respective single crystalline semiconductor material in the openings through the alternating stack; forming backside recesses by removing the sacrificial material layers; forming vertical stacks of single crystalline ferroelectric dielectric layers, wherein each vertical stack of single crystalline ferroelectric dielectric layers is formed adjacent to a respective one of the vertical semiconductor channels; and forming electrically conductive layers on the vertical stacks of single crystalline ferroelectric dielectric layers in remaining volumes of the backside recesses.

BRIEF DESCRIPTION OF THE DRAWINGS

FIGS. 6A-6C are sequential schematic vertical cross-sectional views of a memory opening within a second configuration of the first exemplary structure during formation of a vertical semiconductor channel and a drain region therein according to the first embodiment of the present disclosure.

FIGS. 10A-10E are sequential vertical cross-sectional views of a region of the first configuration of the first exemplary structure during formation of electrically conductive layers according to the first embodiment of the present disclosure.

FIG. 10F is a vertical cross-sectional view of a region of the second configuration of the first exemplary structure after formation of the electrically conductive layers according to the first embodiment of the present disclosure.

FIG. 10G is a vertical cross-sectional view of a region of an alternative embodiment of the first configuration of the first exemplary structure after formation of the electrically conductive layers according to the first embodiment of the present disclosure.

FIG. 10H is a vertical cross-sectional view of a region of an alternative embodiment of the second configuration of the first exemplary structure after formation of the electrically conductive layers according to the first embodiment of the present disclosure.

DETAILED DESCRIPTION

Figure 1:
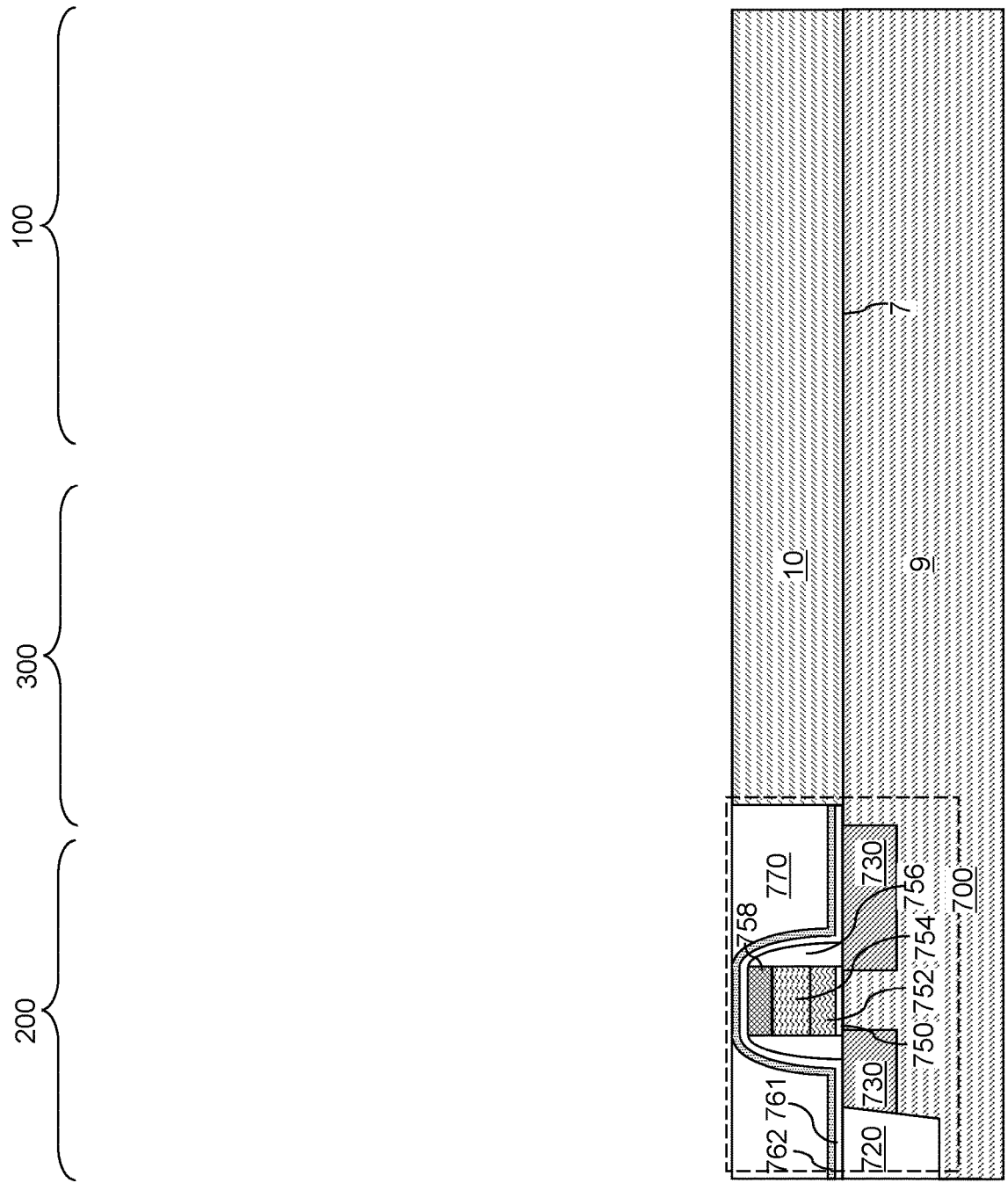
FIG. 1 is a schematic vertical cross-sectional view of a first exemplary structure after formation of at least one peripheral device and a semiconductor material layer according to a first embodiment of the present disclosure.

As discussed above, the present disclosure is directed to a three-dimensional memory device containing epitaxial (e.g., single crystalline) and/or textured ferroelectric memory elements and methods for manufacturing the same, the various aspects of which are described below. The embodiments of the disclosure can be employed to form various structures including a multilevel memory structure, non-limiting examples of which include semiconductor devices such as three-dimensional monolithic memory array devices comprising a plurality of ferroelectric NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Generally, a semiconductor package (or a "package") refers to a unit semiconductor device that can be attached to a circuit board through a set of pins or solder balls. A semiconductor package may include a semiconductor chip (or a "chip") or a plurality of semiconductor chips that are bonded thereamongst, for example, by flip-chip bonding or another chip-to-chip bonding. A package or a chip may include a single semiconductor die (or a "die") or a plurality of semiconductor dies. A die is the smallest unit that can independently execute external commands or report status. Typically, a package or a chip with multiple dies is capable of simultaneously executing as many number of external commands as the total number of planes therein. Each die includes one or more planes. Identical concurrent operations can be executed in each plane within a same die, although there may be some restrictions. In case a die is a memory die, i.e., a die including memory elements, concurrent read operations, concurrent write operations, or concurrent erase operations can be performed in each plane within a same memory die. In a memory die, each plane contains a number of memory blocks (or "blocks"), which are the smallest unit that can be erased by in a single erase operation. Each memory block contains a number of pages, which are the smallest units that can be selected for programming. A page is also the smallest unit that can be selected to a read operation.

Referring to FIG. 1, a first exemplary structure according to an embodiment of the present disclosure is illustrated, which can be employed, for example, to fabricate a device structure containing vertical NAND memory devices. The first exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-5}$ S/m to $1.0 \times 10^{-5}$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^{-5}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{-5}$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{-5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{-5}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

In one embodiment, at least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 770 can be removed, for example, by chemical mechanical planarization (CMP). In this case, the semiconductor material layer 10 can have a top surface that is coplanar with the top surface of the planarization dielectric layer 770.

The substrate semiconductor layer 9 and the optional semiconductor material layer constitutes a substrate (9, 10) that includes a single crystalline semiconductor material layer in an upper portion thereof. In one embodiment, the semiconductor material layer 10 can be a single crystalline semiconductor material layer in epitaxial alignment with the substrate semiconductor layer 9 or doped semiconductor well (e.g., p-type doped well) in the upper portion of the substrate semiconductor layer 9 (e.g., single crystalline silicon wafer). Alternatively, the semiconductor material layer 10 may be omitted, and the substrate semiconductor layer 9 may be a single crystalline semiconductor material layer (e.g., single crystalline silicon wafer).

The region (i.e., area) of the at least one semiconductor device 700 is herein referred to as a peripheral device region 200. The region in which a memory array is subsequently formed is herein referred to as a memory array region 100. A staircase region 300 for subsequently forming stepped terraces of electrically conductive layers can be provided between the memory array region 100 and the peripheral device region 200. In an alternative embodiment, the at least one semiconductor device 700 is formed under the memory array region 100 in a CMOS under array ("CUA") configuration. In this case, the peripheral device region 200 may be omitted or used in combination with the CUA configuration. In another alternative embodiment, the at least one semiconductor device 700 may be formed on a separate substrate and then bonded to substrate (9, 10) containing the memory array region 100.

Figure 2:
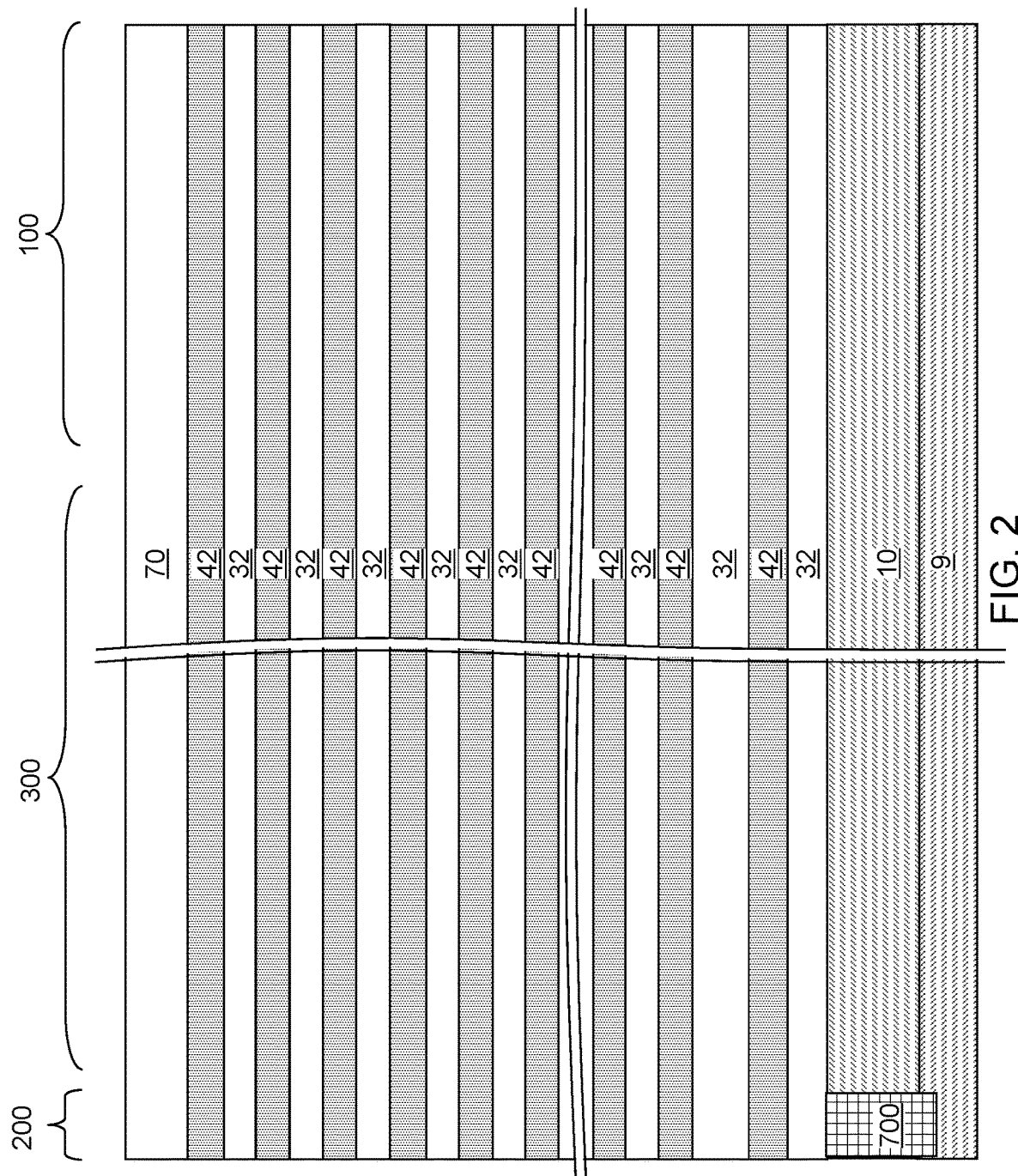
FIG. 2 is a schematic vertical cross-sectional view of the first exemplary structure after formation of an alternating stack of insulating layers and sacrificial material layers according to the first embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
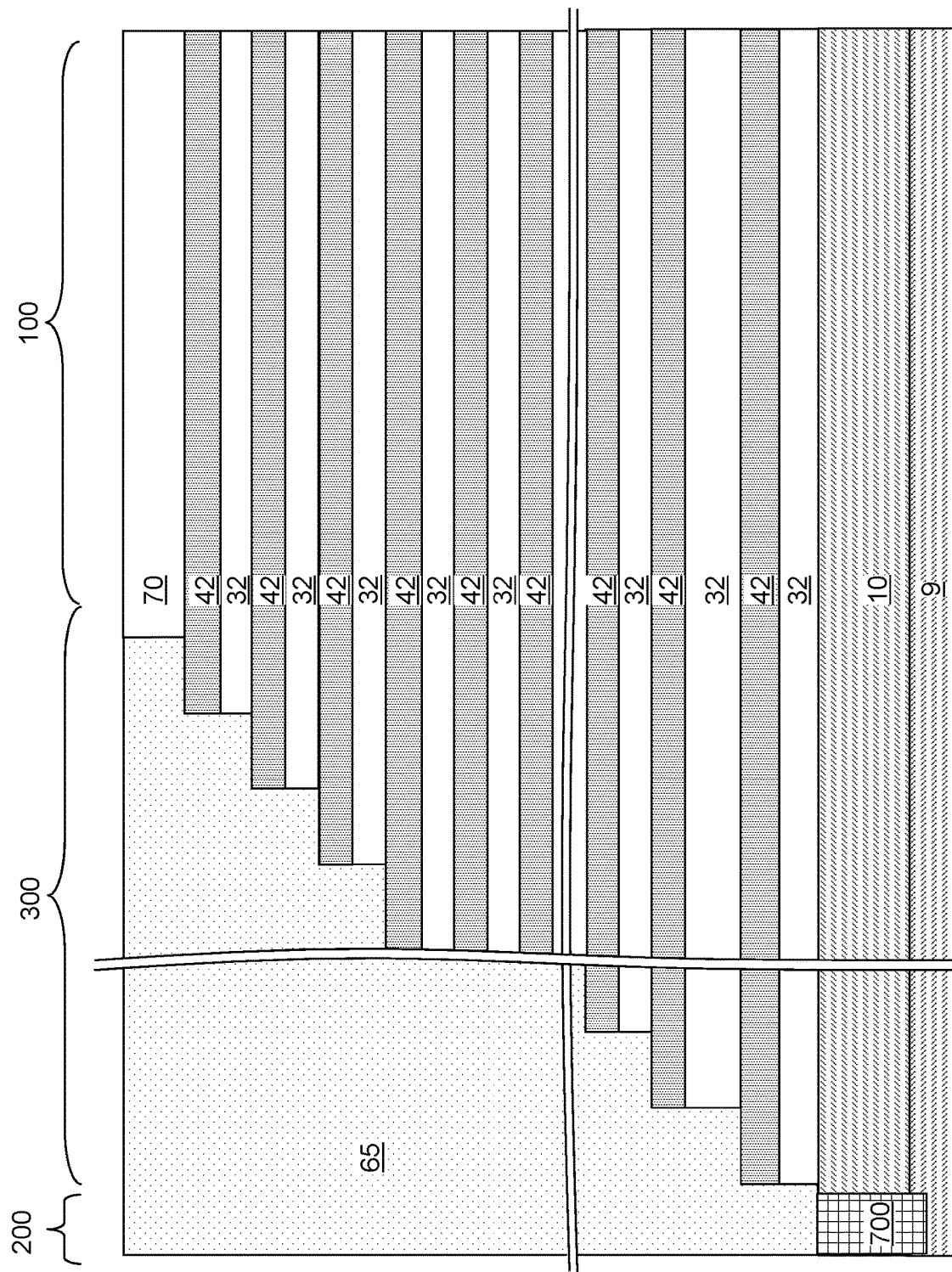
FIG. 3 is a schematic vertical cross-sectional view of the first exemplary structure after formation of stepped terraces and a retro-stepped dielectric material portion according to the first embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the staircase region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset from each other such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the staircase region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain select level isolation structures 72 can be formed through the insulating cap layer 70 and a subset of the sacrificial material layers 42 located at drain select levels. The drain select level isolation structures 72 can be formed, for example, by forming drain select level isolation trenches and filling the drain select level isolation trenches with a dielectric material such as silicon oxide. Excess portions of the dielectric material can be removed from above the top surface of the insulating cap layer 70.

Figure 4A:
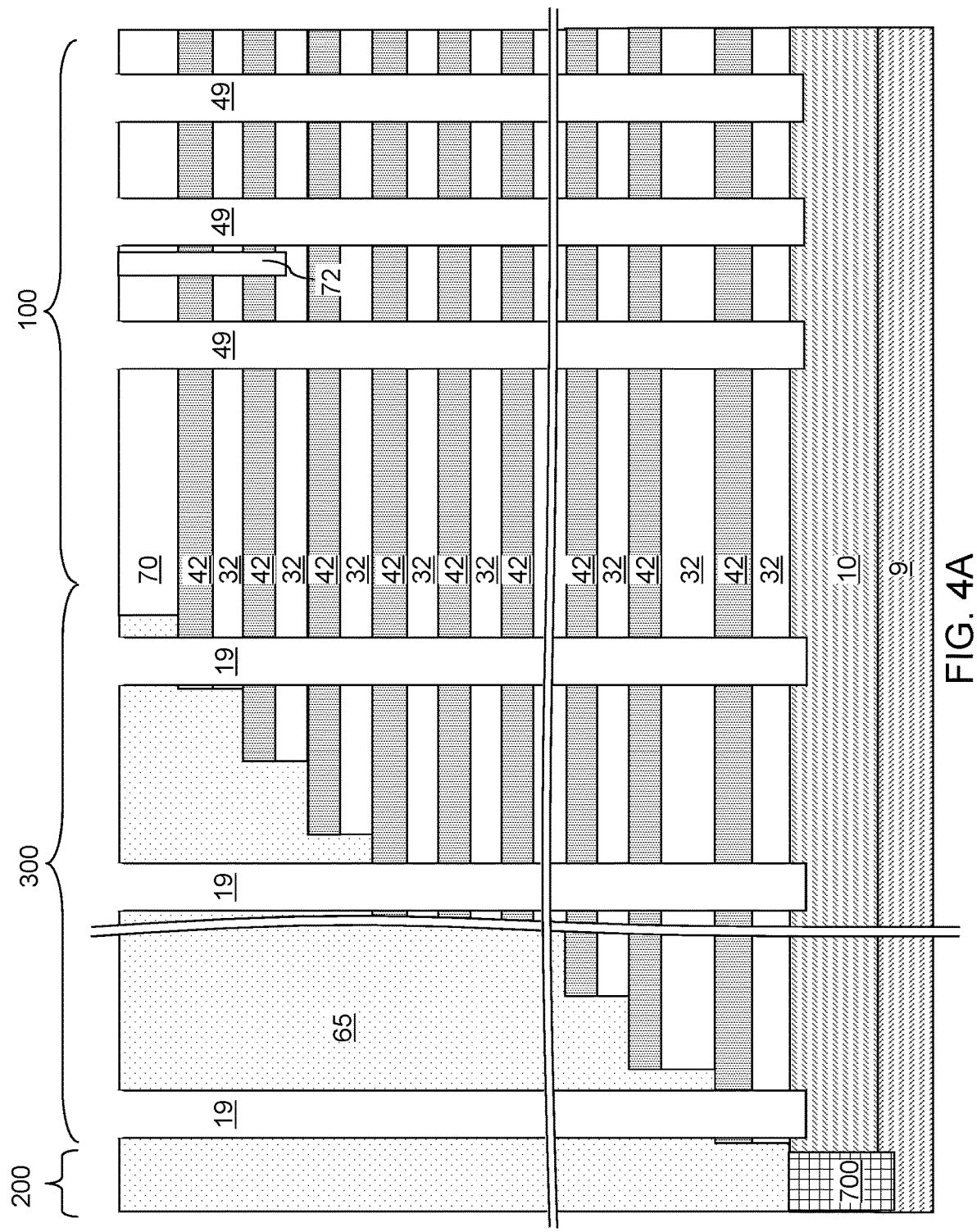
FIG. 4A is a schematic vertical cross-sectional view of the first exemplary structure after formation of memory openings and support openings according to the first embodiment of the present disclosure.
Figure 4B:
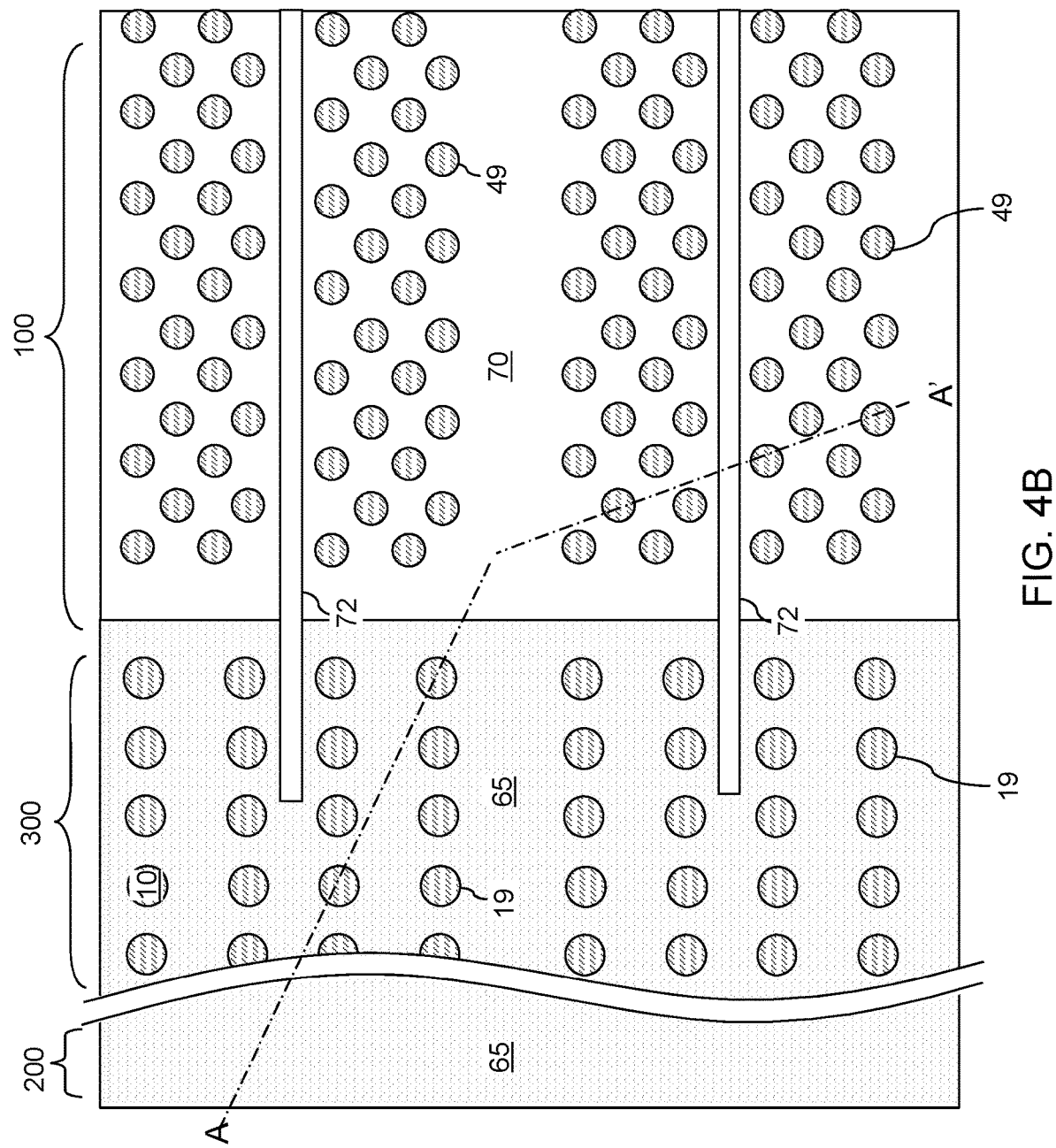
FIG. 4B is a top-down view of the first exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form discrete openings therein. The openings include a first set of openings formed over the memory array region 100 and a second set of openings formed over the staircase region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 and the support openings 19 are discrete openings, i.e., openings that are not connected to each other. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the staircase region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the staircase region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

Each of the memory openings 49 and the support openings 19 can have a respective horizontal cross-sectional shape of a circle or an ellipse. The ratio of the maximum lateral dimension (such as a major axis) to a minimum lateral dimension (such as a minor axis) of the horizontal cross-sectional shape of each of the memory openings 49 and the support openings 19 may be in a range from 1.0 to 3.0, such as from 1.0 to 1.5, or may be 1.0 in case the horizontal cross-sectional shape is a circle. The memory openings 49 can be formed as arrays of discrete memory openings 49 such that each array forms a cluster that is laterally spaced from adjacent clusters.

Figure 5B:
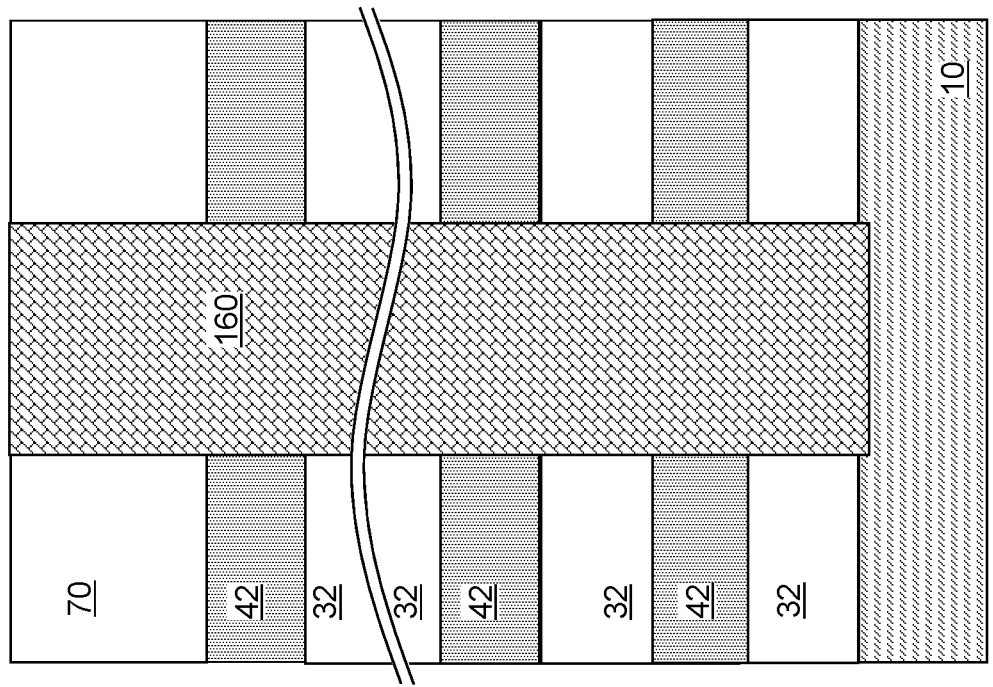
FIGS. 5A-5C are sequential schematic vertical cross-sectional views of a memory opening within a first configuration of the first exemplary structure during formation of a vertical semiconductor channel and a drain region therein according to the first embodiment of the present disclosure.
Figure 5A:
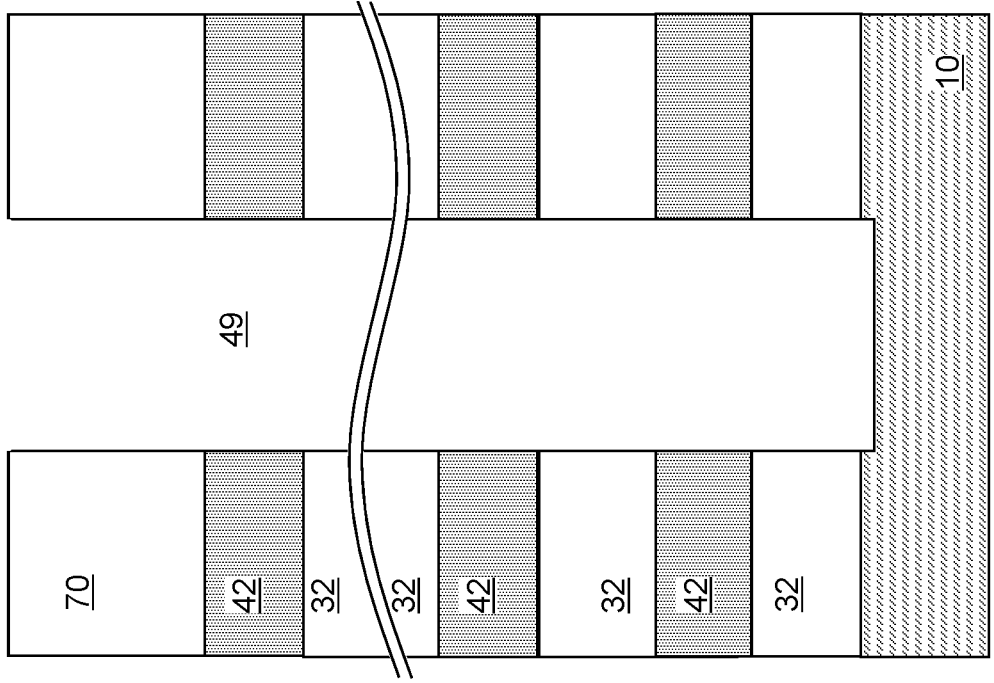
Figure 5C:
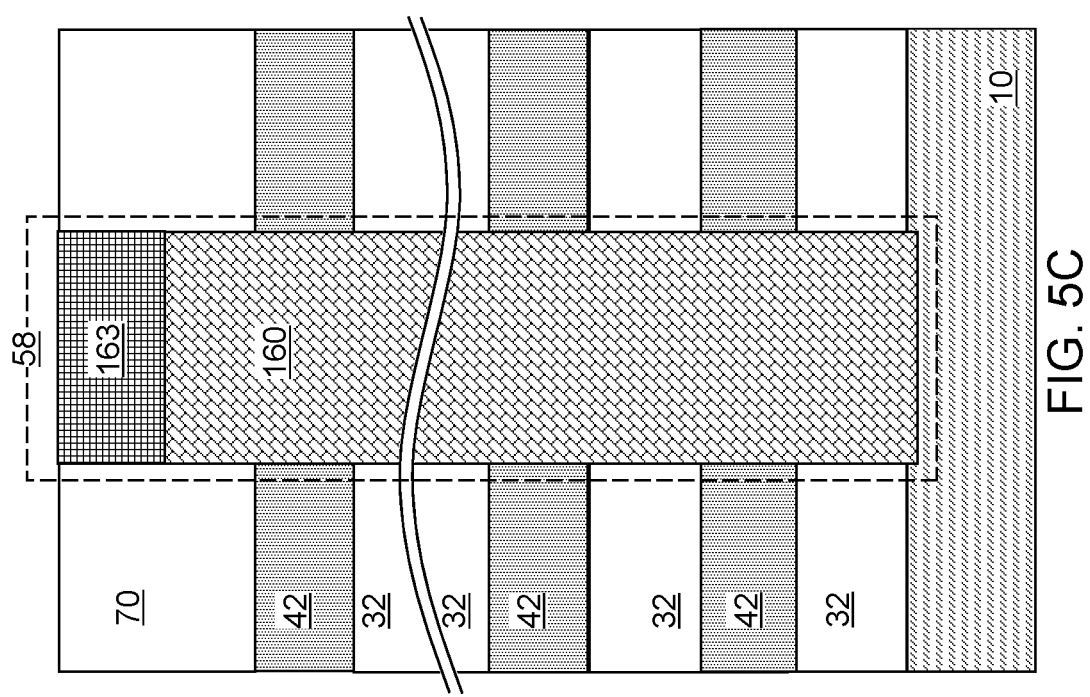

FIGS. 5A-5C are sequential schematic vertical cross-sectional views of a memory opening 49 within a first configuration of the first exemplary structure during formation of a vertical semiconductor channel 160 and a drain region 163 thereon according to the first embodiment of the present disclosure. Referring to FIG. 5A, a memory opening 49 in the first exemplary structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, a vertical semiconductor channel 160 can be formed in each memory opening 49 and in each of the support openings 19 by performing a selective epitaxy process. A selective epitaxy process is a deposition process in which a single crystalline deposited material (i.e., an epitaxial material) grows from, and in epitaxial alignment with, an underlying single crystalline template material layer, while suppressing deposition of any material on amorphous surfaces or surfaces that do not provide a suitable template for growth of the deposited material. In this case, the selective epitaxy process can be a selective semiconductor deposition process in which a single crystalline semiconductor material grows from the physically exposed single crystalline semiconductor surfaces of the single crystalline semiconductor material layer (which can be the semiconductor material layer 10 or the substrate semiconductor layer 9) that underlies the memory openings 49 and the support openings 19. Specifically, the selective epitaxy process grows a single crystalline semiconductor material (such as single crystalline silicon) from physically exposed surfaces of the single crystalline semiconductor material layer (such as single crystalline silicon) that underlie the memory openings 49 and/or the support openings 19 that vertically extend through the alternating stack (32, 42). In one embodiment, the single crystalline semiconductor material deposited by the selective epitaxy process can be single crystalline doped silicon, such as boron doped silicon (e.g., p-type doped silicon).

Each vertical semiconductor channel 160 comprises a single crystalline semiconductor material in epitaxial alignment with the single crystalline semiconductor material of the semiconductor material layer 10, or with the single crystalline semiconductor material of the substrate semiconductor layer 9 in case the semiconductor material layer 10 is omitted. In one embodiment, the vertical semiconductor channel 160 can comprise, and/or can consist essentially of, single crystalline silicon. In one embodiment, the vertical semiconductor channel 160 can have a doping of the first conductivity type, which is the same as the conductivity type of the semiconductor material layer 10 that the pedestal channel portion contacts. If a semiconductor material layer 10 is not present, the vertical semiconductor channel 160 can be formed directly on the substrate semiconductor layer 9, which can have a doping of the first conductivity type. The first conductivity type dopants in the vertical semiconductor channels 160 can be introduced into the vertical semiconductor channels 160 by in-situ doping. The atomic concentration of dopants of the first conductivity type in the vertical semiconductor channels 160 may be in a range from $1.0 \times 10^{14}/cm^3$ to $1.0 \times 10^{18}/cm^3$, such as from $1.0 \times 10^{15}/cm^3$ to $1.0 \times 10^{17}/cm^3$, although lesser and greater atomic concentrations can also be employed.

The deposited single crystalline semiconductor material can grow at least up to the horizontal plane including the top surface of the insulating cap layer 70. Excess portions of the deposited single crystalline semiconductor material can be removed from above the horizontal plane including the top surface of the insulating cap layer 70 by a planarization process such as chemical mechanical planarization. Each remaining portion of the deposited single crystalline semiconductor material that fills a memory opening 49 constitutes a vertical semiconductor channel 160. Each vertical semiconductor channel 160 can have a top surface within the horizontal plane including the top surface of the insulating cap layer 70. Each vertical semiconductor channel 160 comprises, and/or consists essentially of, a respective single crystalline semiconductor material that fills a respective memory opening 49 or a respective support opening 19.

Referring to FIG. 5C, dopants of a second conductivity type can be implanted into an upper portion of each of the vertical semiconductor channels 160. An upper portion of each vertical semiconductor channel 160 can be converted into a single crystalline doped semiconductor material portion having a doping of a second conductivity type, which is the opposite of the first conductivity type. For example, if the first conductivity type is p-type, the second conductivity type is n-type, and vice versa. Dopants of the second conductivity type can be introduced into the upper portions of the vertical semiconductor channels 160 by ion implantation. Alternatively, the vertical semiconductor channels 160 may be recessed, and a separate drain semiconductor material may be deposited into the recesses above the vertical semiconductor channels. The drain semiconductor material may be in situ doped with second conductivity type dopants (e.g., silicon doped with phosphorus or arsenic) or it may be undoped as deposited, followed by ion implantation of the second conductivity type dopants into the drain semiconductor material to form the drain regions 163. The doped semiconductor regions having a doping of the second conductivity type are herein referred to as drain regions 163, each of which functions as a drain region of a vertical field effect transistor that employs an underlying vertical semiconductor channel 160 as a transistor channel. The atomic concentration of dopants of the second conductivity type in the vertical semiconductor channels 160 may be in a range from $5.0 \times 10^{18}/cm^3$ to $2.0 \times 10^{21}/cm^3$, although lesser and greater atomic concentrations can also be employed. The drain regions 163 are formed directly on a top end of a respective one of the vertical semiconductor channels 160. The interface between each drain region 163 and an underlying vertical semiconductor channel 160 can be located above the horizontal plane including the bottom surface of the insulating cap layer 70. Each combination of material portions that fills a memory opening 49 is herein referred to as a memory opening fill structure 58. Each memory opening fill structure 58 includes a vertical semiconductor channel 160 and a drain region 163.

FIGS. 6A-6C are sequential schematic vertical cross-sectional views of a memory opening 49 within a second configuration of the first exemplary structure during formation of a vertical semiconductor channel 160 and a drain region 163 therein according to the first embodiment of the present disclosure.

Referring to FIG. 6A, an isotropic etch process that isotropically etches the material of the sacrificial material layers 42 selective to the material of the insulating layers 32 and the semiconductor material layer 10 can be performed. For example, if the insulating layers 32 include silicon oxide and if the sacrificial material layers 42 include silicon nitride, the isotropic etch process can include a wet etch process employing hot phosphoric acid or a mixture of hydrofluoric acid and ethylene glycol. Sidewalls of the sacrificial material layers 42 can be laterally recessed relative to the sidewalls of the insulating layers 32 around each memory opening 49 and around each support opening 19. The lateral recess distance of the sidewalls of the sacrificial material layers 42 relative to the sidewalls of the insulating layers 32 can be in a range from 5 nm to 100 nm, such as from 10 nm to 50 nm, although lesser and greater lateral recess distances can also be employed. Each memory opening 49 and each support opening 19 can include a respective vertical stack of annular cavities located at each level of the sacrificial material layers 42.

Referring to FIG. 6B, the processing steps of FIG. 5B can be performed to form a vertical semiconductor channel 160 within each of the memory openings 49 and the support openings 19. Each of the vertical semiconductor channels 160 can include a vertical stack of annular single crystalline semiconductor material portions that are formed within the vertical stack of annular cavities. The entirety of each vertical semiconductor channel 160 can be single crystalline, and can be epitaxially aligned to an underlying single crystalline semiconductor material layer such as the semiconductor material layer 10.

Referring to FIG. 6C, the processing steps of FIG. 5C can be performed to form a drain region 163 at a top end of each vertical semiconductor channel 160. Each combination of material portions that fills a memory opening 49 is herein referred to as a memory opening fill structure 58. Each memory opening fill structure 58 includes a vertical semiconductor channel 160 and a drain region 163.

Figure 7:
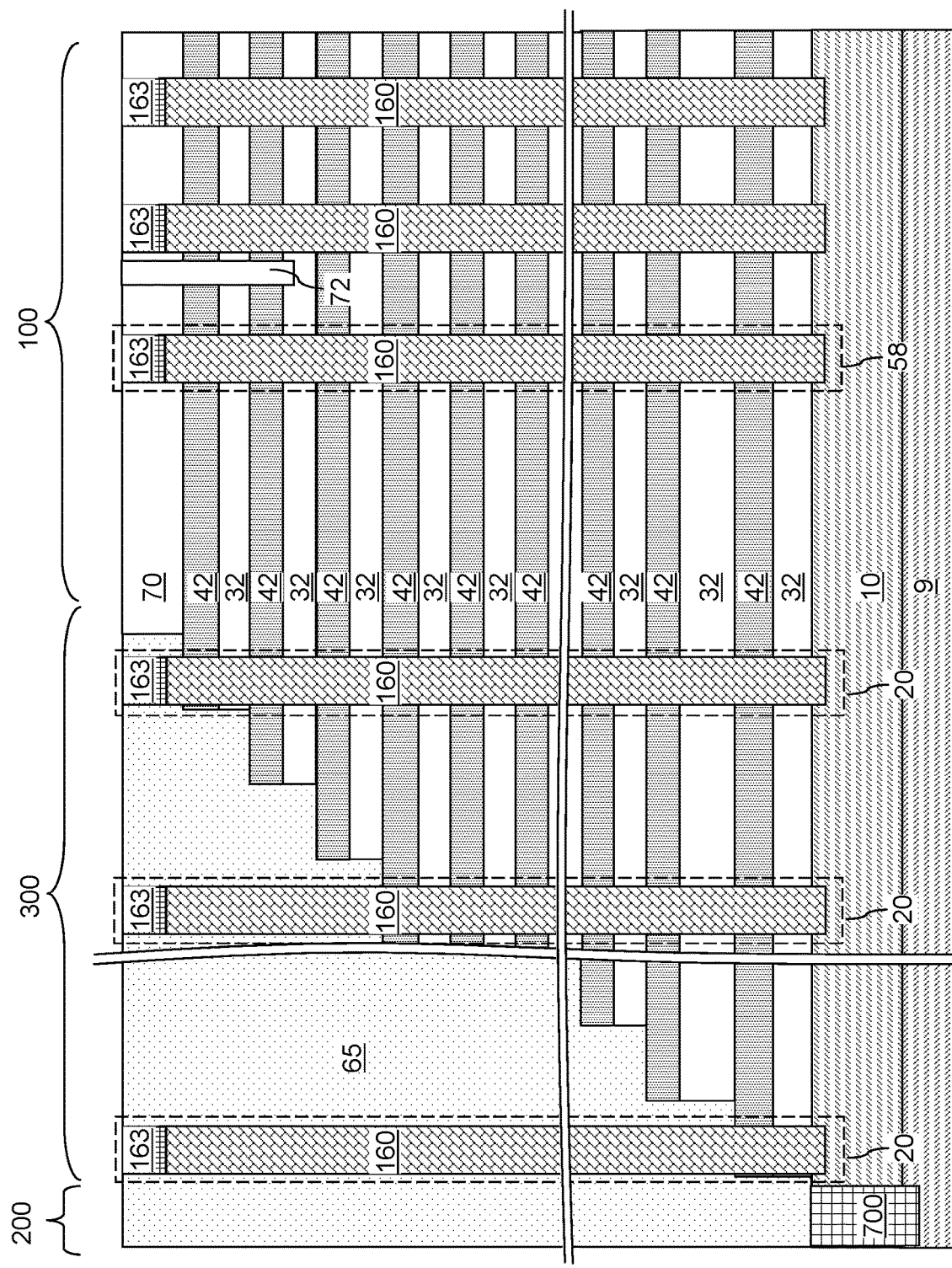
FIG. 7 is a schematic vertical cross-sectional view of the first exemplary structure after formation of memory stack structures and support pillar structures according to the first embodiment of the present disclosure.

Referring to FIG. 7, the first exemplary structure is illustrated after formation of memory opening fill structures 58 and support pillar structure 20 within the memory openings 49 and the support openings 19, respectively. The processing steps of FIG. 7 correspond to the processing step of FIG. 5C or the processing step of FIG. 6C. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B.

Figure 8A:
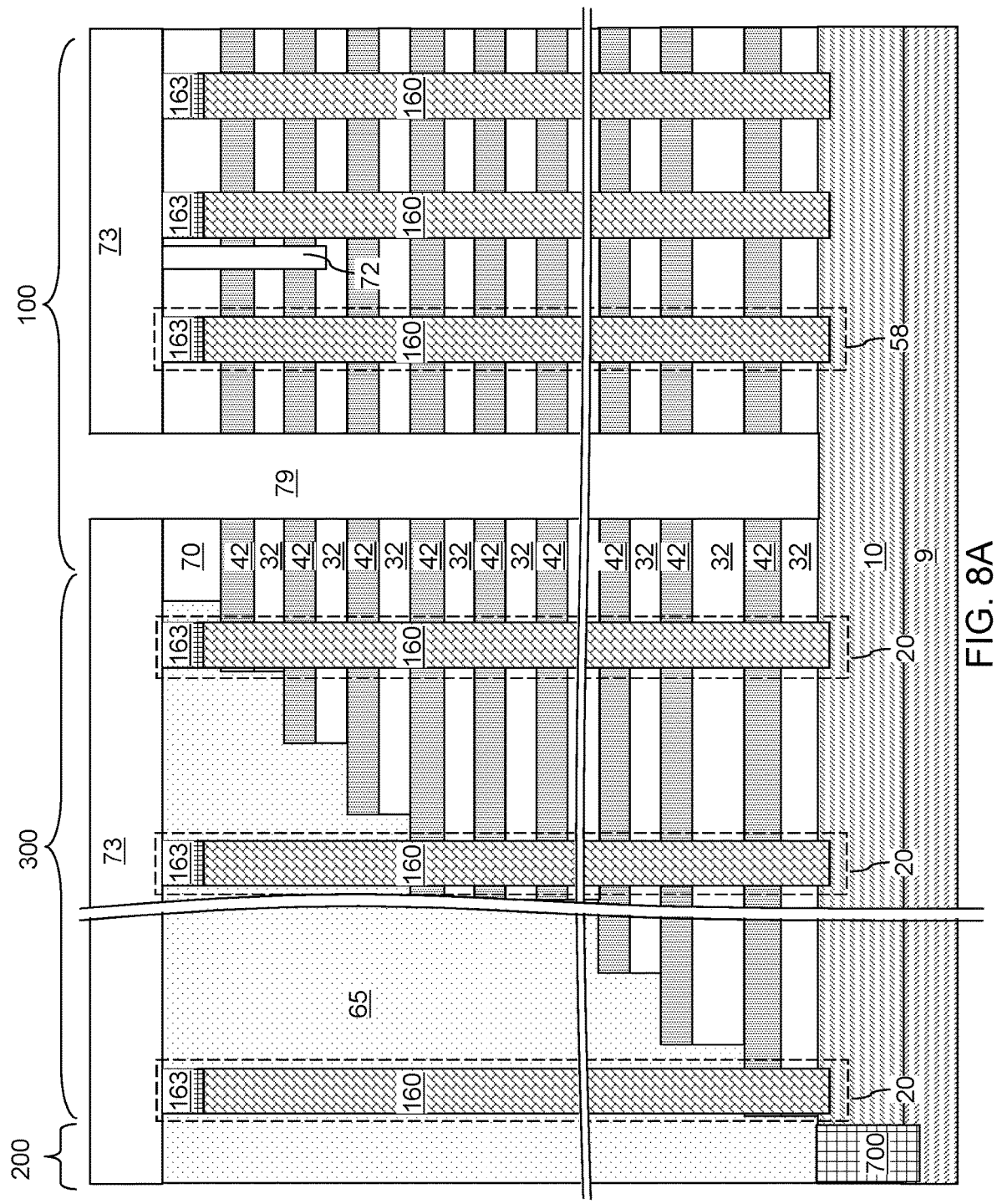
FIG. 8A is a schematic vertical cross-sectional view of the first exemplary structure after formation of backside trenches according to the first embodiment of the present disclosure.
Figure 8B:
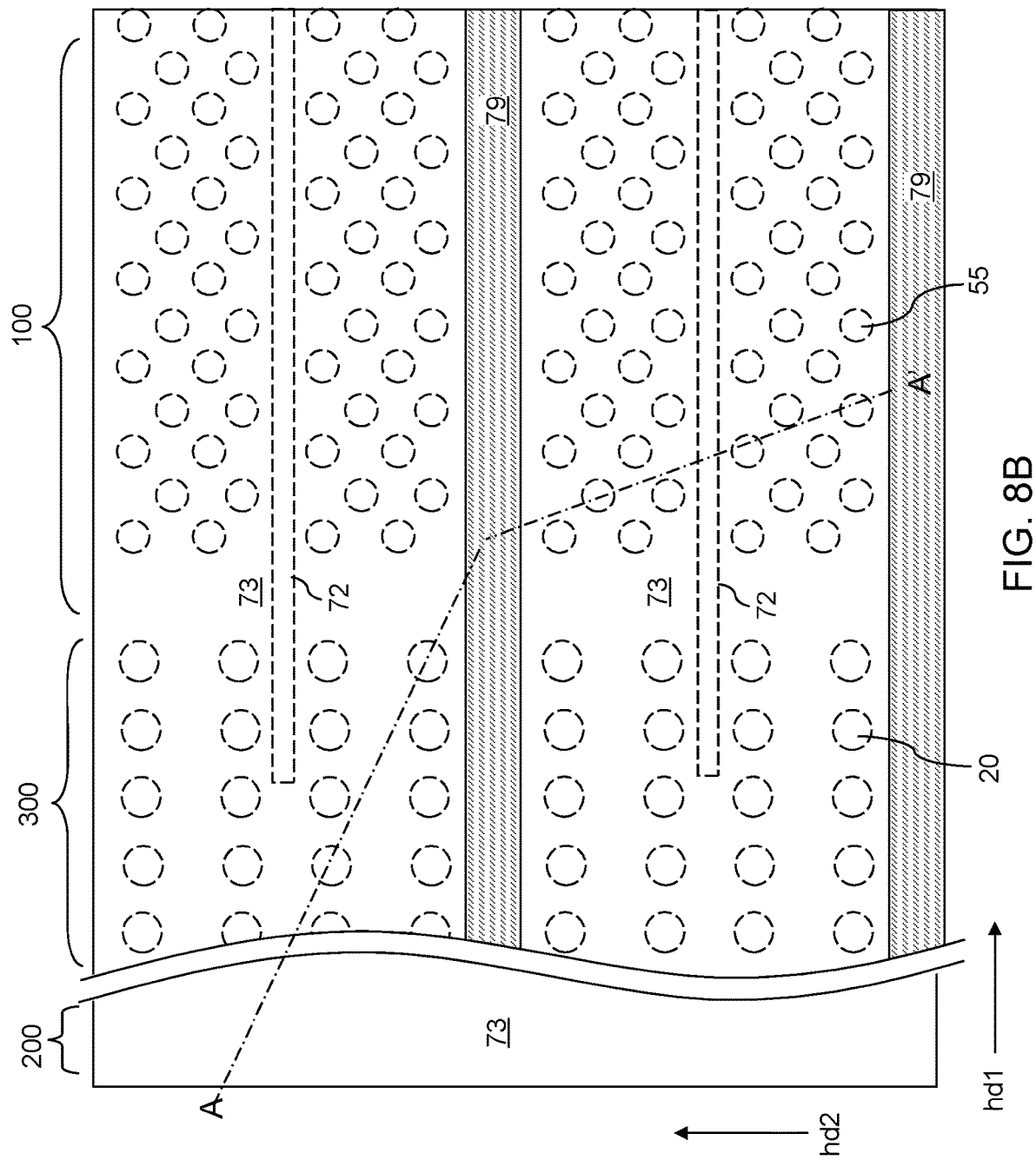
FIG. 8B is a partial see-through top-down view of the first exemplary structure of FIG. 8A. The vertical plane A-A' is the plane of the schematic vertical cross-sectional view of FIG. 8A.

Referring to FIGS. 8A and 8B, a contact level dielectric layer 73 can be formed over the alternating stack (32, 42) of insulating layer 32 and sacrificial material layers 42, and over the memory opening fill structures 58 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the contact level dielectric layer 73, and is lithographically patterned to form openings in areas between clusters of memory opening fill structures 58. The pattern in the photoresist layer can be transferred through the contact level dielectric layer 73, the alternating stack (32, 42) and/or the retro-stepped dielectric material portion 65 employing an anisotropic etch to form backside trenches 79, which vertically extend from the top surface of the contact level dielectric layer 73 at least to the top surface of the substrate (9, 10), and laterally extend through the memory array region 100 and the staircase region 300.

In one embodiment, the backside trenches 79 can laterally extend along a first horizontal direction hd1 and can be laterally spaced apart from each other along a second horizontal direction hd2 that is perpendicular to the first horizontal direction hd1. The memory opening fill structures 58 can be arranged in rows that extend along the first horizontal direction hd1. The drain select level isolation structures 72 can laterally extend along the first horizontal direction hd1. Each backside trench 79 can have a uniform width that is invariant along the lengthwise direction (i.e., along the first horizontal direction hd1). Each drain select level isolation structure 72 can have a uniform vertical cross-sectional profile along vertical planes that are perpendicular to the first horizontal direction hd1 that is invariant with translation along the first horizontal direction hd1. Multiple rows of memory opening fill structures 58 can be located between a neighboring pair of a backside trench 79 and a drain select level isolation structure 72, or between a neighboring pair of drain select level isolation structures 72. In one embodiment, the backside trenches 79 can include a source contact opening in which a source contact via structure can be subsequently formed. The photoresist layer can be removed, for example, by ashing.

Figure 9:
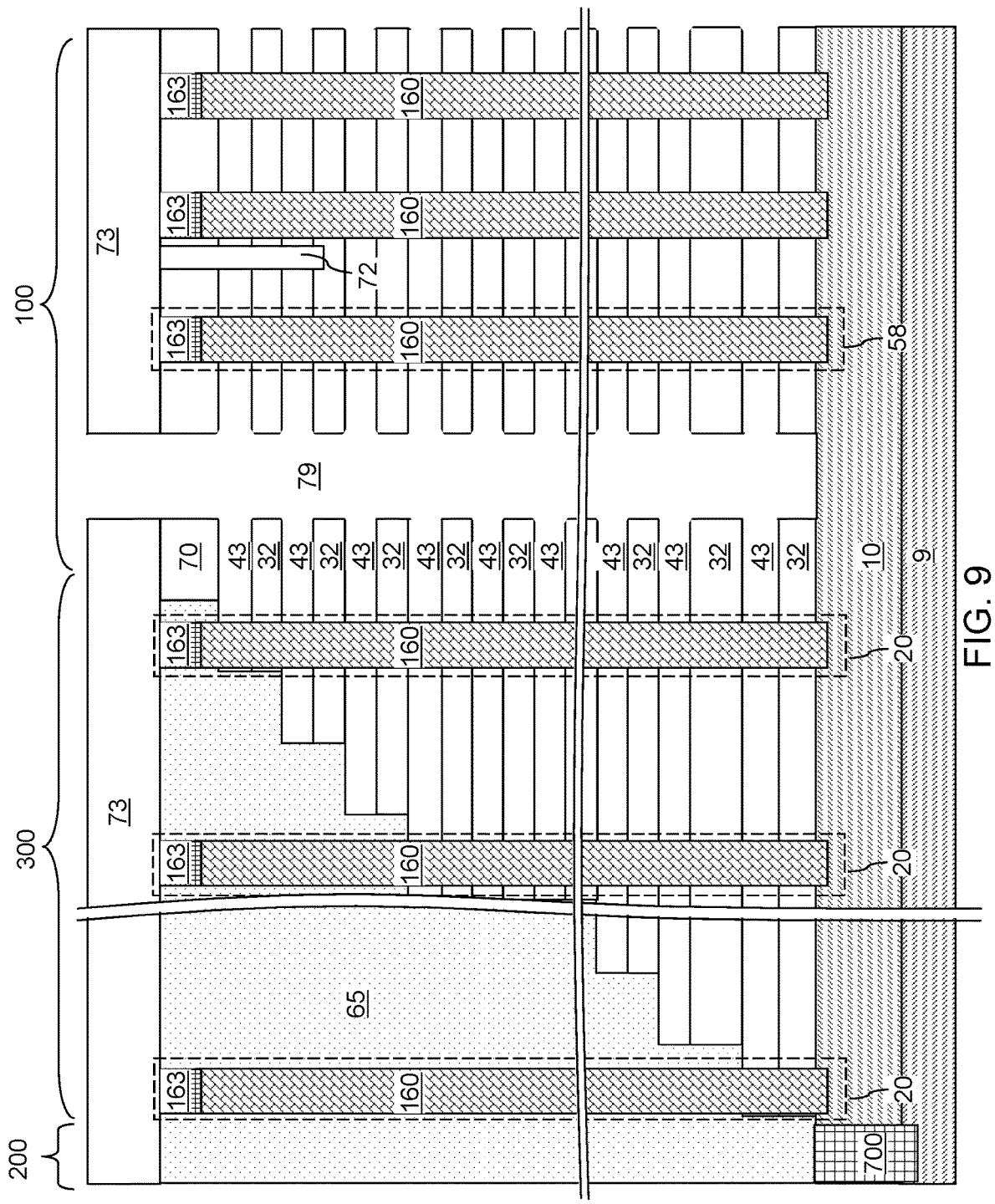
FIG. 9 is a schematic vertical cross-sectional view of the first exemplary structure after formation of backside recesses according to the first embodiment of the present disclosure.

Referring to FIGS. 9 and 10A, an etchant that selectively etches the second material of the sacrificial material layers 42 with respect to the first material of the insulating layers 32 can be introduced into the backside trenches 79, for example, employing an etch process. A region of the first configuration of the first exemplary structure is illustrated in FIG. 10A. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the vertical semiconductor channels 160. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the vertical semiconductor channels 160 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the first exemplary structure is immersed within a wet etch tank including hot phosphoric acid, which etches silicon nitride selective to silicon oxide, silicon, and various other materials employed in the art. The support pillar structure 20, the retro-stepped dielectric material portion 65, and the memory opening fill structures 58 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory opening fill structures 58 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Referring to FIG. 10B, in one embodiment, a ferroelectric dielectric material layer 44A can be conformally deposited in the backside recesses 43 and directly on physically exposed outer sidewalls of the vertical semiconductor channels 160. In one embodiment, the ferroelectric dielectric material layer 44A comprises an amorphous ferroelectric dielectric material layer 44A which includes an amorphous ferroelectric dielectric material. As used herein, an "amorphous ferroelectric dielectric material" refers to an amorphous dielectric material that can exhibit, upon crystallization, spontaneous electrical polarization in the absence of an external electric field. As used herein, a "ferroelectric dielectric material" refers to a polycrystalline or single crystalline dielectric material that exhibits spontaneous electrical polarization in the absence of an external electric field. The amorphous ferroelectric dielectric material layer 44A may be deposited by a conformal deposition process such as chemical vapor deposition or atomic layer deposition. In an alternative embodiment that will be described below with respect to FIG. 10G, an interfacial dielectric material layer may be located between the vertical semiconductor channel 160 and the amorphous ferroelectric dielectric material layer 44A.

In one embodiment, the amorphous ferroelectric dielectric material layer 44A comprises amorphous hafnium oxide ($HfO_2$) or an amorphous hafnium zirconium oxide ($Hf_xZr_{1-x}O_2$), where $0.01 \leq x \leq 0.99$. The amorphous ferroelectric dielectric material layer 44A can be subsequently annealed into single crystalline orthorhombic phase hafnium oxide or hafnium zirconium oxide on a single crystalline template material such as the material of the vertical semiconductor channels 160. The amorphous ferroelectric dielectric material layer 44A can include a suitable dopant such as Al, Zr, Y, Gd, La, Sr, and Si in order to enhance ferroelectric properties. The amorphous ferroelectric dielectric material layer 44A can have a thickness in a range from 2 nm to 40 nm, such as from 4 nm to 20 nm, although lesser and greater thicknesses can also be employed.

Referring to FIG. 10C, an anneal process can be performed to induce a templated crystalline growth of the amorphous ferroelectric dielectric material layer 44A. As used herein, a "templated crystalline growth" refers to crystalline growth within a material portion in which a crystalline surface of an adjacent material portion functions as a template for the crystalline growth. During the anneal process, portions of the amorphous ferroelectric dielectric material layer 44A that are proximal to the vertical semiconductor channels 160 are transformed into the single crystalline ferroelectric dielectric layers 44E, and portions of the amorphous ferroelectric dielectric material layer 44A that are not proximal to the vertical semiconductor channels 160 are transformed into polycrystalline ferroelectric dielectric layers 44P or remain amorphous. The set of all single crystalline ferroelectric dielectric layers 44E and the polycrystalline ferroelectric dielectric layers 44P (or the remaining amorphous portions) is herein referred to as a ferroelectric dielectric material layer 44. Each single crystalline ferroelectric dielectric layer 44E can have a respective cylindrical inner sidewall that contacts a vertical semiconductor channel 160 and a respective outer cylindrical outer sidewall that is physically exposed to a respective backside recess 43. The outer cylindrical sidewall of each single crystalline ferroelectric dielectric layer 44E can be laterally spaced from the inner cylindrical sidewall of the respective single crystalline ferroelectric dielectric layer 44E by a uniform thickness, which can be in a range from 2 nm to 40 nm, such as from 4 nm to 20 nm, although lesser and greater thicknesses can also be employed.

The anneal may comprise a single step anneal with or without a cap, or a multi-step anneal. For example, the anneal may be conducted in a single step without a cap or with a conductive cap, such as a titanium nitride metallic barrier layer described below, deposited on the amorphous silicon oxide. In the capped anneal process, a silicon oxide interfacial dielectric material layer may be formed between the respective hafnium oxide single crystalline ferroelectric dielectric layer 44E and a respective silicon vertical semiconductor channel 160 by reaction between the hafnium oxide and the silicon. In an alternative embodiment, a two step anneal may be performed with a lower temperature anneal performed uncapped to outgas contaminants from the amorphous hafnium oxide followed by forming a conductive cap, such as a titanium cap on the amorphous hafnium oxide, and performing a higher temperature anneal to convert the capped amorphous hafnium oxide to single crystalline hafnium oxide. In this process, the silicon oxide interfacial dielectric material layer formation may be minimized or avoided.

Vertical stacks of single crystalline ferroelectric dielectric layers 44E are formed by the anneal process. Each vertical stack of single crystalline ferroelectric dielectric layers 44E can be formed on a respective one of the vertical semiconductor channels 160. Each of the single crystalline ferroelectric dielectric layers 44E is formed in epitaxial alignment with, and in direct contact with, a respective one of the vertical semiconductor channels 160. In another embodiment, the ferroelectric dielectric layers 44E are highly textured in a preferred crystallographic orientation amounting to 25% to 50% with respect to one of the vertical semiconductor channels 160, although higher or lower values could be used. A combination of the single crystalline ferroelectric dielectric layers 44E and a respective one of the vertical semiconductor channels 160 is referred to as a "memory stack structure" (160, 44E). In one embodiment, the memory stack structure (160, 44E) may include the single crystalline ferroelectric dielectric layers 44E directly contacting respective one of the vertical semiconductor channels 160. In another embodiment, the memory stack structure (160, 44E) may include the single crystalline ferroelectric dielectric layers 44E that are separated from at least one sidewall of the respective one of the vertical semiconductor channels 160 by an interfacial dielectric material layer 124 or by silicon oxide regions, as will be described in more detail below. In some embodiments, the memory stack structure (160, 44E) may include a contiguous set of the single crystalline ferroelectric dielectric layers 44E and the respective one of the vertical semiconductor channels 160. The single crystalline ferroelectric dielectric layers 44E of a memory stack structure may surround the respective vertical semiconductor channel 160, as in the first exemplary structure, or the single crystalline ferroelectric dielectric layers 44E of a memory stack structure may be located adjacent to a sidewall of the respective vertical semiconductor channel 160, as in the second exemplary structure which will be described below with respect to FIGS. 14A to 27B. Portions of the amorphous ferroelectric dielectric material layer 44A that are located on the insulating layers 32 and the insulating cap layer 70 are converted into the polycrystalline ferroelectric dielectric layers 44P or remain amorphous because amorphous surfaces of the insulating layers 32 and the insulating cap layer 70 do not provide any single crystalline template for crystallizing the amorphous ferroelectric dielectric material of the amorphous ferroelectric dielectric material layer 44A.

In one embodiment, the composition of the amorphous ferroelectric dielectric material layer 44A, and thus, the composition of the single crystalline ferroelectric dielectric layers 44E can be selected such that lattice mismatch between the single crystalline ferroelectric dielectric layers 44E and the vertical semiconductor channels 160 is minimized, and formation of defects within the single crystalline ferroelectric dielectric layers 44E is eliminated or minimized. In one embodiment, the vertical semiconductor channels 160 can include single crystalline silicon having a face-centered diamond-cubic crystal structure with a lattice constant of 0.543 nm, and the single crystalline ferroelectric dielectric layers 44E can include a crystalline hafnium oxide material in an orthorhombic phase and doped with at least one of Si, Y, Gd, La, Sr, Zr or Al. In this case, the crystalline hafnium oxide material in the orthorhombic phase can have a first lattice constant of about 0.52 nm, a second lattice constant of about 0.50 nm, and a third lattice constant of about 0.52 nm.

Referring to FIG. 10D, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a metal, such as Ti, a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

A metal fill material is deposited in the plurality of backside recesses 43, on the sidewalls of the at least one the backside trench 79, and over the top surface of the contact level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory opening fill structures 58 by the metallic barrier layer 46A, which is a metallic barrier layer that blocks diffusion of fluorine atoms therethrough A plurality of electrically conductive layers 46 can be formed in the plurality of backside recesses 43, and a continuous electrically conductive material layer 46L can be formed on the sidewalls of each backside trench 79 and over the contact level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous electrically conductive material layer 46L includes a continuous portion of the metallic barrier layer 46A and a continuous portion of the metallic fill material layer 46B that are located in the backside trenches 79 or above the contact level dielectric layer 73. Each sacrificial material layer 42 can be replaced with an electrically conductive layer 46. A backside cavity 79' is present in the portion of each backside trench 79 that is not filled with the ferroelectric dielectric material layer 44 and the continuous electrically conductive material layer 46L. The electrically conductive layers 46 are formed on the vertical stacks of single crystalline ferroelectric dielectric layers 44E in remaining volumes of the backside recesses 43.

Figure 11A:
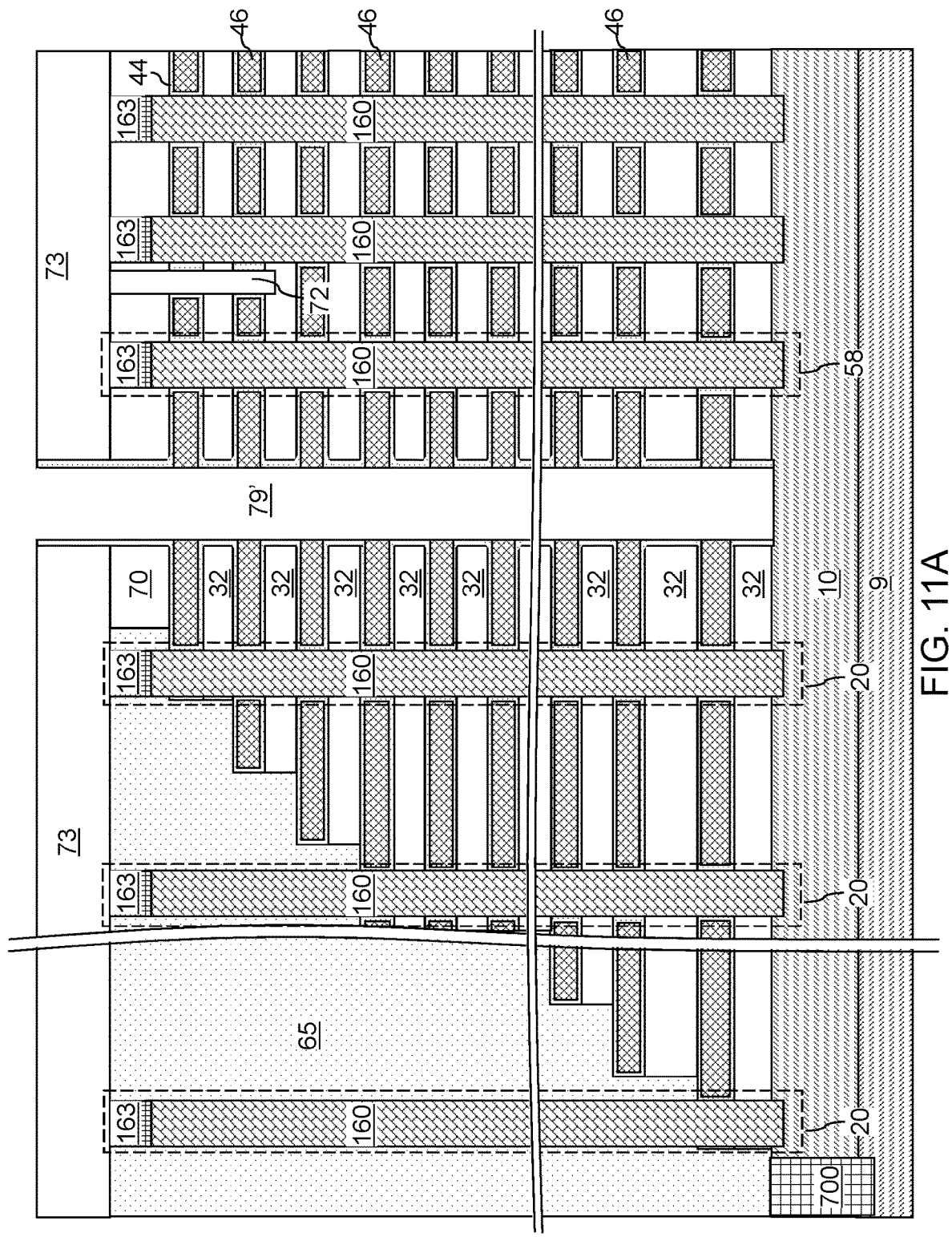
FIG. 11A is a schematic vertical cross-sectional view of the first exemplary structure at the processing step of FIG. 10E or FIG. 10F.
Figure 11B:
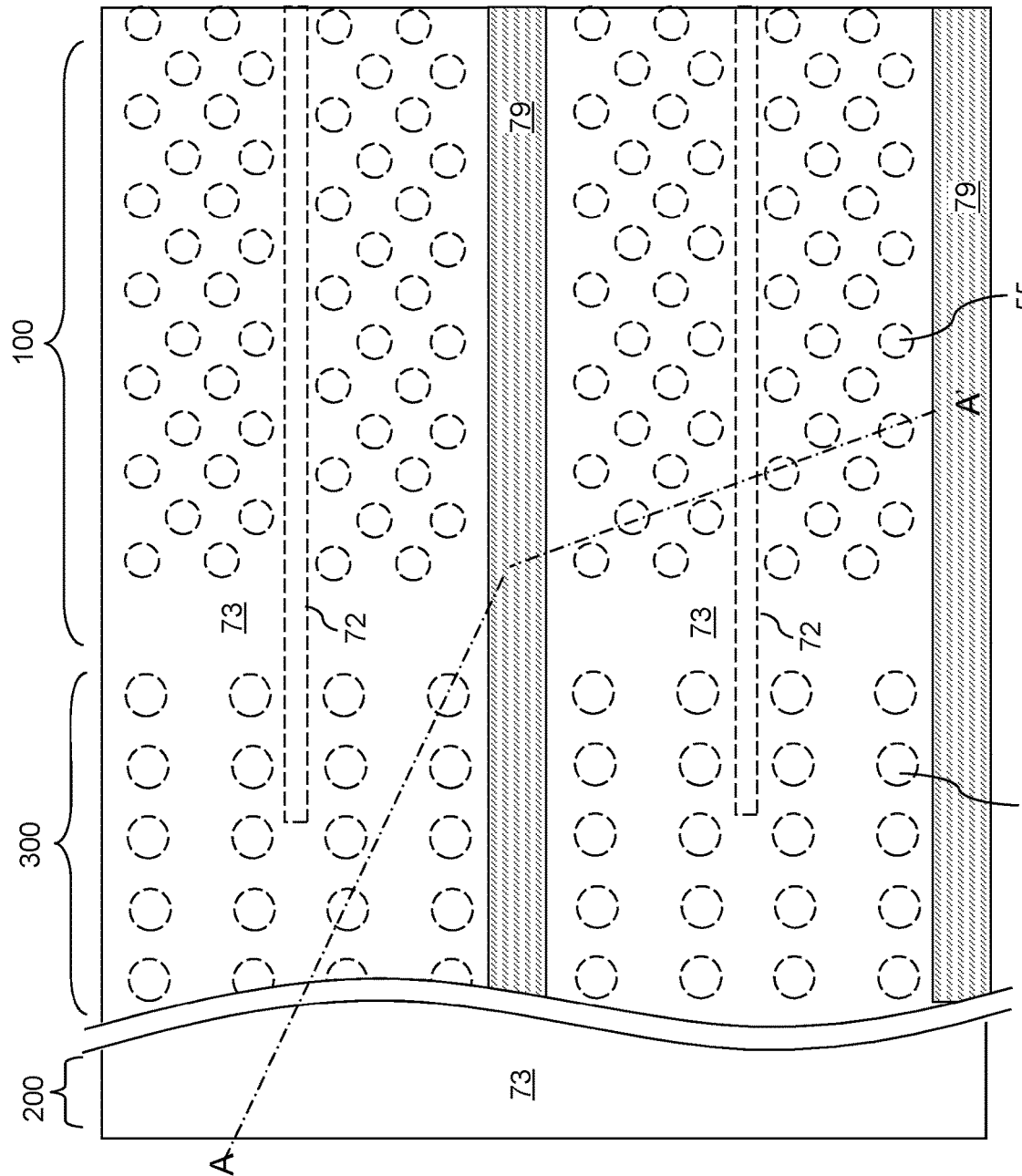
FIG. 11B is a partial see-through top-down view of the first exemplary structure of FIG. 11A. The vertical plane A-A' is the plane of the schematic vertical cross-sectional view of FIG. 11A.

Referring to FIGS. 10E, 11A and 11B, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory opening fill structures 58. In other words, each electrically conductive layer 46 can be a word line that functions as a common control gate electrode for the plurality of vertical memory devices.

In one embodiment, the removal of the continuous electrically conductive material layer 46L can be selective to the material of the ferroelectric dielectric material layer 44. In this case, a horizontal portion of the ferroelectric dielectric material layer 44 can be present at the bottom of each backside trench 79. In another embodiment, the removal of the continuous electrically conductive material layer 46L may not be selective to the material of the ferroelectric dielectric material layer 44. A backside cavity 79' is present within each backside trench 79.

Referring to FIG. 10F, a second configuration of the first exemplary structure is illustrated, which can be provided by employing the second configuration for the memory opening fill structures 58 illustrated in FIG. 6C, and performing the steps shown in FIGS. 10A-10E which are described above.

Referring to FIG. 10G, an alternative embodiment of the first configuration of the first exemplary structure can be derived from the first configuration of the first exemplary structure by depositing an amorphous interfacial dielectric material layer directly on the physically exposed surfaces of the vertical semiconductor channels 160 and the insulating layers 32, and by converting the amorphous interfacial dielectric material layer into an interfacial dielectric material layer 124 including single crystalline interfacial dielectric layers 124E and polycrystalline interfacial dielectric layers 124P. The thickness of the interfacial dielectric material layer 124 can be in a range from 0.5 nm to 5 nm, such as from 1 nm to 3 nm, although lesser and greater thicknesses can also be employed.

The material for the amorphous interfacial dielectric material layer, and thus, the material for the interfacial dielectric material layer 124, can be selected such that the average lattice constant of the crystalline phase of the interfacial dielectric material layer 124 is between the average lattice constant of the material of the vertical semiconductor channels 160 and the average lattice constant of the material of the single crystalline ferroelectric dielectric material layer 44E. As used herein, an "average lattice constant" refers to the average of the three lattice constants of a crystallographic phase of a material. In one embodiment, the vertical semiconductor channels 160 can include doped single crystalline silicon having an average lattice constant of about 0.543 nm, and the single crystalline ferroelectric dielectric layer 44E can include orthorhombic phase hafnium oxide or hafnium zirconium oxide having an average lattice constant in a range from 0.50 nm to 0.51 nm. In one embodiment, the material for the amorphous interfacial dielectric material layer (and the material for the interfacial dielectric material layer 124) can include yttria-stabilized zirconia, in which a cubic crystal structure of zirconium oxide is stabilized at room temperature by an addition of yttrium oxide. The molar percentage of yttria within the yttria-stabilized zirconia material can be in a range from 2% to 10%, such as from 3% to 8%. The crystalline phase of the yttria-stabilized zirconia has a cubic crystal structure with a lattice constant of about 0.51 nm-0.52 nm, which is the average lattice constant. The intermediate average lattice constant of the yttria-stabilized zirconia can reduce interfacial defect density in the single crystalline ferroelectric dielectric layer 44E by gradually accommodating lattice mismatch between the average lattice constant of the crystalline material of the vertical semiconductor channels 160 and the single crystalline ferroelectric dielectric layer 44E.

Referring to FIG. 10H, an alternative embodiment of the second configuration of the first exemplary structure can be derived from the second configuration of the first exemplary structure of FIG. 6C and employing the interfacial dielectric material layer 124 as in the structure illustrated in FIG. 10G.

Figure 12:
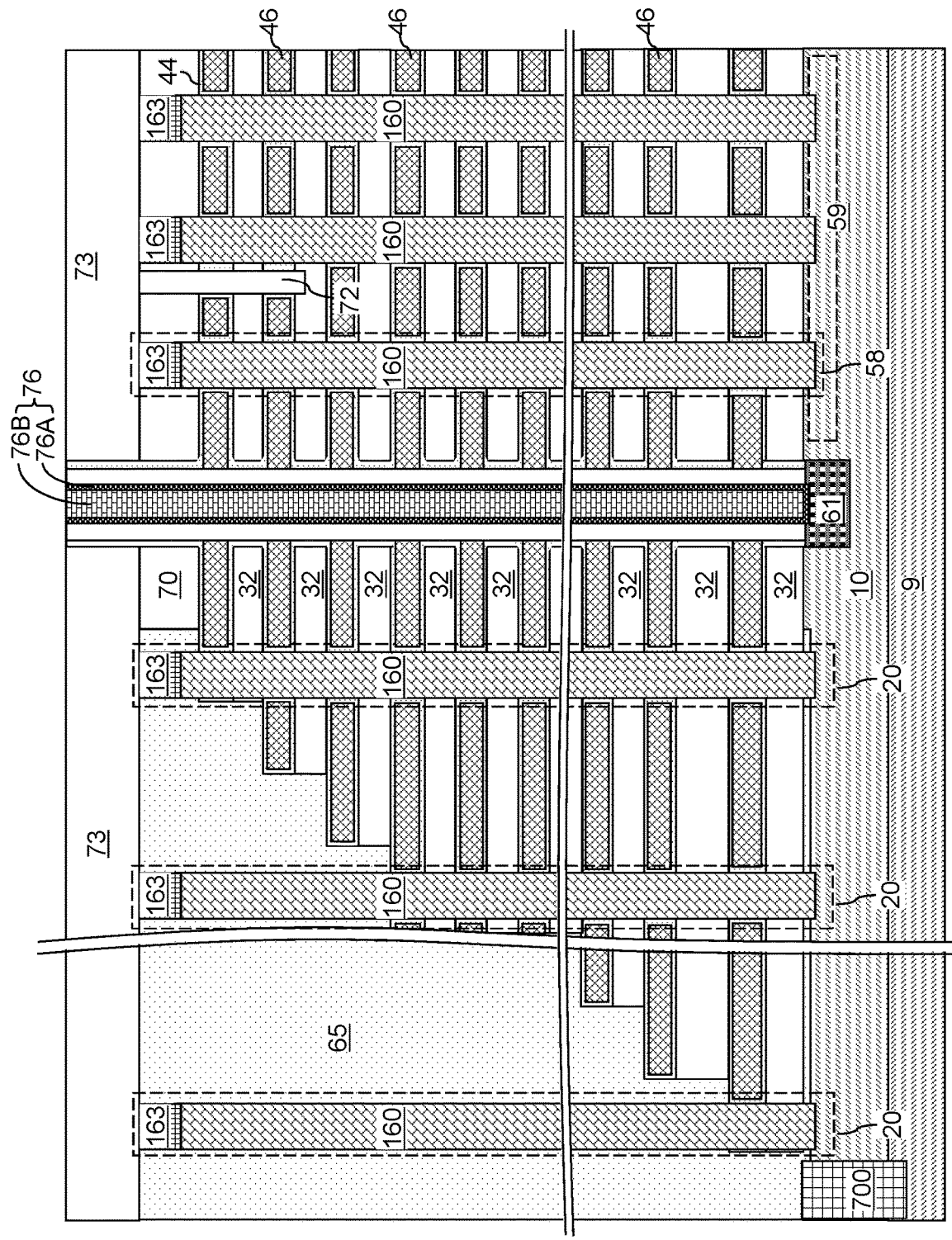
FIG. 12 is a schematic vertical cross-sectional view of the first exemplary structure after formation of an insulating spacer and a backside contact structure in each backside trench according to the first embodiment of the present disclosure.

Referring to FIG. 12, an insulating material layer can be formed in the backside trenches 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a ferroelectric dielectric material layer 44 is exposed in the backside trenches 79, then the insulating material layer can be formed directly on surfaces of the ferroelectric dielectric material layer 44 and directly on the sidewalls of the electrically conductive layers 46. If a ferroelectric dielectric material layer 44 is not exposed in the backside trenches 79, then the insulating material layer can be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 can be physically exposed at the bottom of each backside trench 79.

A source region 61 can be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

A bottommost electrically conductive layer 46 provided upon formation of the electrically conductive layers 46 within the alternating stack (32, 46) can comprise a select gate electrode for the field effect transistors. Each source region 61 is formed in an upper portion of the substrate (9, 10). An upper portion of the semiconductor material layer 10 located between bottom portions of the vertical semiconductor channels 160 and a most proximate source region 61 constitutes a horizontal semiconductor channel 59. The combination of the horizontal semiconductor channel 59 and adjoining vertical semiconductor channels constitutes semiconductor channels (59, 160). Thus, the semiconductor channels (59, 160) extend between each source region 61 and a respective set of drain regions 163. The semiconductor channels (59, 160) include the vertical semiconductor channels 160 of the memory opening fill structures 58.

A backside contact via structure 76 can be formed within each backside cavity 79'. Each contact via structure 76 can fill a respective backside cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. The backside contact via structure 76 can contact a sidewall of the insulating spacer 74.

Figure 13A:
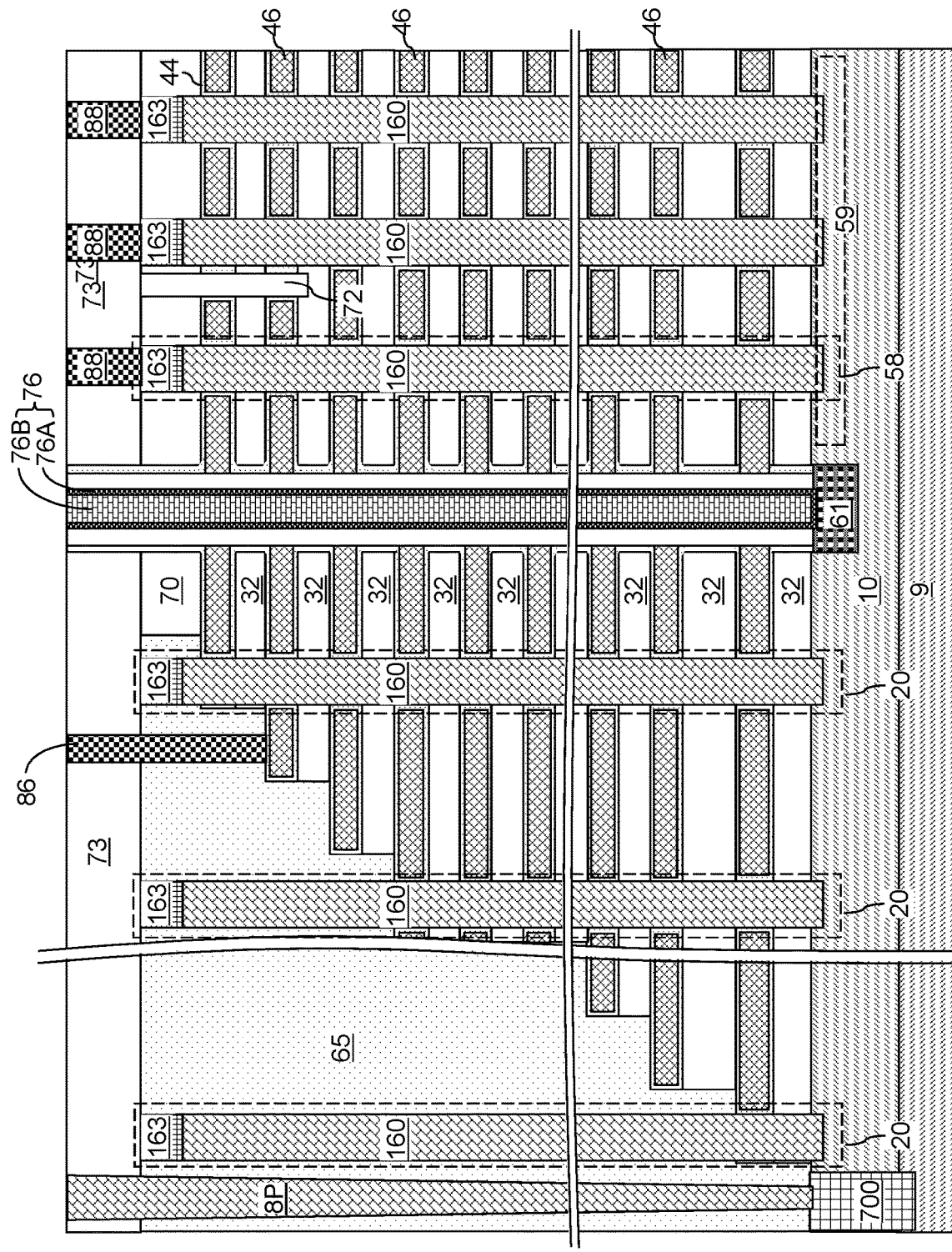
FIG. 13A is a schematic vertical cross-sectional view of the first exemplary structure after formation of additional contact via structures according to the first embodiment of the present disclosure.
Figure 13B:
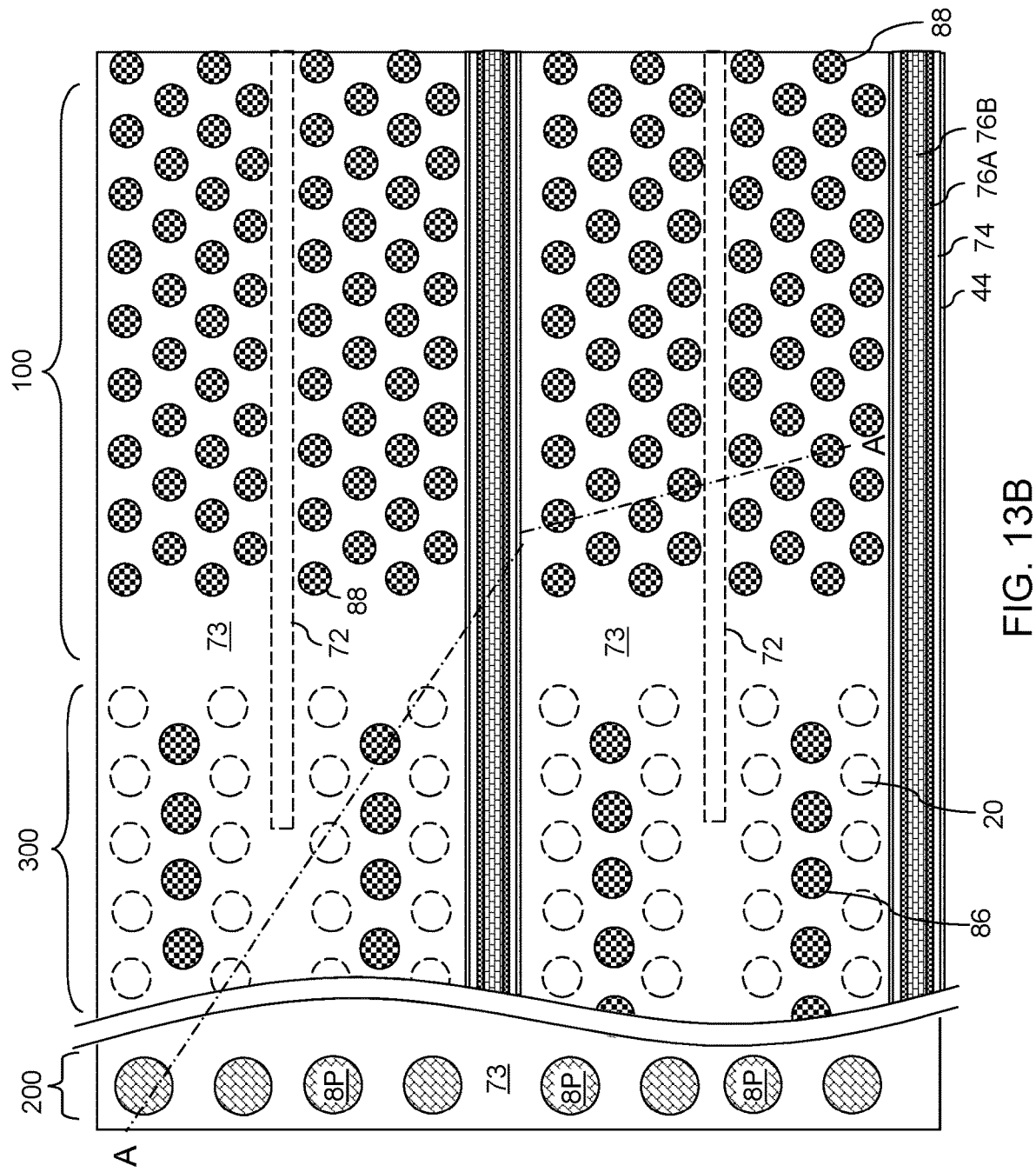
FIG. 13B is a top-down view of the first exemplary structure of FIG. 13A. The vertical plane A-A' is the plane of the schematic vertical cross-sectional view of FIG. 13A.
Figure 14A:
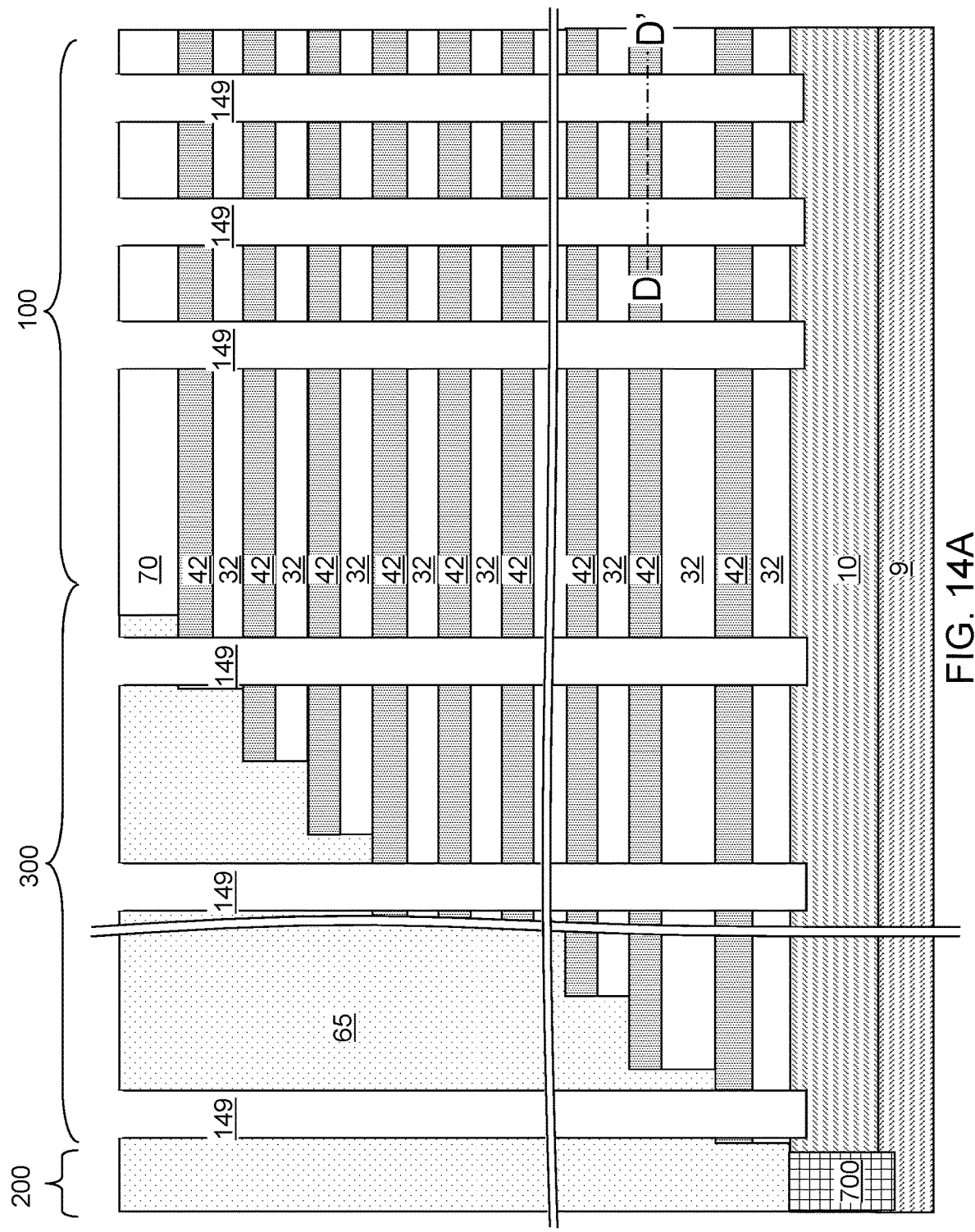
FIG. 14A is a schematic vertical cross-sectional view of a second exemplary structure after formation of line trenches according to a second embodiment of the present disclosure.
Figure 14B:
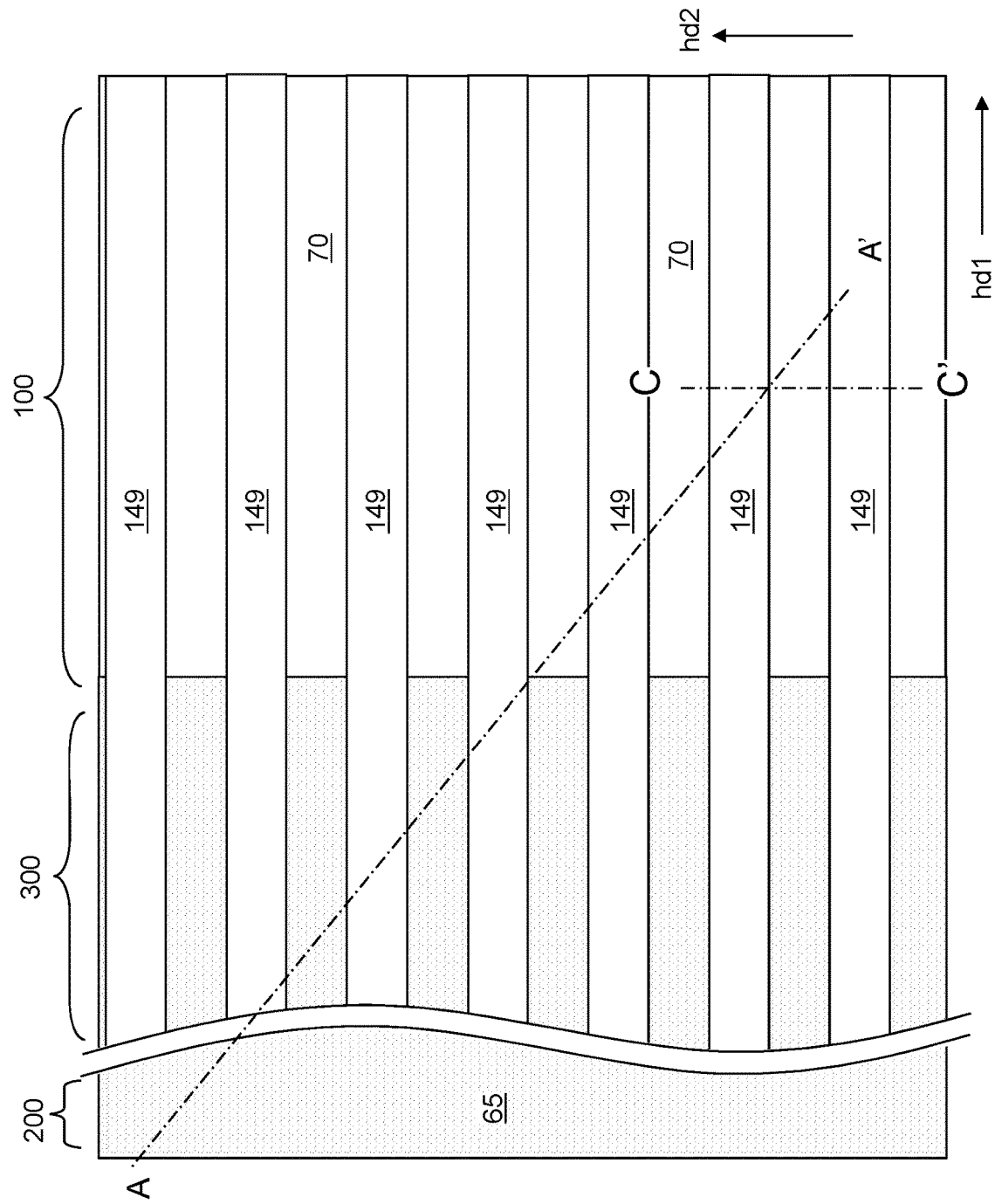
FIG. 14B is a top-down view of the second exemplary structure of FIG. 14A. The vertical plane A-A' is the plane of the schematic vertical cross-sectional view of FIG. 14A.
Figure 14C:
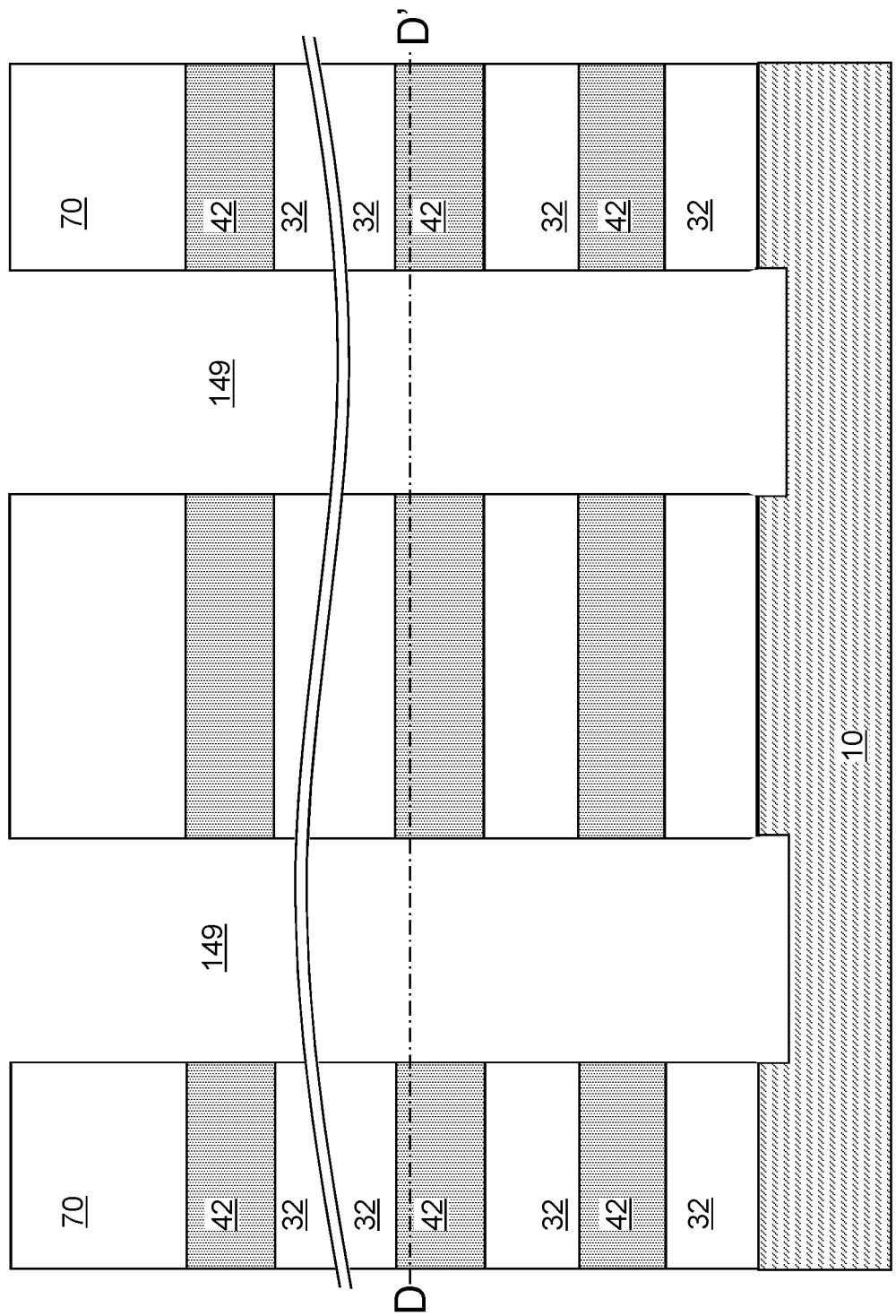
FIG. 14C is a vertical cross-sectional view of the second exemplary structure along the vertical plane C-C' of FIG. 14B.
Figure 14D:
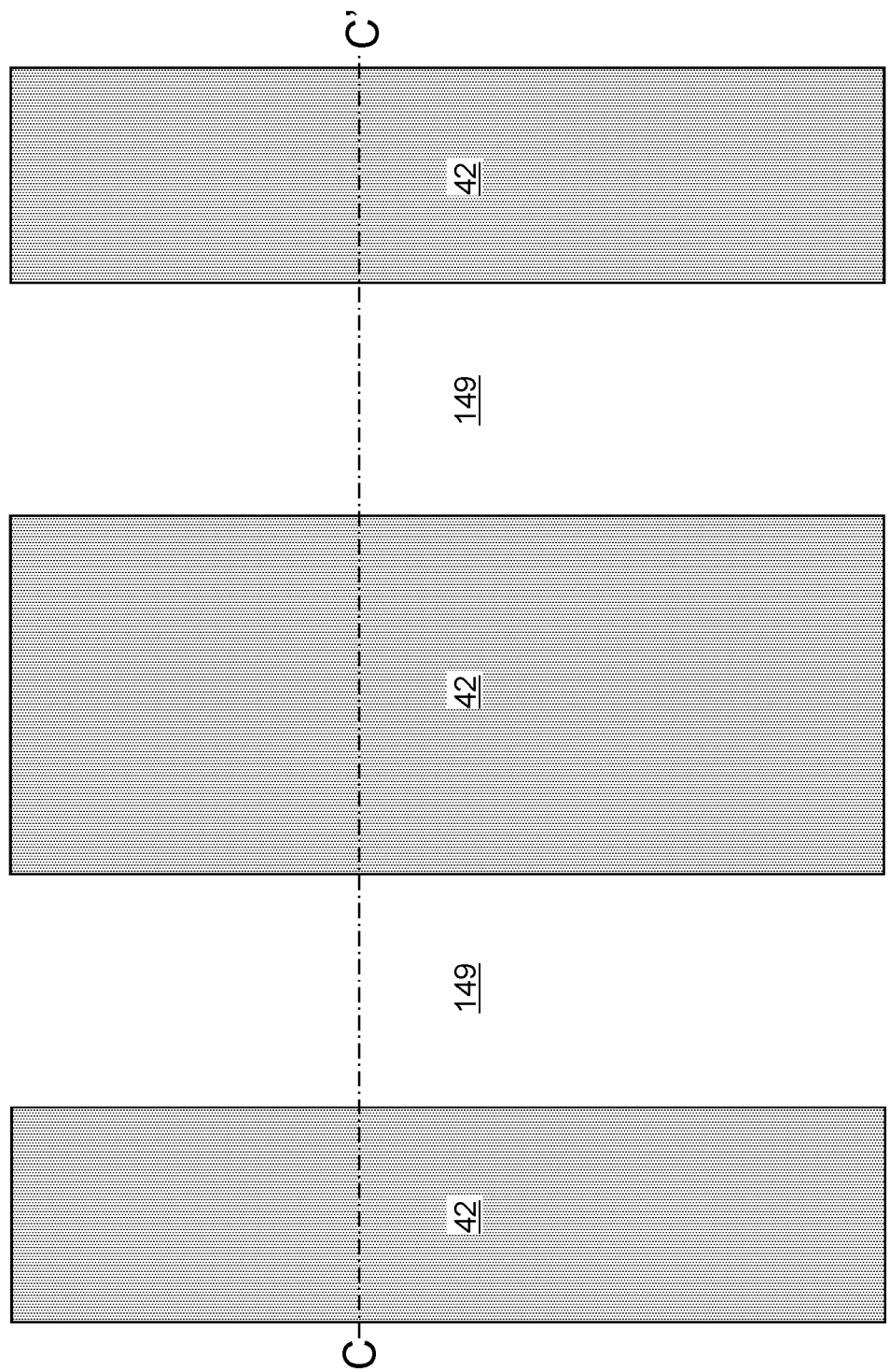
FIG. 14D is a horizontal cross-sectional view of the second exemplary structure along the horizontal plane D-D' of FIG. 14C.

Referring to FIGS. 13A and 13B, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 163. Word line contact via structures 86 can be formed on the electrically conductive layers 46 through the contact level dielectric layer 73, and through the retro-stepped dielectric material portion 65. Peripheral device contact via structures 8P can be formed through the retro-stepped dielectric material portion 65 directly on respective nodes of the peripheral devices.

Referring to FIGS. 14A-14D, a second exemplary structure according to a second embodiment of the present disclosure can be derived from the first exemplary structure of FIG. 3 by forming line trenches 149 through the alternating stack (32, 42) and the retro-stepped dielectric material portion 65. The line trenches 149 laterally extend along a first horizontal direction hd1, which may be a direction that is perpendicular to the interface between the memory array region 100 and the staircase region 200, and are laterally spaced apart along a second horizontal direction hd2. The line trenches 149 can have a uniform width along a widthwise direction, which is the second horizontal direction hd2 that is perpendicular to the first horizontal direction hd1. The line trenches 149 can have a uniform pitch along the second horizontal direction hd2. Each line trench 149 can vertically extend from a horizontal plane including the top surface of the insulating cap layer 70 to a top surface of the single crystalline semiconductor material layer that underlies the alternating stack (32, 42), such as the semiconductor material layer 10. The lengthwise sidewalls of the line trenches 149 that laterally extend along the first horizontal direction hd1 can be vertical or substantially vertical. The width of each line trench 149 may be in a range from 40 nm to 400 nm, although lesser and greater widths can also be employed. Generally, an array of line trenches 149 can be formed through the alternating stack (32, 42). The alternating stack (32, 42) provided at the processing steps of FIG. 3 can be divided into a plurality of alternating stacks (32, 42) having a respective uniform width and laterally spaced apart along the second horizontal direction hd2 by the line trenches 149.

Figure 15A:
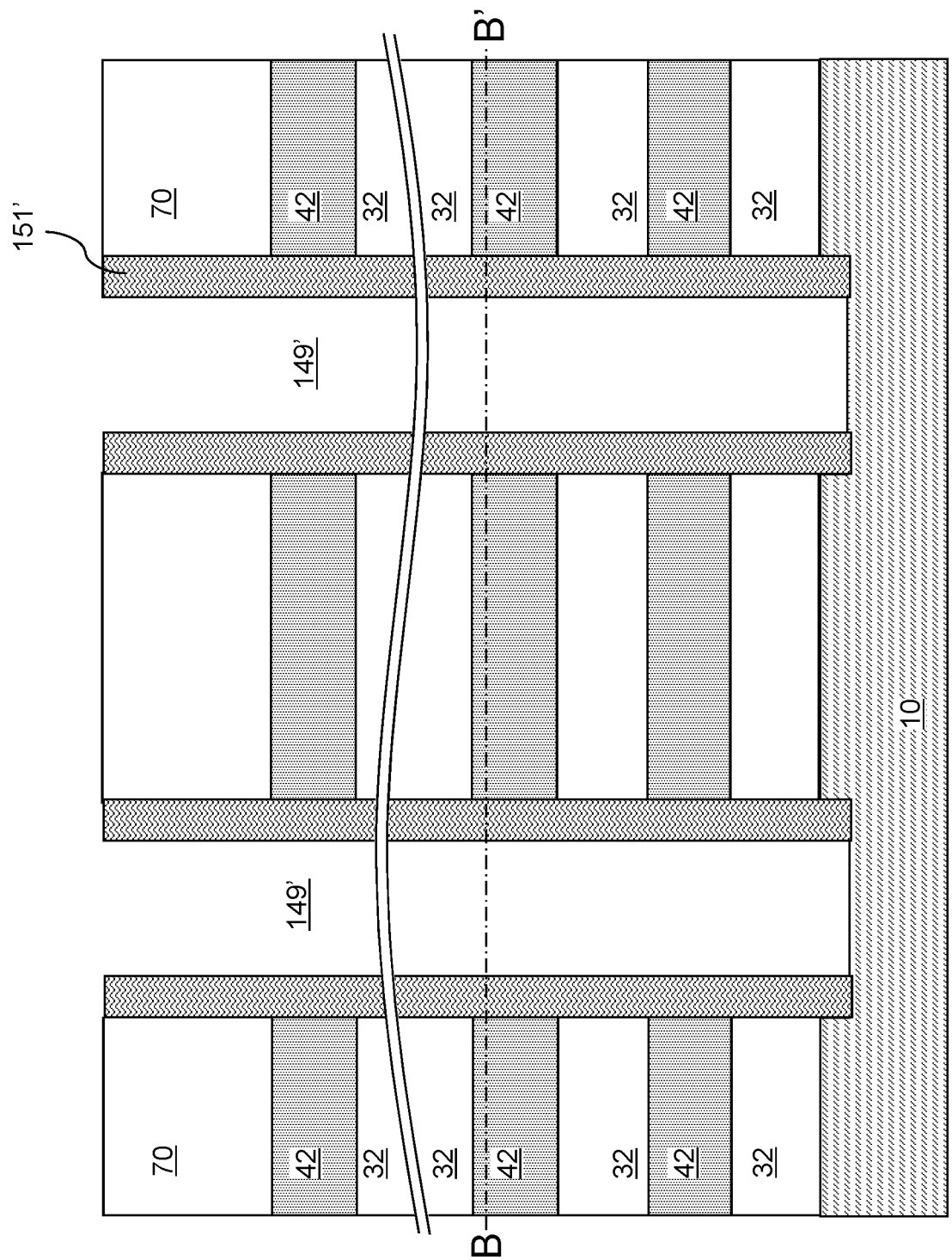
FIG. 15A is a vertical cross-sectional view of a region of the second exemplary structure after formation of a pair of sacrificial material rails within each line trench according to the second embodiment of the present disclosure.
Figure 15B:
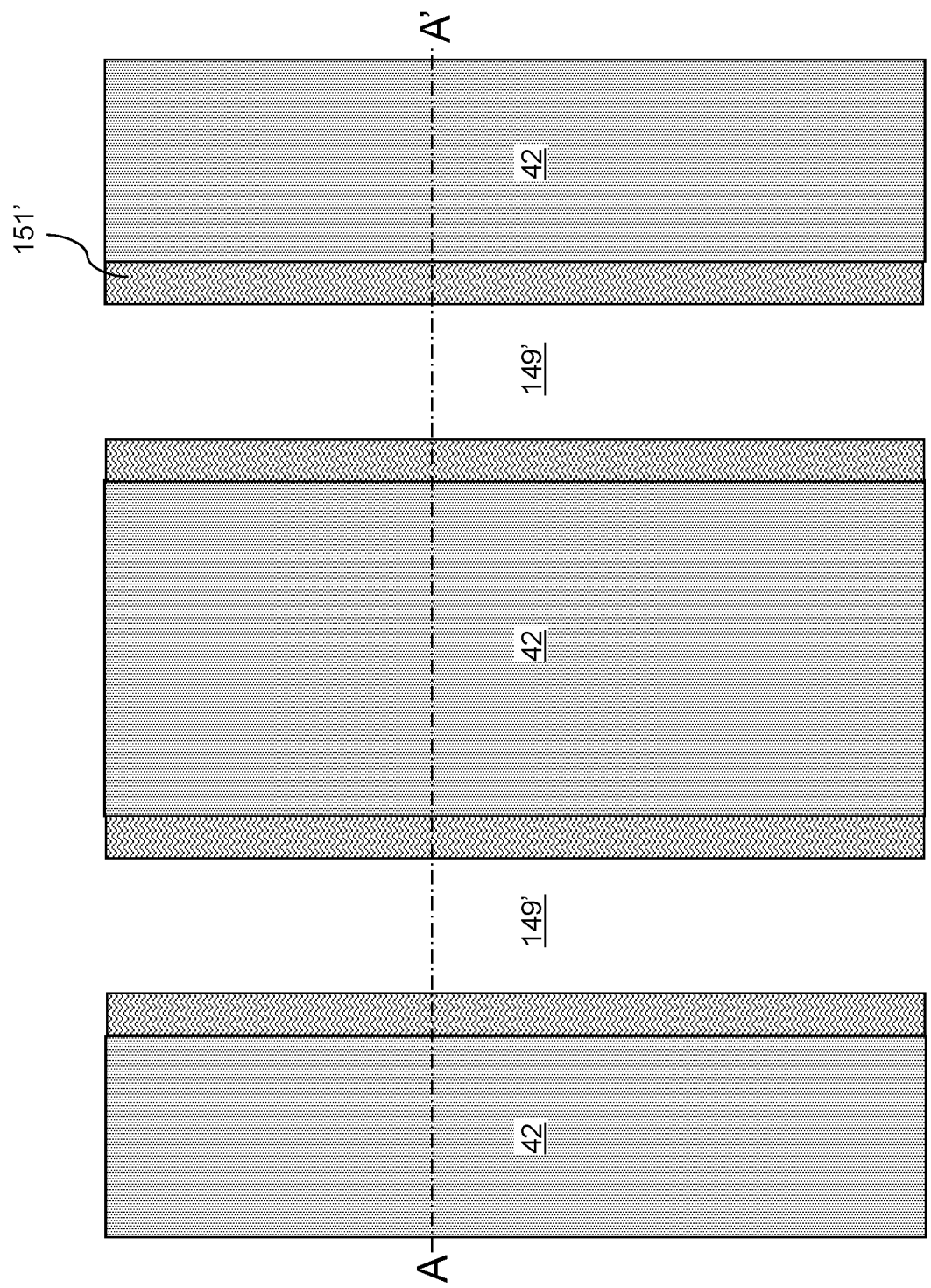
FIG. 15B is a horizontal cross-sectional view of the region of the second exemplary structure along the horizontal plane B-B' of FIG. 15A.

Referring to FIGS. 15A and 15B, a sacrificial material layer can be conformally deposited, and can be anisotropically etched to remove horizontal portions. Remaining vertical portions of the sacrificial material layer include sacrificial material rails 151' located on lengthwise sidewalls of the line trenches 149. The sacrificial material rails 151' can have a uniform width throughout. A line cavity 149' including a void, i.e., an unfilled volume, is present within each line trench 149. A pair of sacrificial material rails 151' can be formed within each line trench 149. The sacrificial material rails 151' include a sacrificial material that can be removed selective to the materials of the insulating layers 32, the sacrificial material layers 42, and the semiconductor material layer 10. For example, the sacrificial material rails 151' can include polysilicon, amorphous silicon, a silicon-germanium alloy, borosilicate glass, organosilicate glass, a carbon-based material such as amorphous carbon or diamond-like carbon (DLC), or a polymer material. The lateral thickness of each sacrificial material rail 151' can be in a range from 2 nm to 80 nm, such as from 4 nm to 40 nm, although lesser and greater thicknesses can also be employed.

Figure 16A:
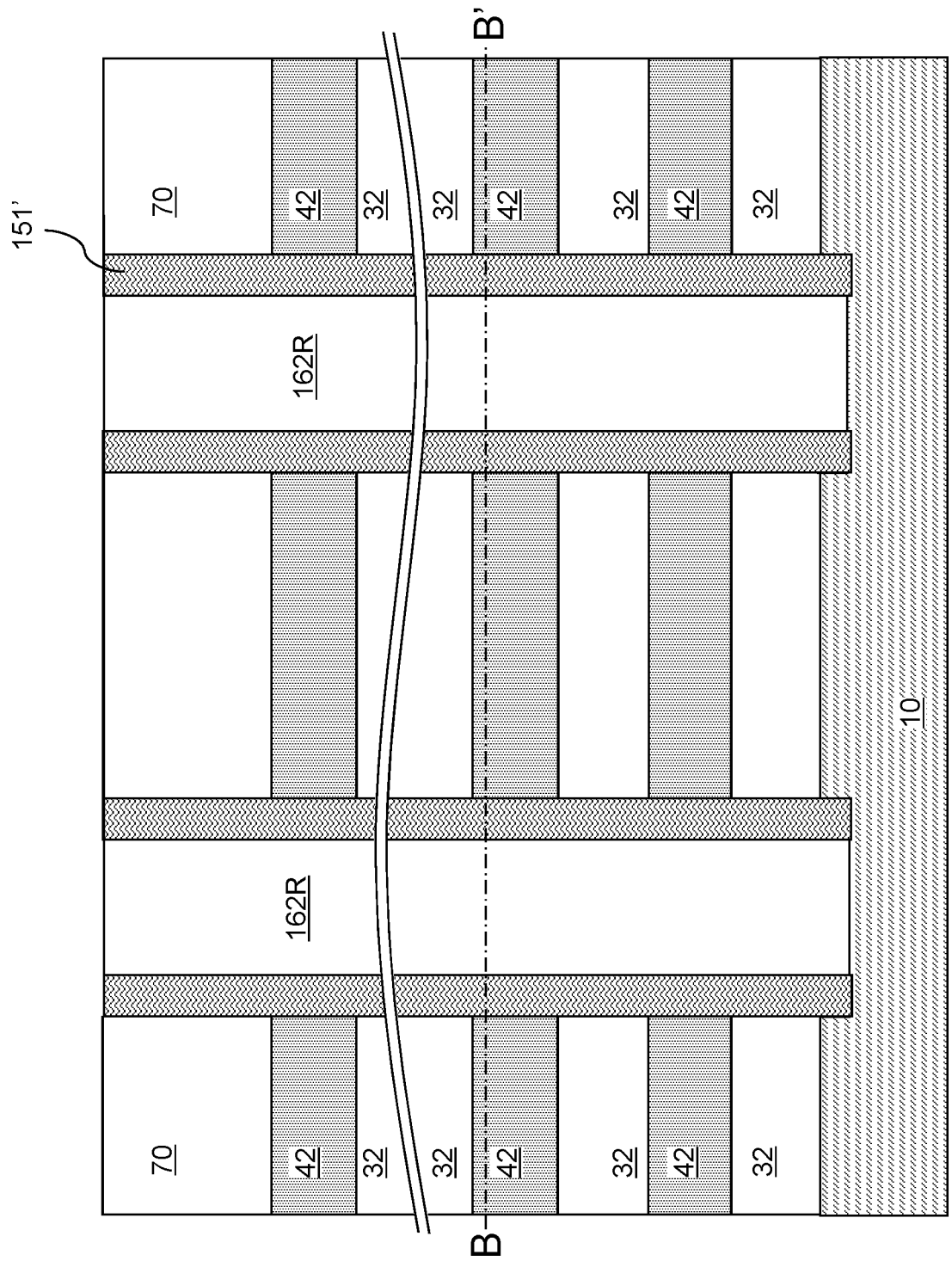
FIG. 16A is a vertical cross-sectional view of a region of the second exemplary structure after formation of a dielectric material rail within each line trench according to the second embodiment of the present disclosure.
Figure 16B:
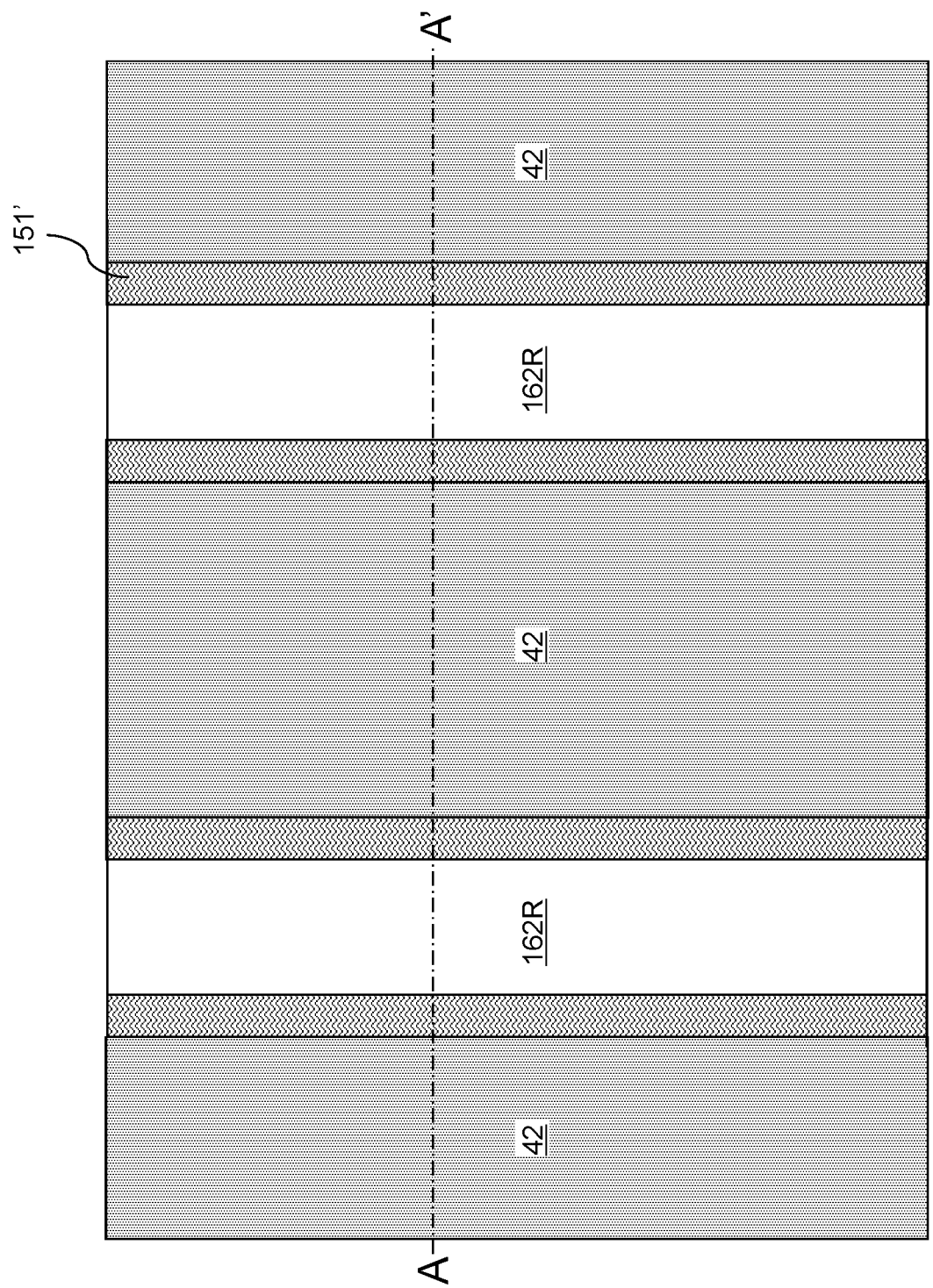
FIG. 16B is a horizontal cross-sectional view of the region of the second exemplary structure along the horizontal plane B-B' of FIG. 16A.

Referring to FIGS. 16A and 16B, a dielectric material such as silicon oxide can be deposited in the line cavities 149'. Excess portions of the dielectric material can be removed from above the horizontal plane including the top surface of the insulating cap layer 70 by a planarization process, which can employ a recess etch process and/or chemical mechanical planarization. Each portion of the dielectric material that fills a respective line cavity 149' is herein referred to as a dielectric material rail 162R. Each dielectric material rail 162R can laterally extend along the first horizontal direction hd1, and can have a uniform thickness throughout. In one embodiment, the dielectric material rails 162R can include a doped silicate glass or an undoped silicate glass (i.e., silicon oxide). A combination of a pair of sacrificial material rails 151' and a dielectric material rail 162R can be formed in each of the line trenches 149.

Figure 17A:
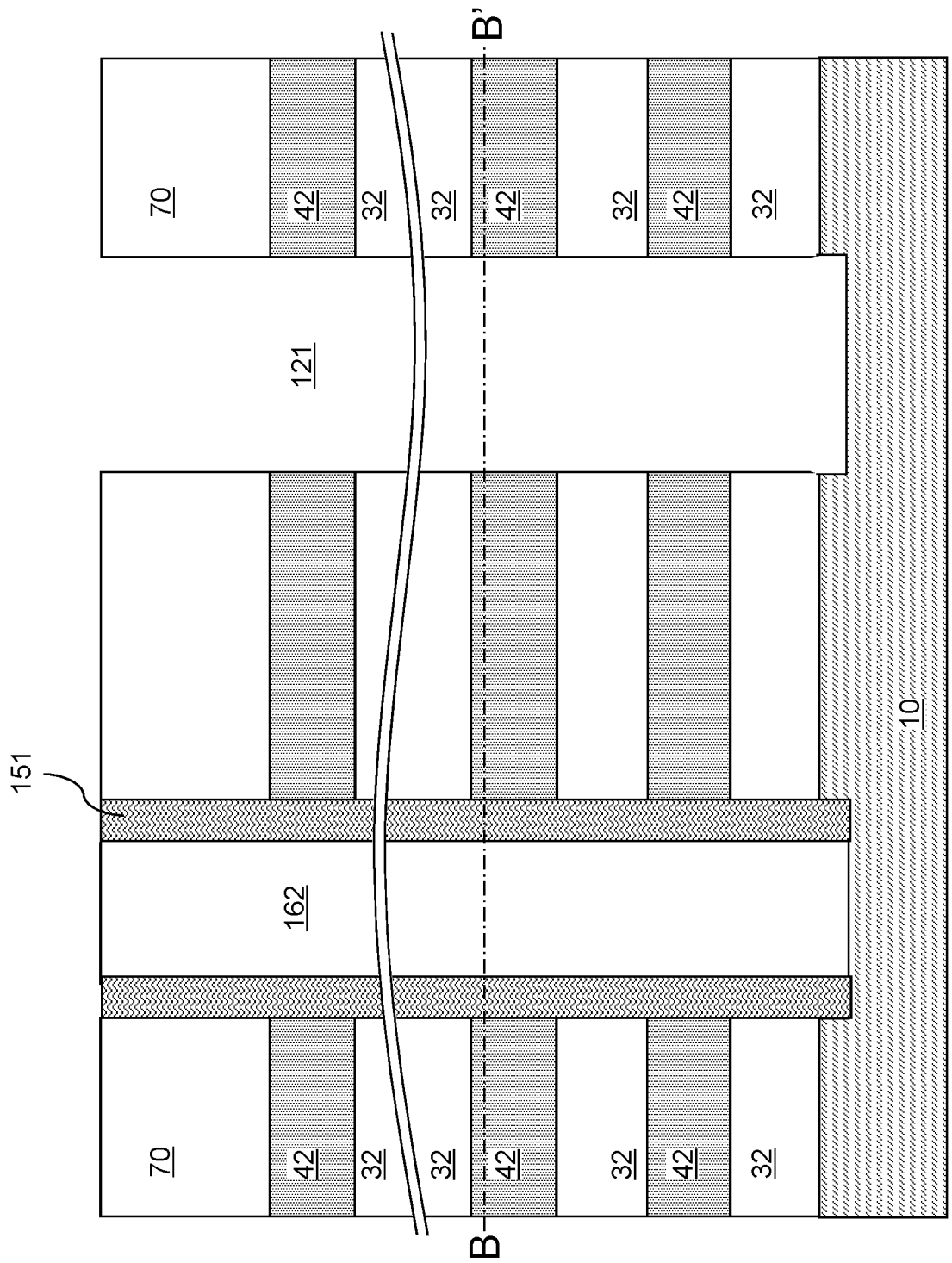
FIG. 17A is a vertical cross-sectional view of a region of the second exemplary structure after formation of pillar cavities according to the second embodiment of the present disclosure.
Figure 17B:
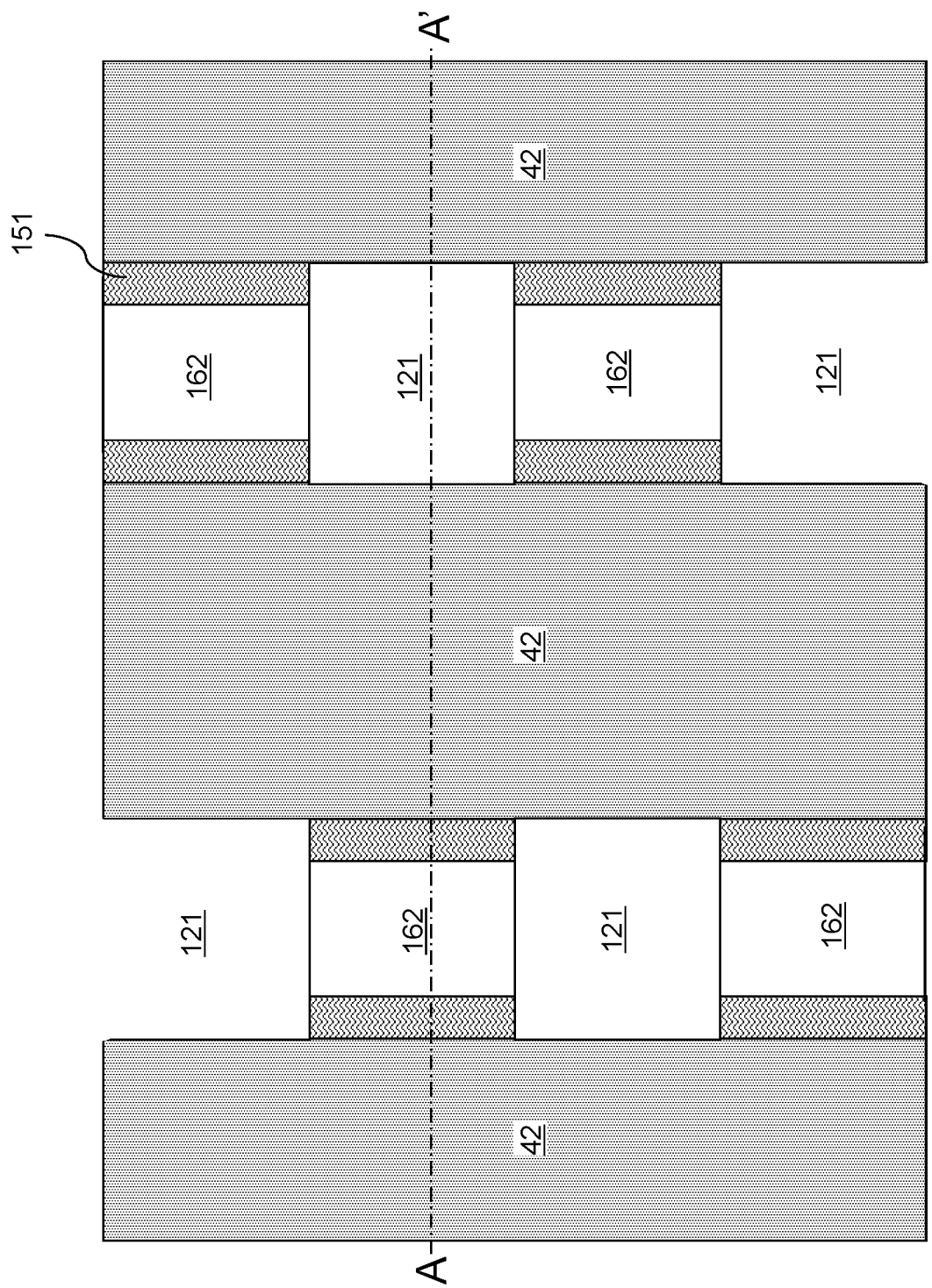
FIG. 17B is a horizontal cross-sectional view of the region of the second exemplary structure along the horizontal plane B-B' of FIG. 17A.

Referring to FIGS. 17A and 17B, a photoresist layer (not shown) can be applied over the alternating stacks (32, 42), the sacrificial material rails 151', and the dielectric material rails 162R. The photoresist layer can be patterned to form a two-dimensional array of openings that includes rows of openings that overlie a respective one of the line trenches 149. Each row of openings in the photoresist layer can laterally extend along the first horizontal direction hd1. Each opening in the photoresist layer can overlie a pair of lengthwise sidewalls of a respective underlying line trench 149.

An anisotropic etch process can be performed employing the photoresist layer as an etch mask. Portions of the sacrificial material rails 151' and the dielectric material rails 162R that are not masked by the photoresist layer are etched through down to the top surface of the semiconductor material layer 10. Each combination of a dielectric material rail 162R and a pair of sacrificial material rails 151' is divided into multiple composite pillar structures (162, 151) that are arranged in a row. Each composite pillar structure (162, 151) includes a respective dielectric core 162 that is patterned portion of a dielectric material rail 162R, and a pair of sacrificial material strips 151 which are patterned portions of a sacrificial material rail 151'. The vertical cavities located between each neighboring pair of composite pillar structures (162, 151) in a line trench 149 are herein referred to as pillar cavities 121. The pillar cavities 121 are formed in volumes from which portions of the sacrificial material rails 162R and the dielectric material rails 151' are removed by the anisotropic etch process. A row of multiple discrete pillar structures (162, 151) is interlaced with a row of pillar cavities 121 in each line trench 149. The photoresist layer can be subsequently removed, for example, by ashing.

Figure 18A:
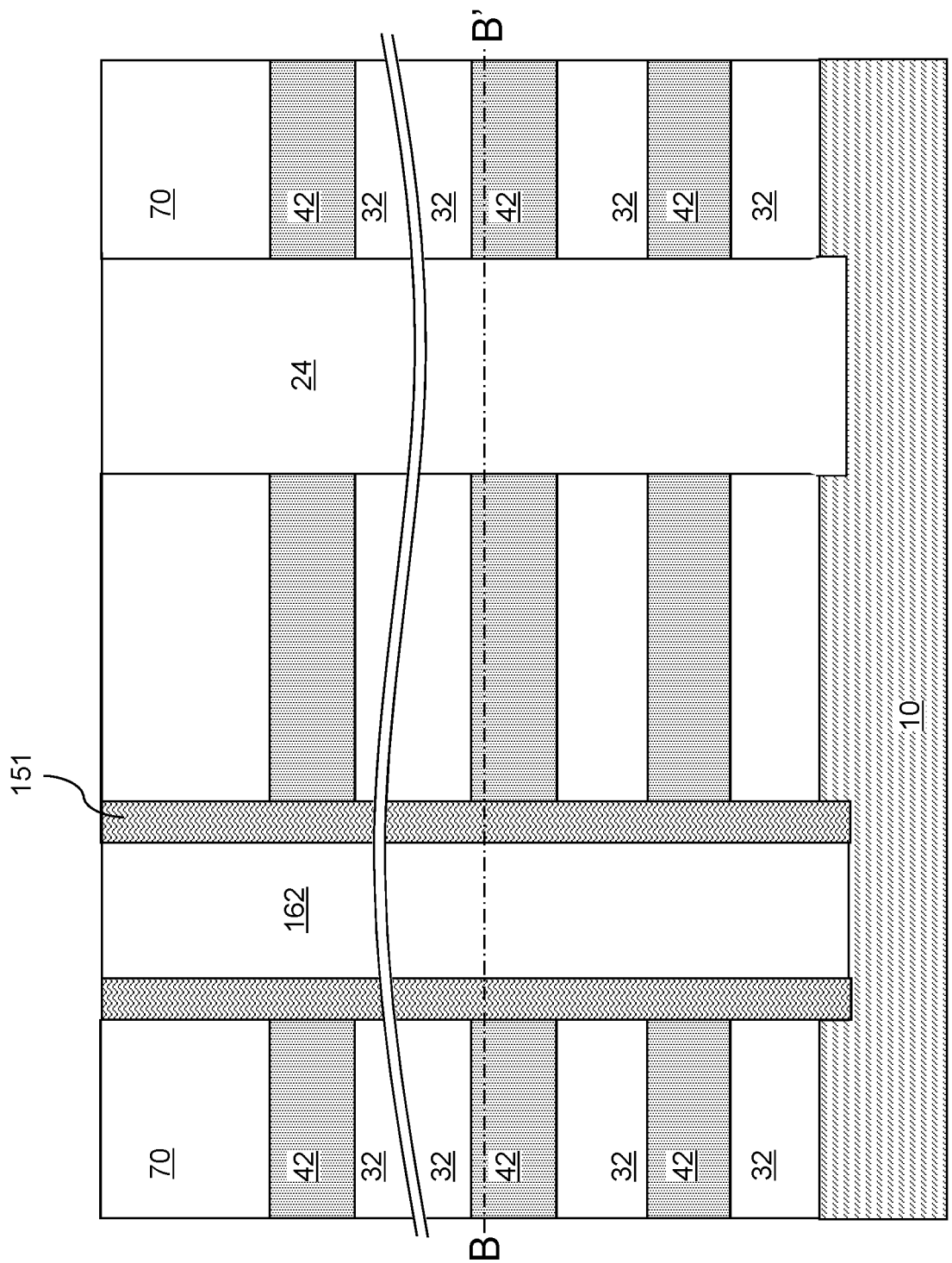
FIG. 18A is a vertical cross-sectional view of a region of the second exemplary structure after formation of dielectric pillar structures in the pillar cavities according to the second embodiment of the present disclosure.
Figure 18B:
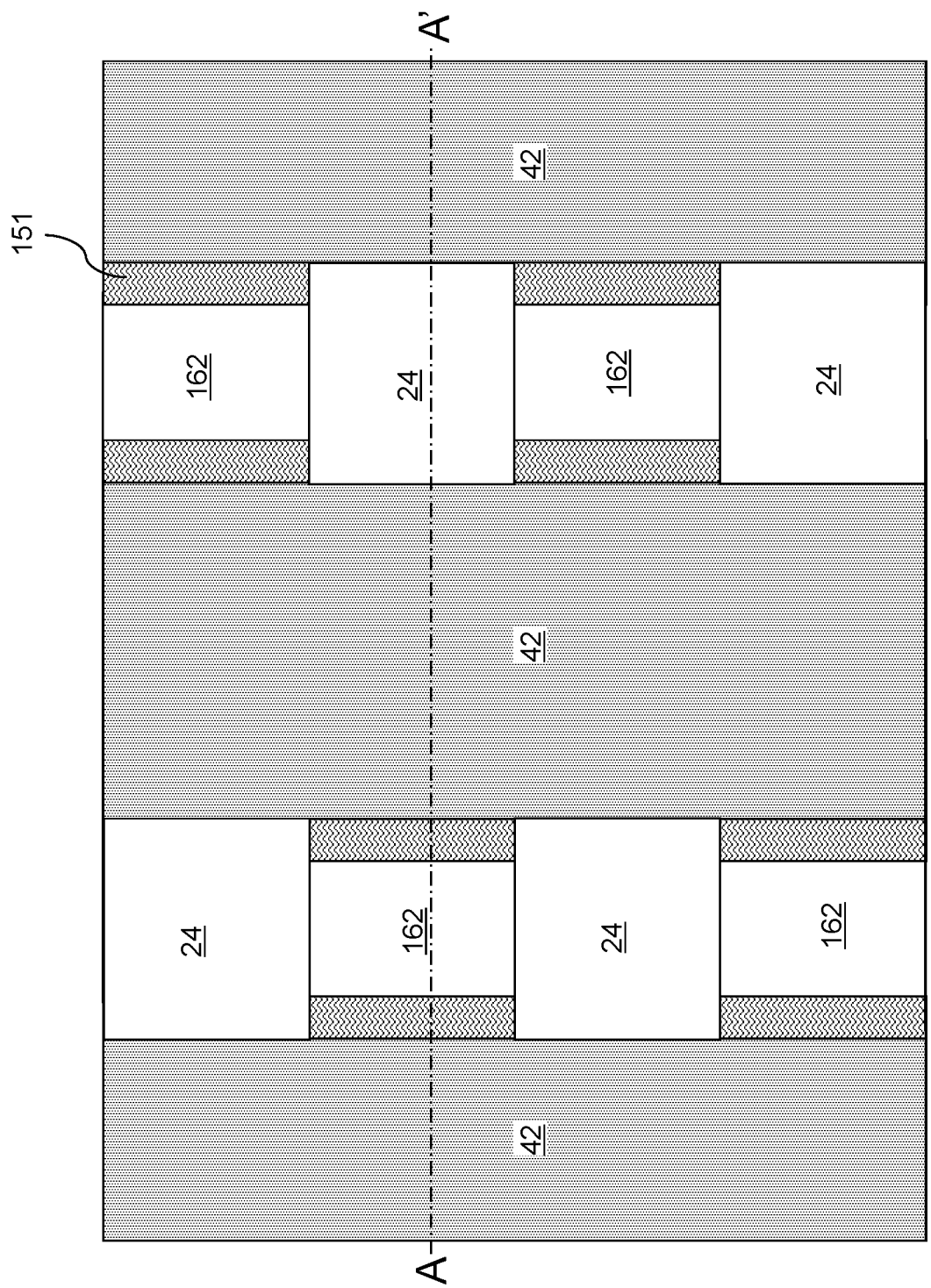
FIG. 18B is a horizontal cross-sectional view of the region of the second exemplary structure along the horizontal plane B-B' of FIG. 18A.

Referring to FIGS. 18A and 18B, a dielectric material such as silicon oxide can be deposited in the pillar cavities 121. Optionally, excess portions of the dielectric material may be removed from above the horizontal plane including the top surface of the insulating cap layer by a planarization process such as a recess etch or a chemical mechanical planarization process. The dielectric material filling the pillar cavities 121 constitute dielectric pillar structures 24. The dielectric pillar structures 24 may include the same material as, or a different material from, the dielectric cores 162.

Figure 19A:
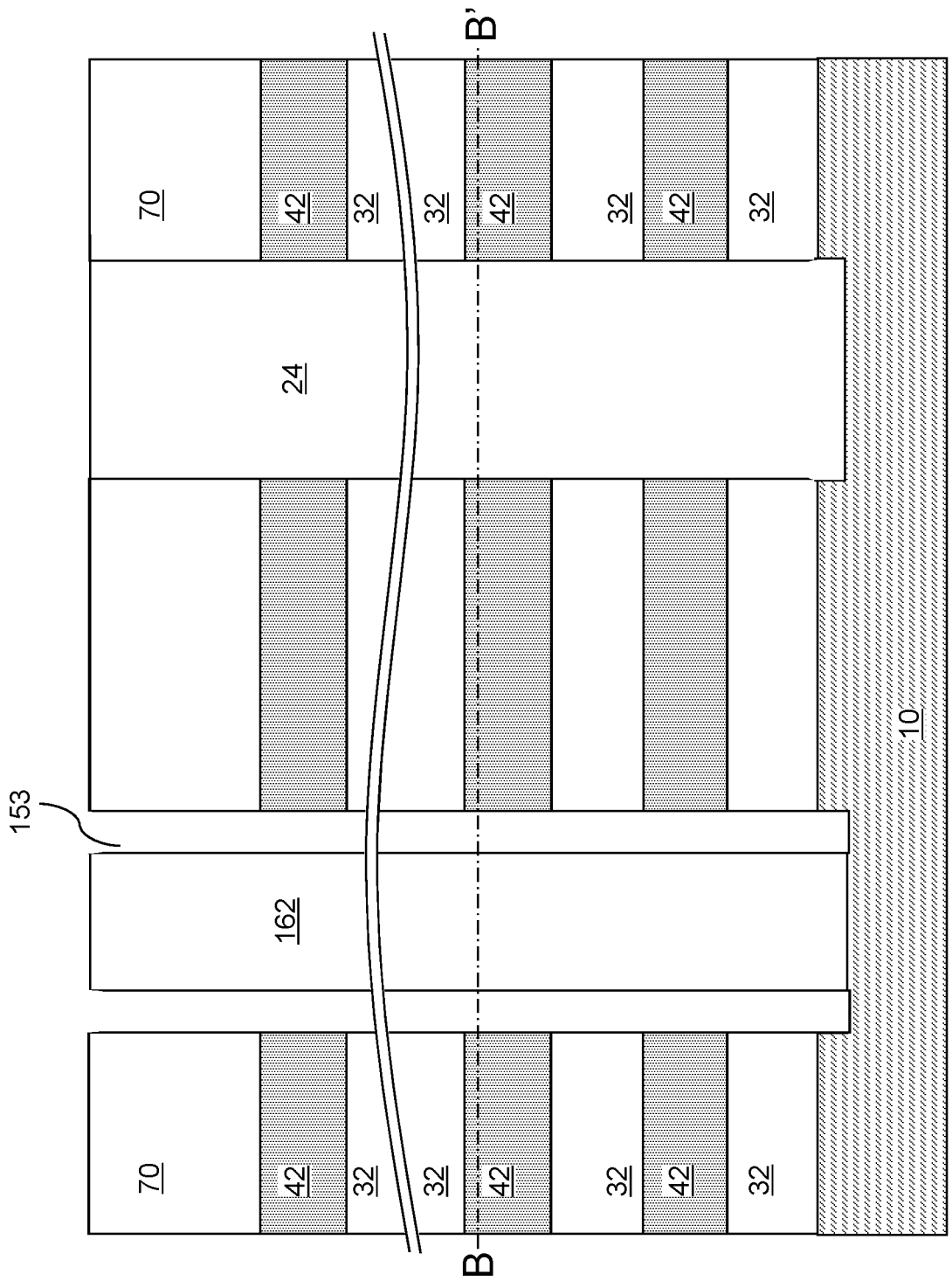
FIG. 19A is a vertical cross-sectional view of a region of the second exemplary structure after formation of vertical cavities by removal of the sacrificial material strips according to the second embodiment of the present disclosure.
Figure 19B:
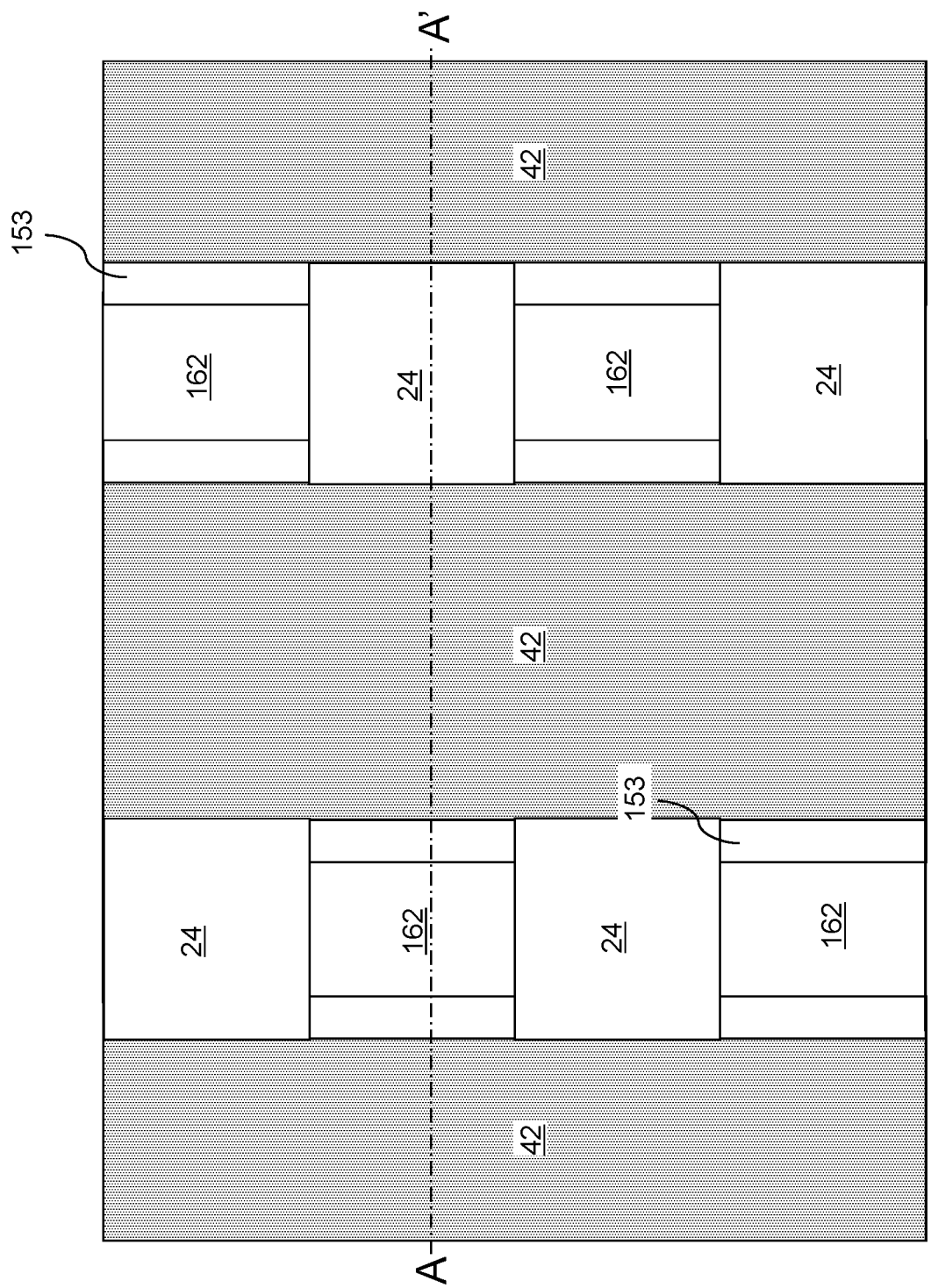
FIG. 19B is a horizontal cross-sectional view of the region of the second exemplary structure along the horizontal plane B-B' of FIG. 19A.

Referring to FIGS. 19A and 19B, the sacrificial material strips 151 can be removed selective to the materials of the insulating layers 32, the sacrificial material layers 42, the semiconductor material layer 10, the dielectric cores 162, and the dielectric pillar structures 24 by an etch process. The etch process can be a dry etch process or a wet etch process. The chemistry of the etch process is selected such that the material of the sacrificial material strips 151 is removed without removing a significant amount of materials of the insulating layers 32, the sacrificial material layers 42, the semiconductor material layer 10, the dielectric cores 162, and the dielectric pillar structures 24. For example, if the sacrificial material strips 151 include polysilicon, a wet etch process using trimethyl-2 hydroxyethyl ammonium hydroxide ("TMY") can be employed to etch the sacrificial material strips 151 selective to the materials of the insulating layers 32, the sacrificial material layers 42, the semiconductor material layer 10, the dielectric cores 162, and the dielectric pillar structures 24. Alternatively, if the sacrificial material strips 151 include amorphous silicon-germanium alloy, a wet etch process using ammonium hydroxide and hydrogen peroxide can be employed to etch the sacrificial material strips 151 selective to the materials of the insulating layers 32, the sacrificial material layers 42, the semiconductor material layer 10, the dielectric cores 162, and the dielectric pillar structures 24. Vertical cavities 153 are formed in volumes from which the sacrificial material strips 151 are removed. Each of the line trenches 149 is filled with a respective set of dielectric material portions (162, 24) that define two rows of vertical cavities 153.

Figure 20A:
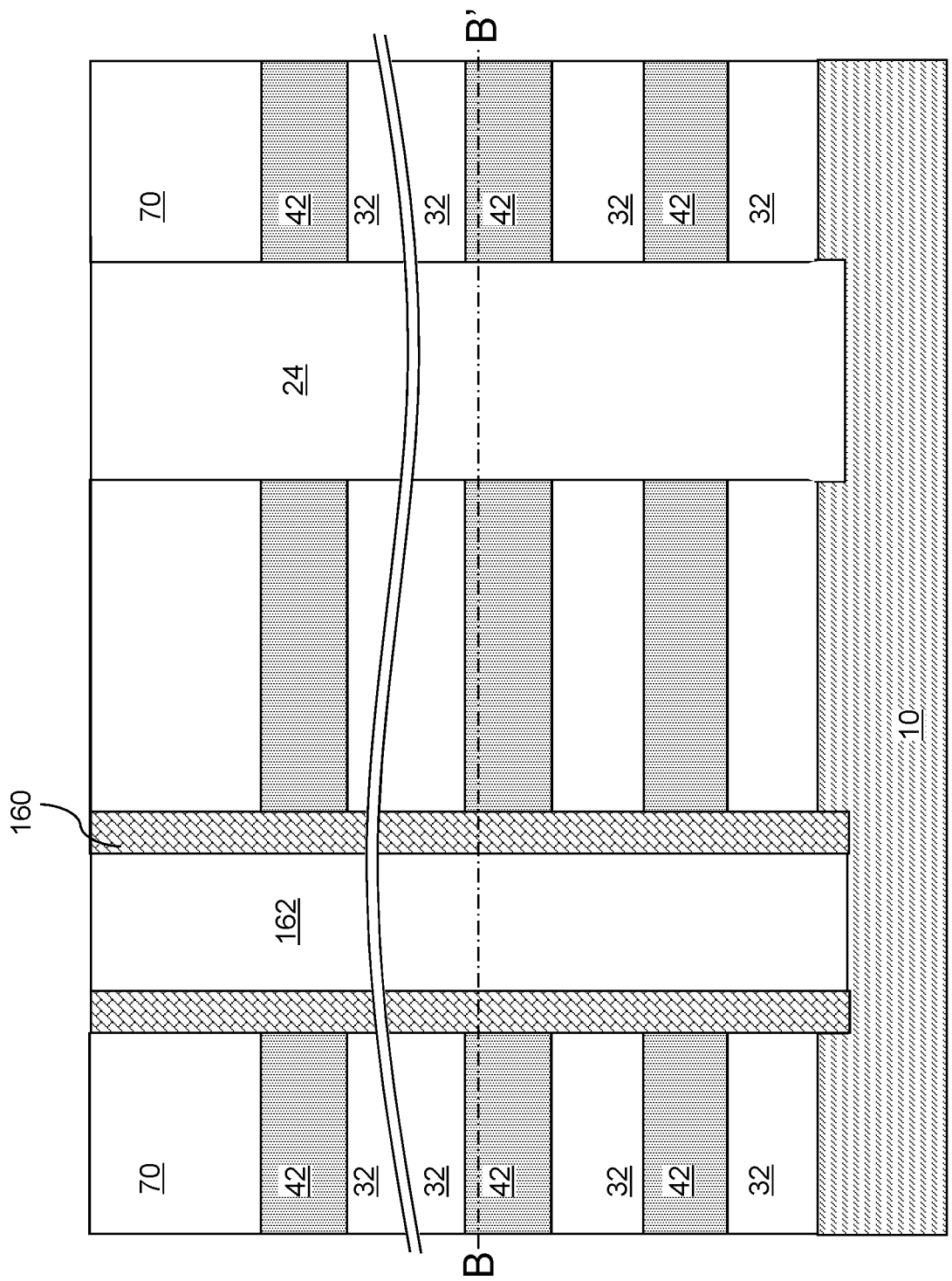
FIG. 20A is a vertical cross-sectional view of a region of the second exemplary structure after formation of vertical semiconductor channels according to the second embodiment of the present disclosure.
Figure 20B:
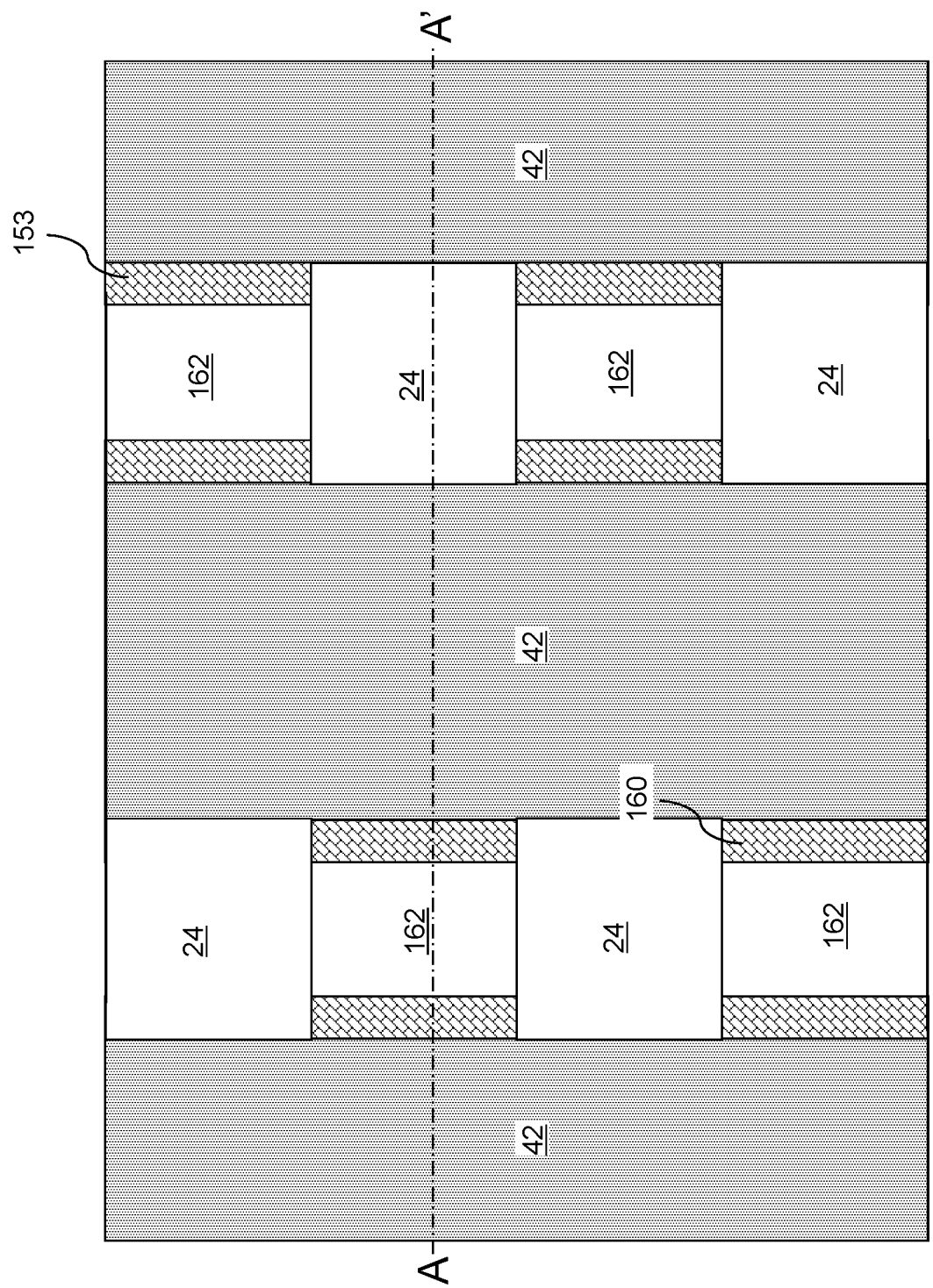
FIG. 20B is a horizontal cross-sectional view of the region of the second exemplary structure along the horizontal plane B-B' of FIG. 20A.

Referring to FIGS. 20A and 20B, a vertical semiconductor channel 160 can be formed in each vertical cavity 153 by performing a selective epitaxy process. The selective epitaxy process can be the same as in the processing step of FIG. 5B or FIG. 6B of the first embodiment. The selective epitaxy process grows a single crystalline semiconductor material (such as single crystalline silicon) from physically exposed surfaces of the single crystalline semiconductor material layer that underlie the vertical cavities 153 that vertically extend through the alternating stack (32, 42). In one embodiment, the single crystalline semiconductor material deposited by the selective epitaxy process can be single crystalline doped silicon.

Each vertical semiconductor channel 160 comprises a single crystalline semiconductor material in epitaxial alignment with the single crystalline semiconductor material of the semiconductor material layer 10, or with the single crystalline semiconductor material of the substrate semiconductor layer 9 in case the semiconductor material layer 10 is omitted. In one embodiment, the vertical semiconductor channel 160 can comprise, and/or can consist essentially of, single crystalline silicon. In one embodiment, the vertical semiconductor channel 160 can have a doping of the first conductivity type, which is the same as the conductivity type of the semiconductor material layer 10 that the pedestal channel portion contacts. If a semiconductor material layer 10 is not present, the vertical semiconductor channel 160 can be formed directly on the substrate semiconductor layer 9, which can have a doping of the first conductivity type. The first conductivity type dopants in the vertical semiconductor channels 160 can be introduced into the vertical semiconductor channels 160 by in-situ doping. The atomic concentration of dopants of the first conductivity type in the vertical semiconductor channels 160 may be in a range from $1.0 \times 10^{14}/cm^3$ to $1.0 \times 10^{18}/cm^3$, such as from $1.0 \times 10^{15}/cm^3$ to $1.0 \times 10^{17}/cm^3$, although lesser and greater atomic concentrations can also be employed.

The deposited single crystalline semiconductor material can grow at least up to the horizontal plane including the top surface of the insulating cap layer 70. Excess portions of the deposited single crystalline semiconductor material can be removed from above the horizontal plane including the top surface of the insulating cap layer 70 by a planarization process such as chemical mechanical planarization. Each remaining portion of the deposited single crystalline semiconductor material that fills a vertical cavity 153 constitutes a vertical semiconductor channel 160. Each vertical semiconductor channel 160 can have a top surface within the horizontal plane including the top surface of the insulating cap layer 70. Each vertical semiconductor channel 160 comprises, and/or consists essentially of, a respective single crystalline semiconductor material that fills a respective vertical cavity 153.

Figure 21A:
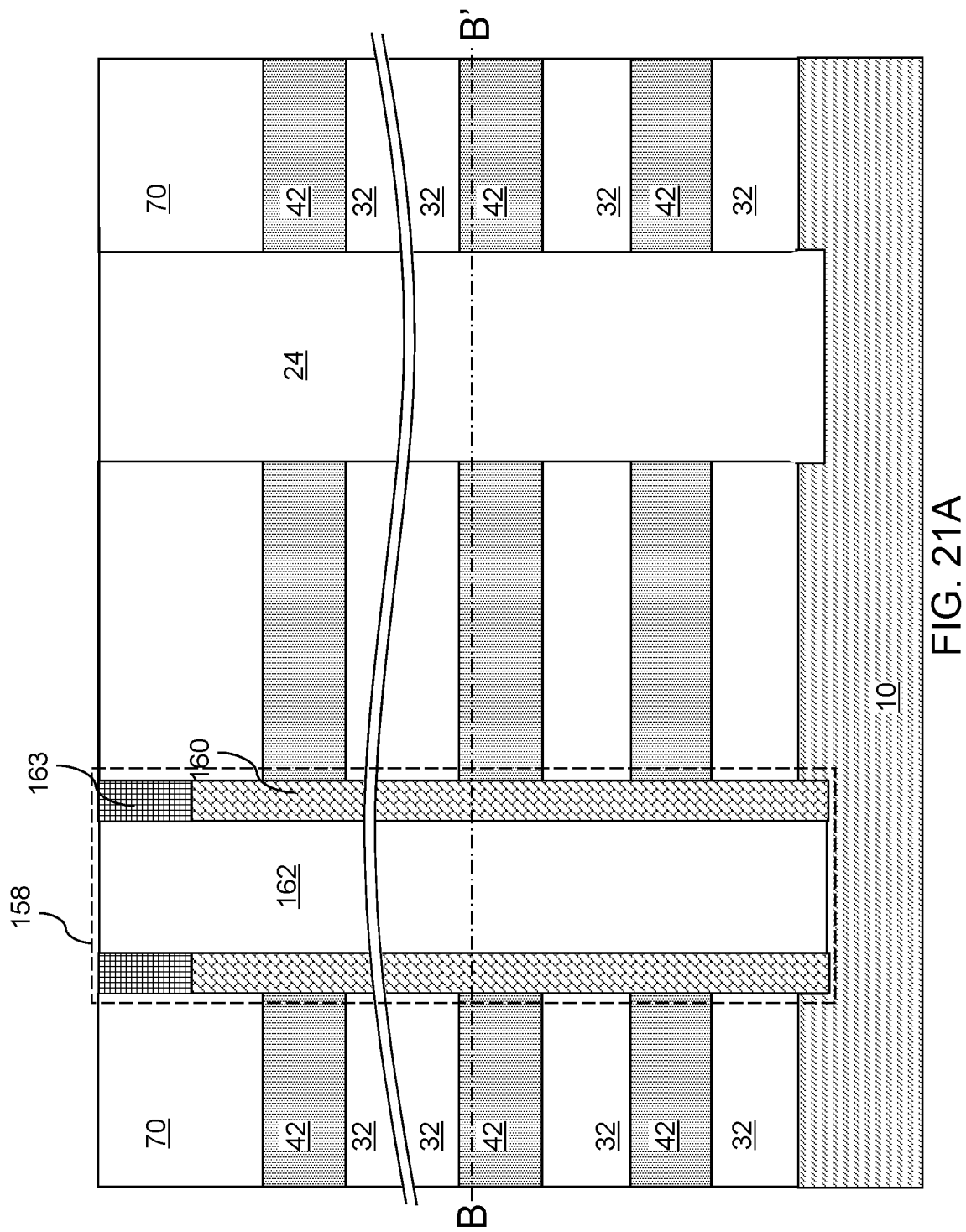
FIG. 21A is a vertical cross-sectional view of a region of the second exemplary structure after formation of drain regions according to the second embodiment of the present disclosure.
Figure 21B:
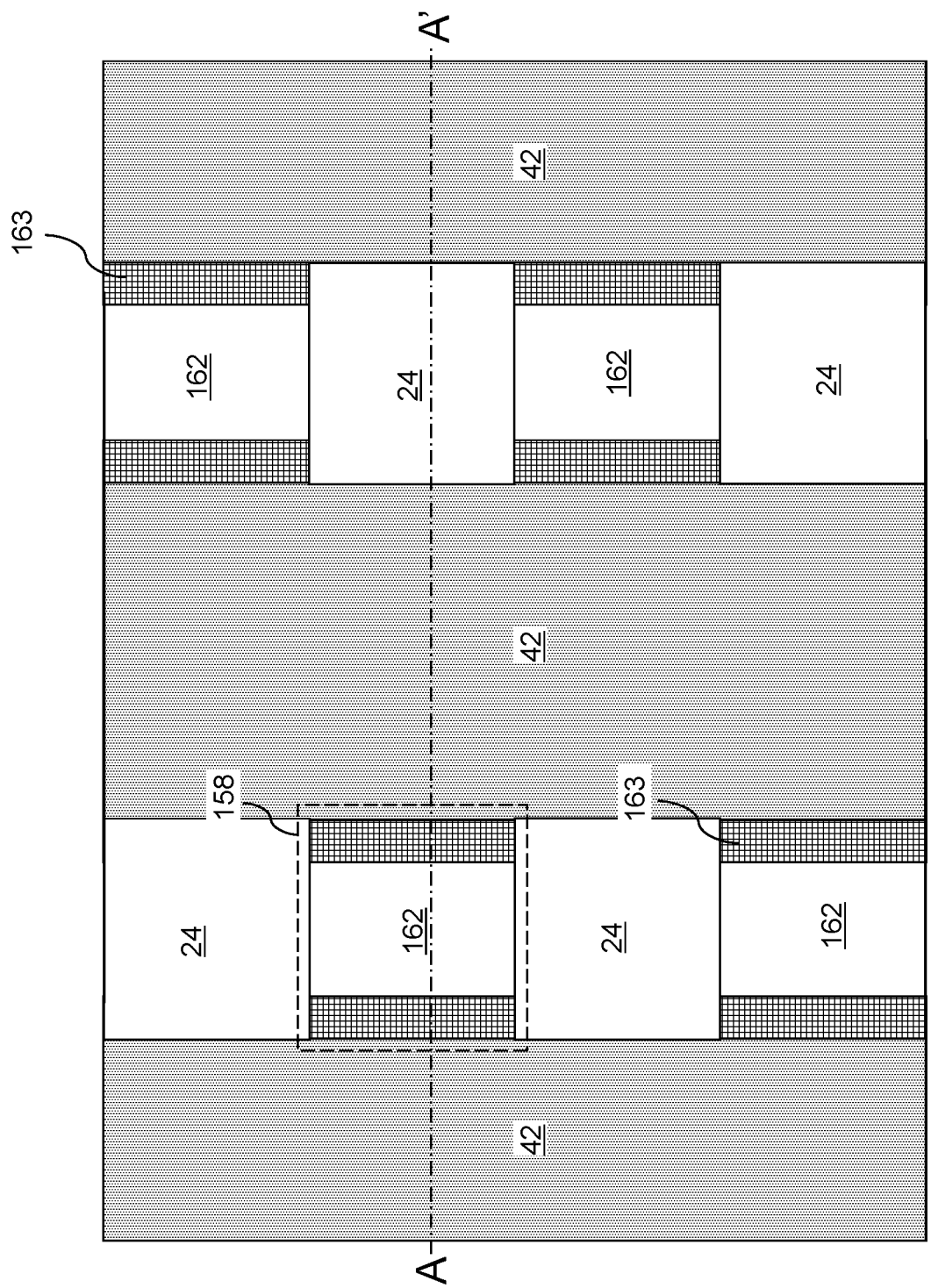
FIG. 21B is a horizontal cross-sectional view of the region of the second exemplary structure along the horizontal plane B-B' of FIG. 21A.

Referring to FIGS. 21A and 21B, dopants of a second conductivity type can be implanted into an upper portion of each of the vertical semiconductor channels 160. An upper portion of each vertical semiconductor channel 160 can be converted into a single crystalline doped semiconductor material portion having a doping of a second conductivity type, which is the opposite of the first conductivity type. For example, if the first conductivity type is p-type, the second conductivity type is n-type, and vice versa. Alternatively, the vertical semiconductor channels 160 may be recessed, and a separate drain semiconductor material may be deposited into the recesses above the vertical semiconductor channels. The drain semiconductor material may be in situ doped with second conductivity type dopants (e.g., silicon doped with phosphorus or arsenic) or it may be undoped as deposited, followed by ion implantation of the second conductivity type dopants into the drain semiconductor material to form the drain regions 163. The doped semiconductor regions having a doping of the second conductivity type are herein referred to as drain regions 163, each of which functions as a drain region of a vertical field effect transistor that employs an underlying vertical semiconductor channel 160 as a transistor channel. The atomic concentration of dopants of the second conductivity type in the vertical semiconductor channels 160 may be in a range from $5.0 \times 10^{18}/cm^3$ to $2.0 \times 10^{21}/cm^3$, although lesser and greater atomic concentrations can also be employed. The drain regions 163 are formed directly on a top end of a respective one of the vertical semiconductor channels 160. The interface between each drain region 163 and an underlying vertical semiconductor channel 160 can be located above the horizontal plane including the bottom surface of the insulating cap layer 70. Each combination of material portions located between a neighboring pair of dielectric pillar structures 24 is herein referred to as a memory opening fill structure 158. Each memory opening fill structure 158 includes a dielectric core 62, a pair of vertical semiconductor channels 160, and a pair of drain regions 163.

Figure 22A:
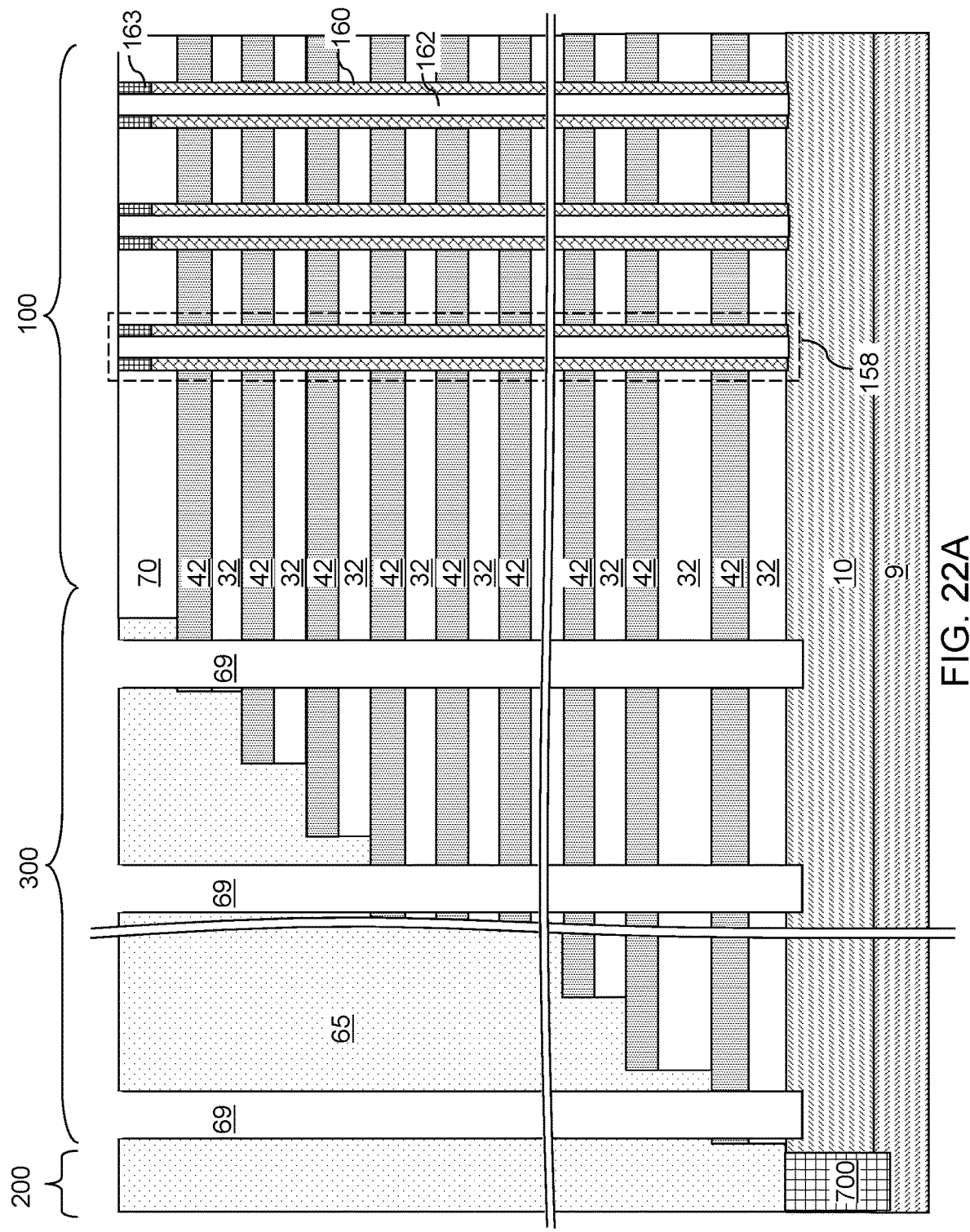
FIG. 22A is a vertical cross-sectional view of the second exemplary structure after formation of backside openings according to the second embodiment of the present disclosure.
Figure 22B:
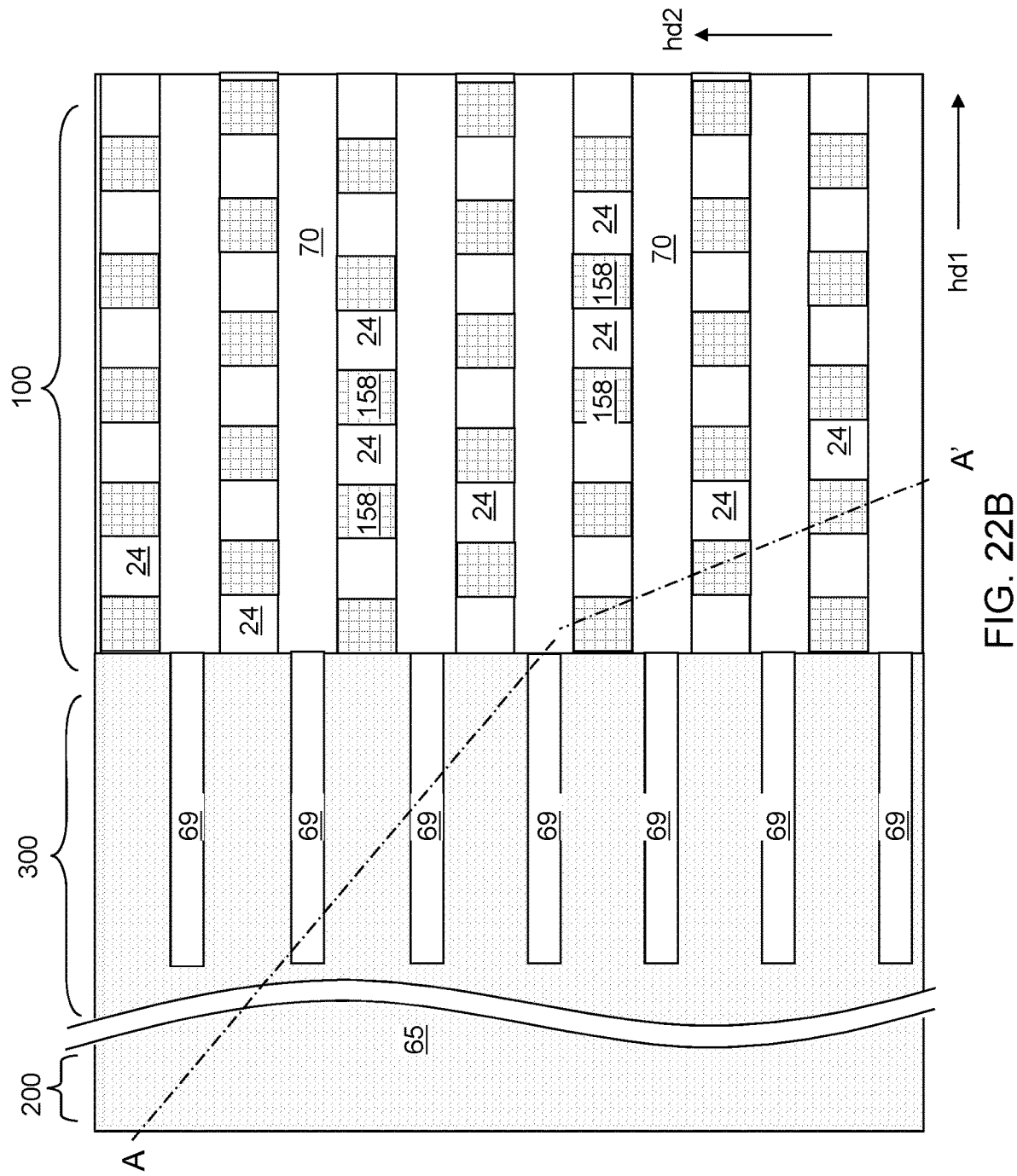
FIG. 22B is top down view of the second exemplary structure of FIG. 22A.

Referring to FIGS. 22A and 22B, a photoresist layer (not shown) can be applied over the second exemplary structure, and can be lithographically patterned to form openings between areas of the line trenches 149. For example, the openings in the photoresist layer can be formed between areas of the line trenches 149 that are located within the staircase region 200, and optionally in isolated areas within the memory array region 100 between the areas of the line trenches 149. An anisotropic etch process can be performed to remove underlying material portions inside the areas of the openings in the photoresist layer. Cavities that vertically extend to a top surface of the semiconductor material layer 10 can be formed underneath the openings in the photoresist layer. The cavities that extend to the top surface of the semiconductor material layer 10 are herein referred to as backside openings 69. The photoresist layer can be subsequently removed, for example, by ashing.

Figure 23A:
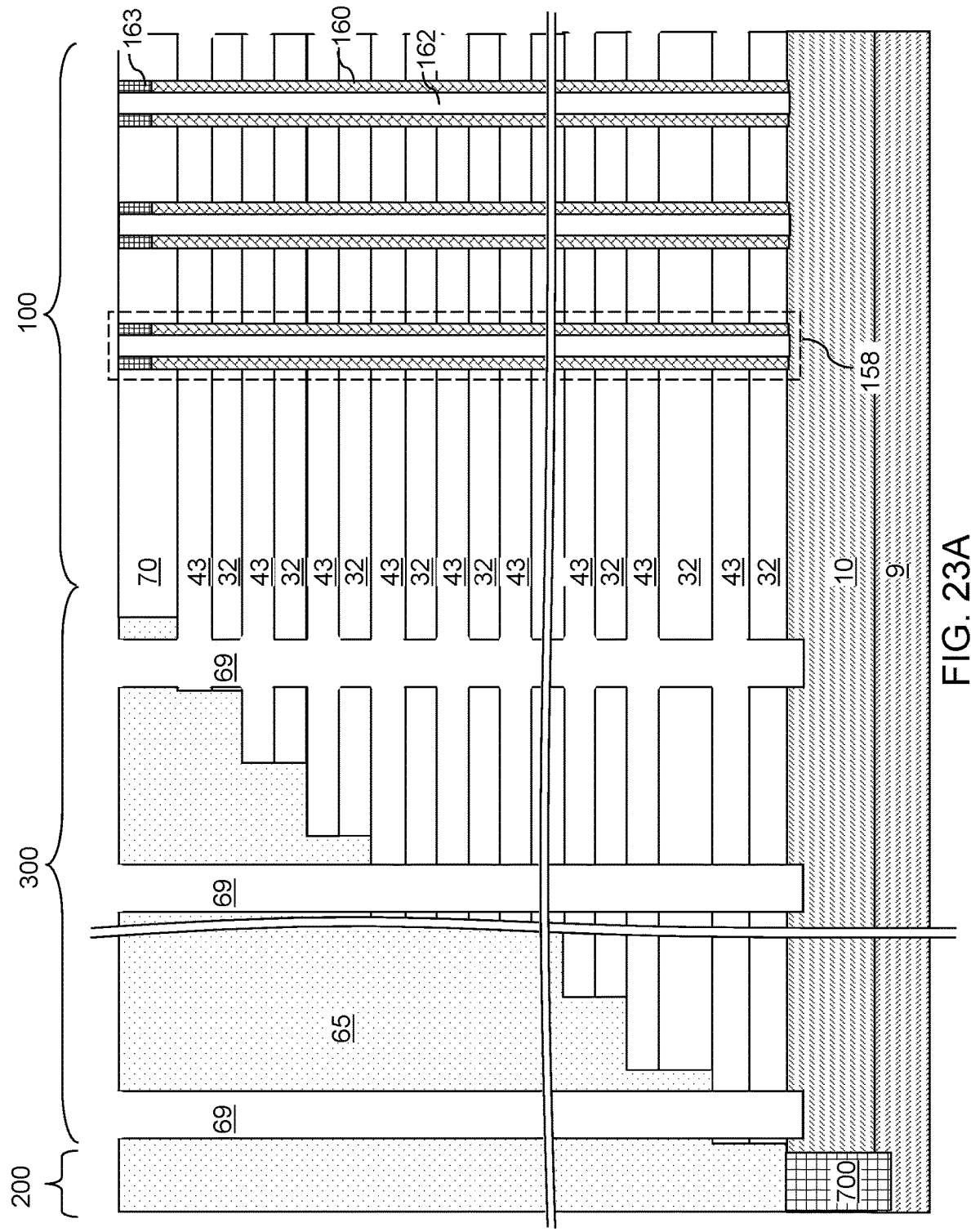
FIG. 23A is a vertical cross-sectional view of the second exemplary structure after formation of backside recesses according to the second embodiment of the present disclosure.
Figure 23B:
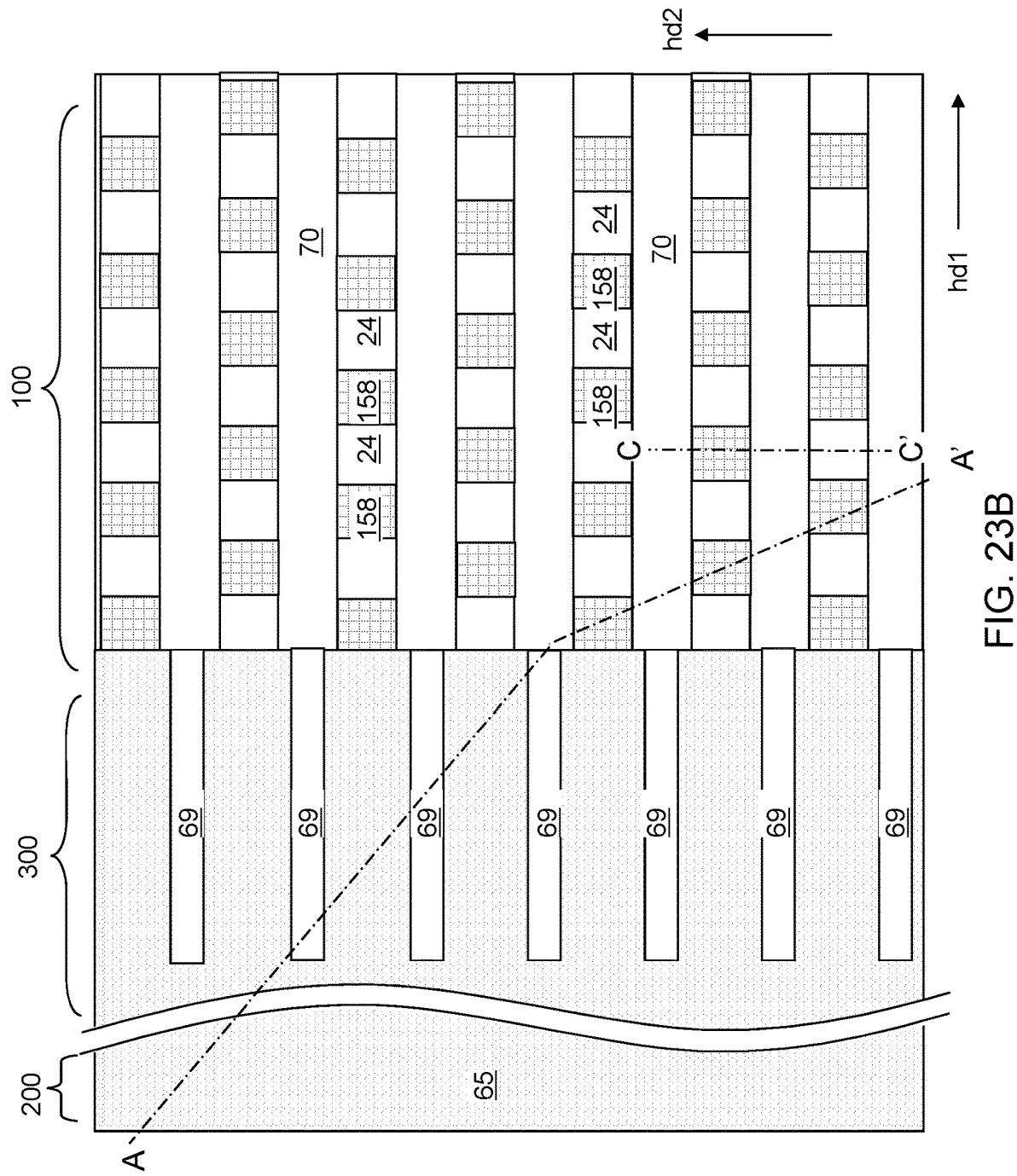
FIG. 23B is top down view of the second exemplary structure of FIG. 23A.
Figure 23C:
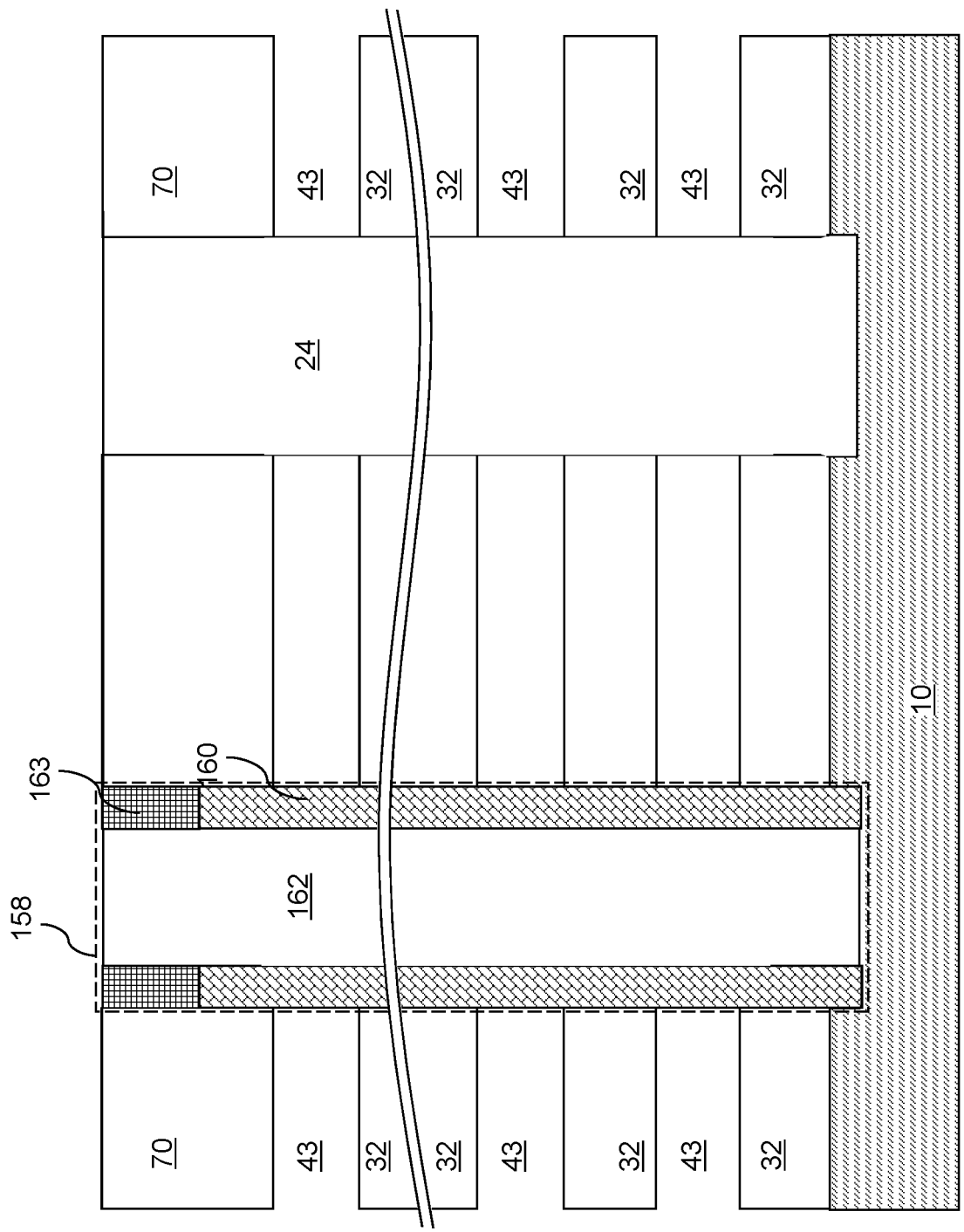
FIG. 23C is a vertical cross-sectional view of a region of the second exemplary structure along the vertical plane C-C' of FIG. 23B.

Referring to FIGS. 23A-23C, an etchant that selectively etches the second material of the sacrificial material layers 42 with respect to the first material of the insulating layers 32 can be introduced into the backside openings 69, for example, employing an etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the material of the dielectric pillar structures 24, the semiconductor material of the semiconductor material layer 10, and the material of the vertical semiconductor channels 160. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the vertical semiconductor channels 160 can be a wet etch process employing a wet etch solution, or can be a gas phase (dry) etch process in which the etchant is introduced in a vapor phase into the backside openings 69. For example, if the sacrificial material layers 42 include silicon nitride, the etch process can be a wet etch process in which the first exemplary structure is immersed within a wet etch tank including hot phosphoric acid, which etches silicon nitride selective to silicon oxide, silicon, and various other materials employed in the art. The retro-stepped dielectric material portion 65, the dielectric pillar structures 24, and the memory opening fill structures 158 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Figure 24:
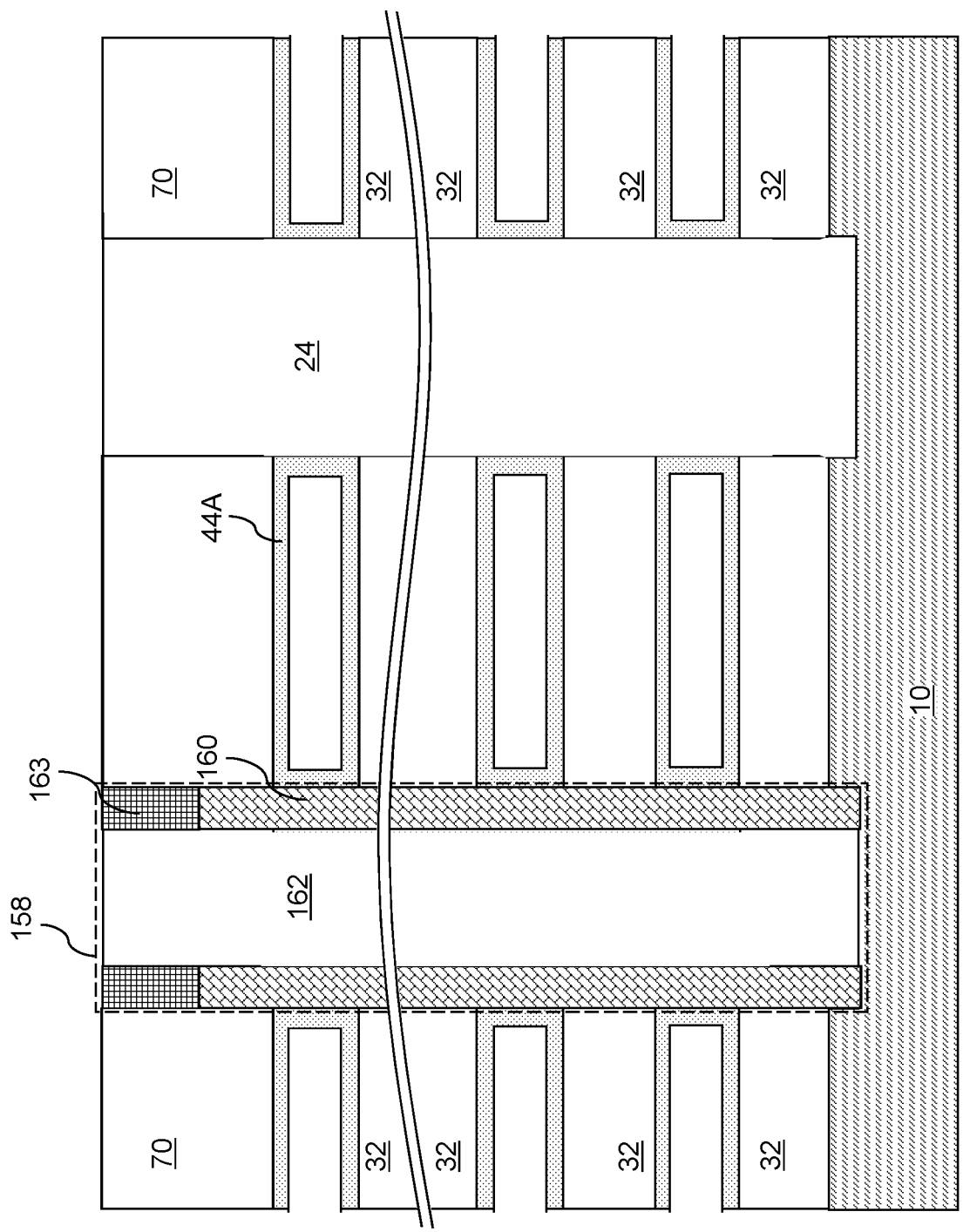
FIG. 24 is a vertical cross-sectional view of a region of the second exemplary structure after conformal deposition of an amorphous ferroelectric dielectric material layer according to the second embodiment of the present disclosure.

Referring to FIG. 24, an amorphous ferroelectric dielectric material layer 44A can be conformally deposited in the backside recesses 43 and directly on physically exposed outer sidewalls of the vertical semiconductor channels 160. The amorphous ferroelectric dielectric material layer 44A may comprise the same material as in the first embodiment.

In one embodiment, the amorphous ferroelectric dielectric material layer 44A comprises amorphous hafnium oxide ($HfO_2$) or an amorphous hafnium zirconium oxide ($Hf_xZr_{1-x}O_2$). The amorphous ferroelectric dielectric material layer 44A can be subsequently annealed into single crystalline orthorhombic phase hafnium oxide or hafnium zirconium oxide on a single crystalline template material such as the material of the vertical semiconductor channels 160. The amorphous ferroelectric dielectric material layer 44A can include a suitable dopant such as Al, Y, Gd, La, Sr, Zr or Si in order to enhance ferroelectric properties. The amorphous ferroelectric dielectric material layer 44A can have a thickness in a range from 2 nm to 40 nm, such as from 4 nm to 20 nm, although lesser and greater thicknesses can also be employed.

Figure 25:
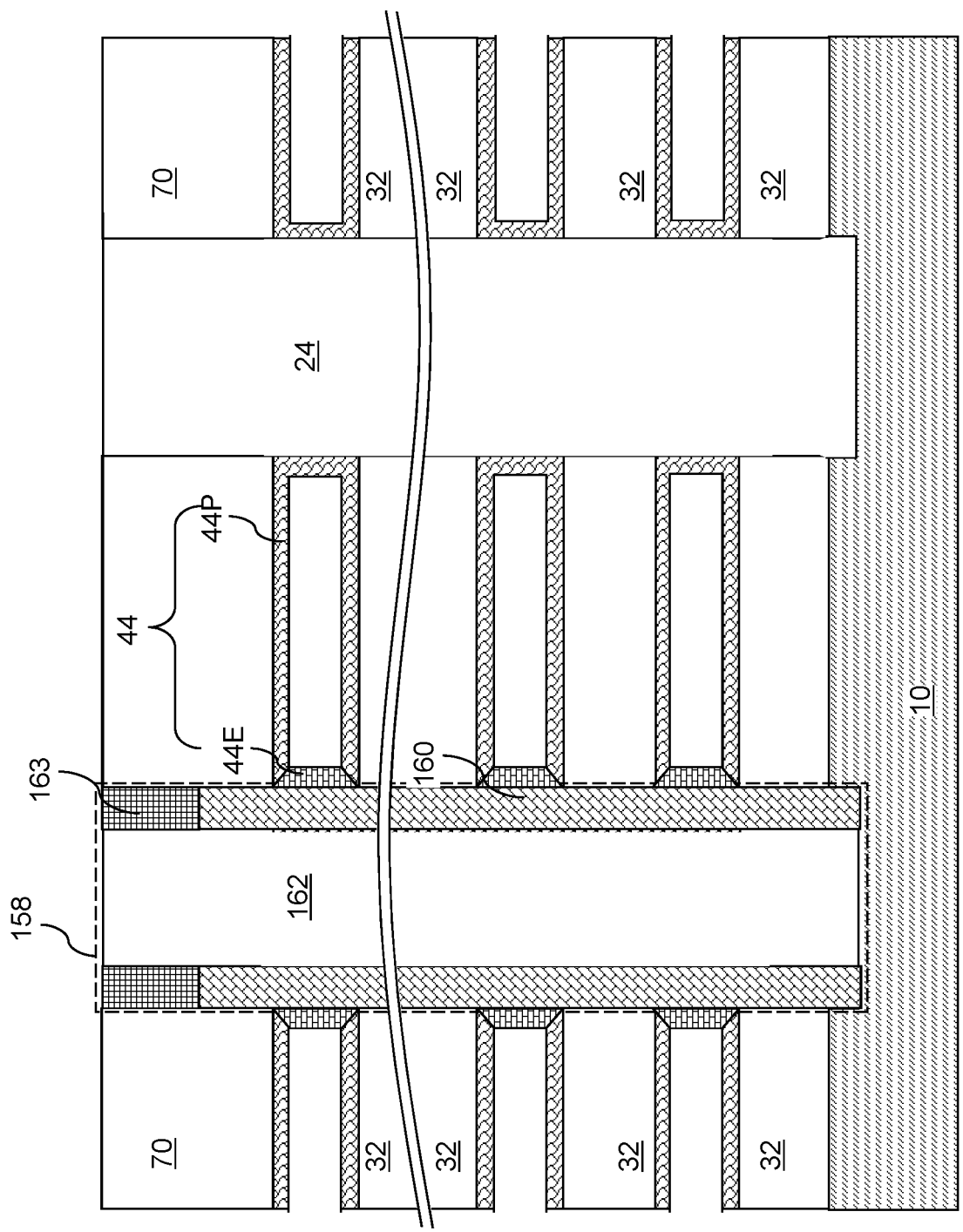
FIG. 25 is a vertical cross-sectional view of a region of the second exemplary structure after conversion of the amorphous ferroelectric dielectric material layer into vertical stacks of single crystalline/textured ferroelectric dielectric layers and polycrystalline ferroelectric dielectric layers according to the second embodiment of the present disclosure.

Referring to FIG. 25, the anneal process described above with respect to the first embodiment is performed to induce a templated crystalline growth of the amorphous ferroelectric dielectric material layer 44A. During the anneal process, portions of the amorphous ferroelectric dielectric material layer 44A that are proximal to the vertical semiconductor channels 160 are transformed into the single crystalline ferroelectric dielectric layers 44E, and portions of the amorphous ferroelectric dielectric material layer 44A that are not proximal to the vertical semiconductor channels 160 are transformed into polycrystalline ferroelectric dielectric layers 44P or remain amorphous. The set of all single crystalline ferroelectric dielectric layers 44E and the polycrystalline ferroelectric dielectric layers 44P is herein referred to as a ferroelectric dielectric material layer 44. Each single crystalline ferroelectric dielectric layer 44E can have a respective planar inner sidewall that contacts a vertical semiconductor channel 160 and a respective planar outer sidewall that is physically exposed to a respective backside recess 43. The outer sidewall of each single crystalline ferroelectric dielectric layer 44E can be laterally spaced from the inner sidewall of the respective single crystalline ferroelectric dielectric layer 44E by a uniform thickness, which can be in a range from 2 nm to 40 nm, such as from 4 nm to 20 nm, although lesser and greater thicknesses can also be employed.

Vertical stacks of single crystalline ferroelectric dielectric layers 44E are formed by the anneal process. Each vertical stack of single crystalline ferroelectric dielectric layers 44E can be formed on a respective one of the vertical semiconductor channels 160. In this embodiment, each of the single crystalline ferroelectric dielectric layers 44E is formed in epitaxial alignment with, and in direct contact with, a respective one of the vertical semiconductor channels 160. In another embodiment, the ferroelectric dielectric layers 44E are highly textured in a preferred crystallographic orientation amounting to 25% to 50% with respect to one of the vertical semiconductor channels 160, although higher or lower values could be used. Portions of the amorphous ferroelectric dielectric material layer 44A that are located on the insulating layers 32 and the insulating cap layer 70 are converted into the polycrystalline ferroelectric dielectric layers 44P or remain amorphous because amorphous surfaces of the insulating layers 32 and the insulating cap layer 70 do not provide any single crystalline template for crystallizing the amorphous ferroelectric dielectric material of the amorphous ferroelectric dielectric material layer 44A. Each set of a vertical semiconductor channel 160 and a respective vertical stack of single crystalline ferroelectric dielectric layers 44E constitutes a memory stack structure (160, 44E).

In one embodiment, the composition of the amorphous ferroelectric dielectric material layer 44A, and thus, the composition of the single crystalline ferroelectric dielectric layers 44E can be selected such that lattice mismatch between the single crystalline ferroelectric dielectric layers 44E and the vertical semiconductor channels 160 is minimized, and formation of defects within the single crystalline ferroelectric dielectric layers 44E is eliminated or minimized. In one embodiment, the vertical semiconductor channels 160 can include single crystalline silicon having a face-centered diamond-cubic crystal structure with a lattice constant of 0.543 nm, and the single crystalline ferroelectric dielectric layers 44E can include a crystalline hafnium oxide material in an orthorhombic phase. In this case, the crystalline hafnium oxide material in the orthorhombic phase can have a first lattice constant of about 0.52 nm, a second lattice constant of about 0.50 nm, and a third lattice constant of about 0.52 nm.

Figure 26A:
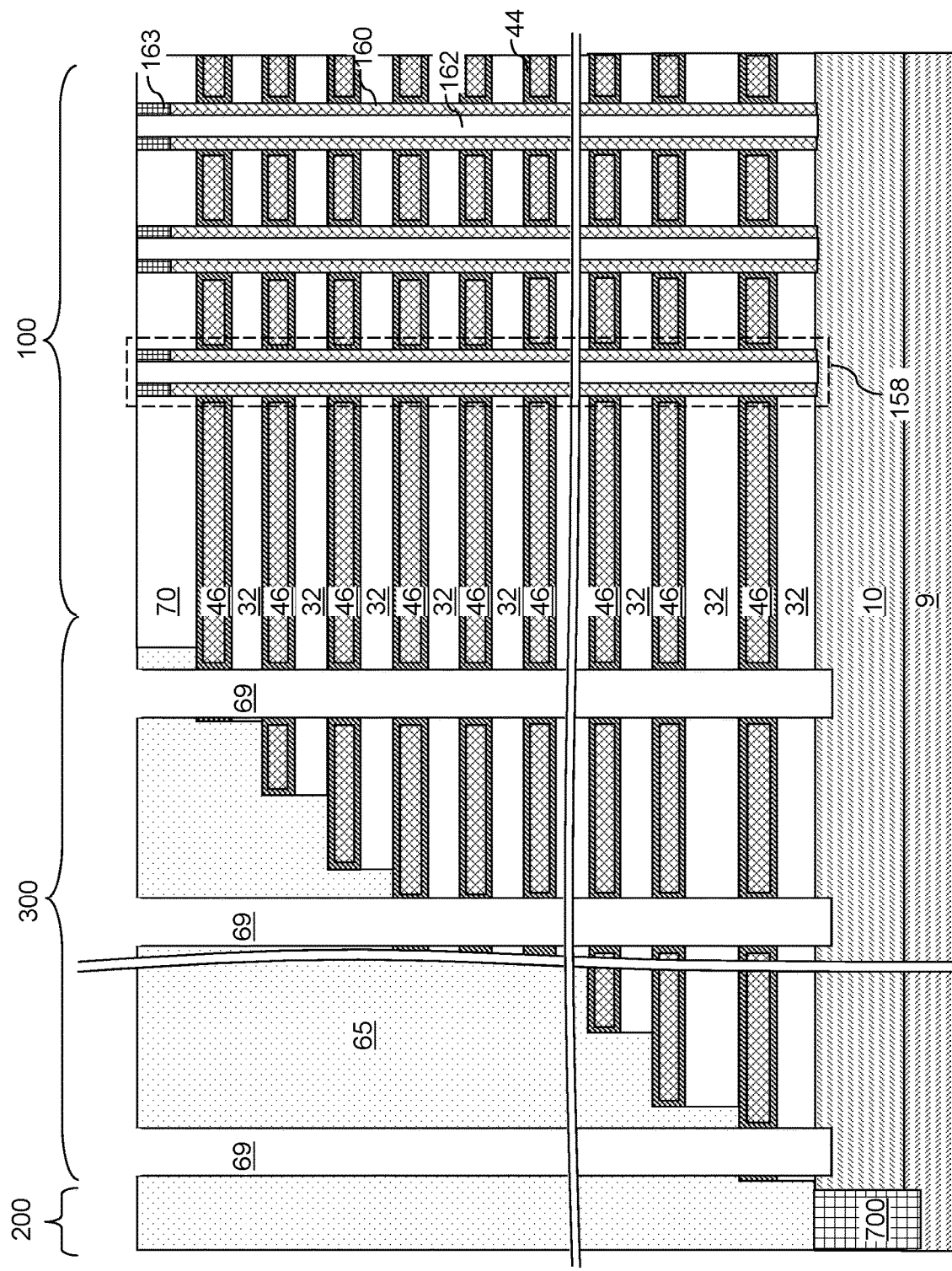
FIG. 26A is a vertical cross-sectional view of the second exemplary structure after formation of electrically conductive layers in remaining portions of the backside recesses according to the second embodiment of the present disclosure.
Figure 26B:
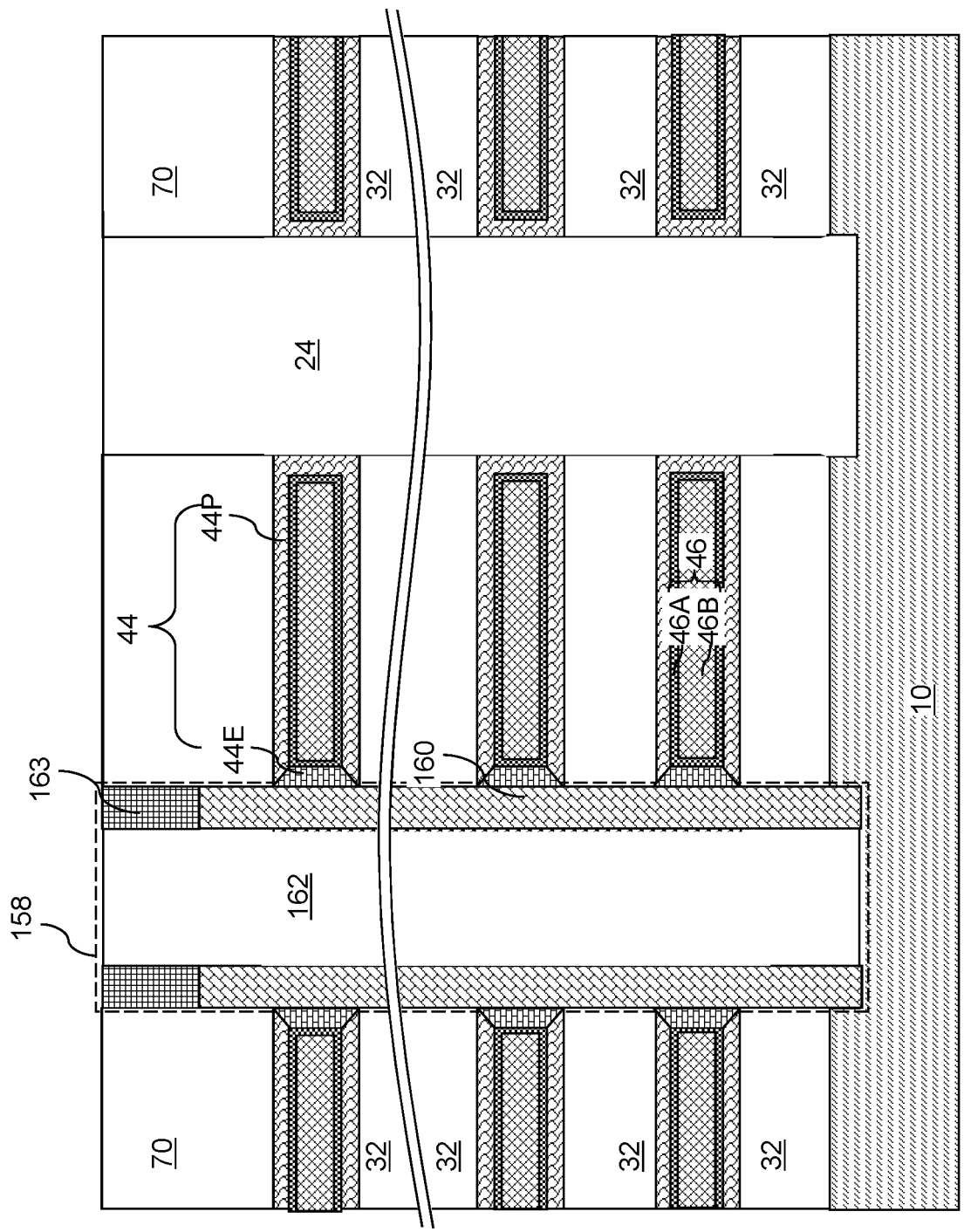
FIG. 26B is a vertical cross-sectional view of a region of the second exemplary structure of FIG. 26A.

Referring to FIGS. 26A and 26B, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

A metal fill material is deposited in the plurality of backside recesses 43, on the sidewalls of the backside openings 69, and over the top surface of the insulating cap layer 70 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory opening fill structures 158 by the metallic barrier layer 46A, which is a metallic barrier layer that blocks diffusion of fluorine atoms therethrough.

A plurality of electrically conductive layers 46 can be formed in the plurality of backside recesses 43, and a continuous electrically conductive material layer can be formed on the sidewalls of each backside opening 69 and over the insulating cap layer 70. Each electrically conductive layer 46 includes a portion of the metallic barrier layer 46A and a portion of the metallic fill material layer 46B that are located between a vertically neighboring pair of dielectric material layers such as a pair of insulating layers 32. The continuous electrically conductive material layer includes a continuous portion of the metallic barrier layer 46A and a continuous portion of the metallic fill material layer 46B that are located in the backside openings 69 or above the insulating cap layer 70. Each sacrificial material layer 42 can be replaced with an electrically conductive layer 46. A backside cavity is present in the portion of each backside opening 69 that is not filled with the ferroelectric dielectric material layer 44 and the continuous electrically conductive material layer. The electrically conductive layers 46 are formed on the vertical stacks of single crystalline ferroelectric dielectric layers 44E in remaining volumes of the backside recesses 43.

The deposited metallic material of the continuous electrically conductive material layer is etched back from the sidewalls of each backside opening 69 and from above the insulating cap layer 70, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory opening fill structures 58. In other words, each electrically conductive layer 46 can be a word line that functions as a common control gate electrode for the plurality of vertical memory devices.

In one embodiment, the removal of the continuous electrically conductive material layer can be selective to the material of the ferroelectric dielectric material layer 44. In this case, a horizontal portion of the ferroelectric dielectric material layer 44 can be present at the bottom of each backside opening 69. In another embodiment, the removal of the continuous electrically conductive material layer 46L may not be selective to the material of the ferroelectric dielectric material layer 44. A cavity is present within each backside opening 69.

Figure 26C:
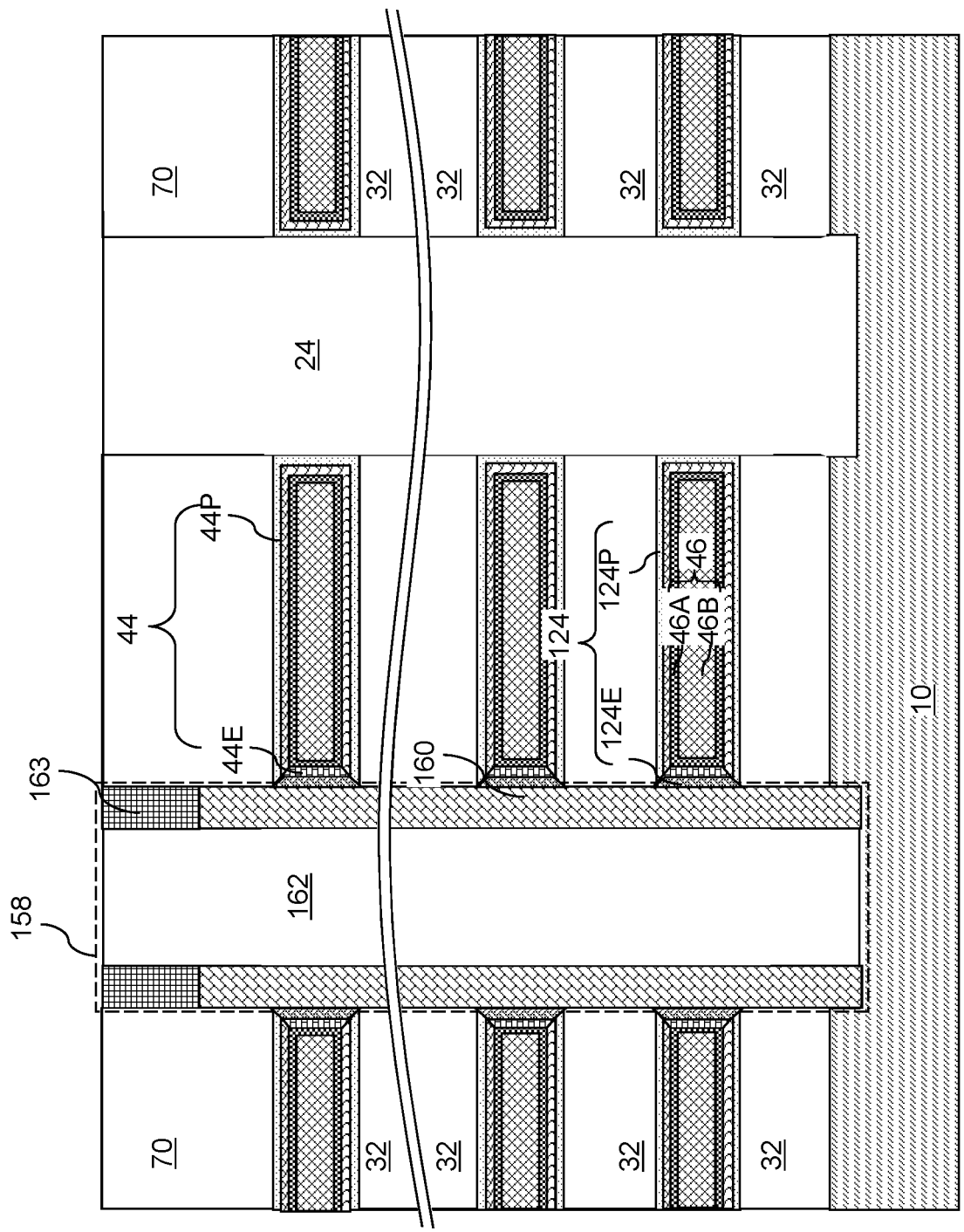
FIG. 26C is a vertical cross-sectional view of a region of an alternative embodiment of the second exemplary structure of FIG. 26A.

Referring to FIG. 26C, an alternative embodiment of the second exemplary structure is illustrated, which can be derived from the second exemplary structure by depositing an amorphous interfacial dielectric material layer directly on the physically exposed surfaces of the vertical semiconductor channels 160 and the insulating layers 32, and by converting the amorphous interfacial dielectric material layer into an interfacial dielectric material layer 124 including single crystalline interfacial dielectric layers 124E and polycrystalline interfacial dielectric layers 124P. The thickness of the interfacial dielectric material layer 124 can be in a range from 0.5 nm to 5 nm, such as from 1 nm to 3 nm, although lesser and greater thicknesses can also be employed.

The material for the amorphous interfacial dielectric material layer, and thus, the material for the interfacial dielectric material layer 124, can be selected such that the average lattice constant of the crystalline phase of the interfacial dielectric material layer 124 is between the average lattice constant of the material of the vertical semiconductor channels 160 and the average lattice constant of the material of the ferroelectric dielectric material layer 44. In one embodiment, the vertical semiconductor channels 160 can include doped single crystalline silicon having an average lattice constant of about 0.543 nm, and the ferroelectric dielectric material layer 44 can include hafnium oxide or hafnium zirconium oxide having an average lattice constant in a range from 0.50 nm to 0.51 nm. In one embodiment, the material for the amorphous interfacial dielectric material layer (and the material for the interfacial dielectric material layer 124) can include yttria-stabilized zirconia, in which a cubic crystal structure of zirconium oxide is stabilized at room temperature by an addition of yttrium oxide. The molar percentage of yttria within the yttria-stabilized zirconia material can be in a range from 2% to 10%, such as from 3% to 8%. The crystalline phase of the yttria-stabilized zirconia has a cubic crystal structure with a lattice constant of about 0.51 nm-0.52 nm, which is the average lattice constant. The intermediate average lattice constant of the yttria-stabilized zirconia can reduce interfacial defect density by gradually accommodating lattice mismatch between the average lattice constant of the crystalline material of the vertical semiconductor channels 160 and the ferroelectric dielectric material layer 44.

Figure 27A:
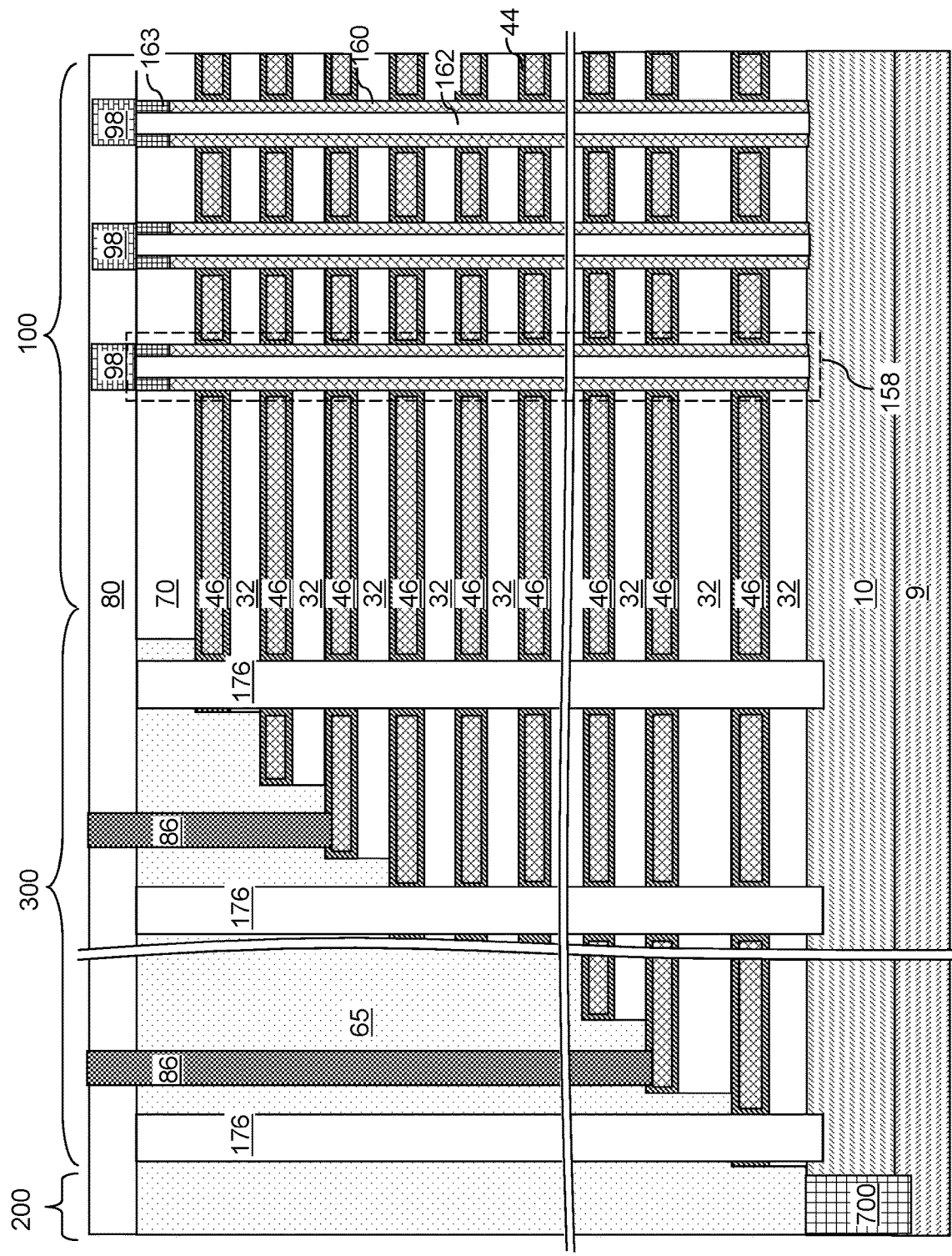
FIG. 27A is a vertical cross-sectional view of the second exemplary structure after formation of contact via structures and bit lines according to the second embodiment of the present disclosure.
Figure 27B:
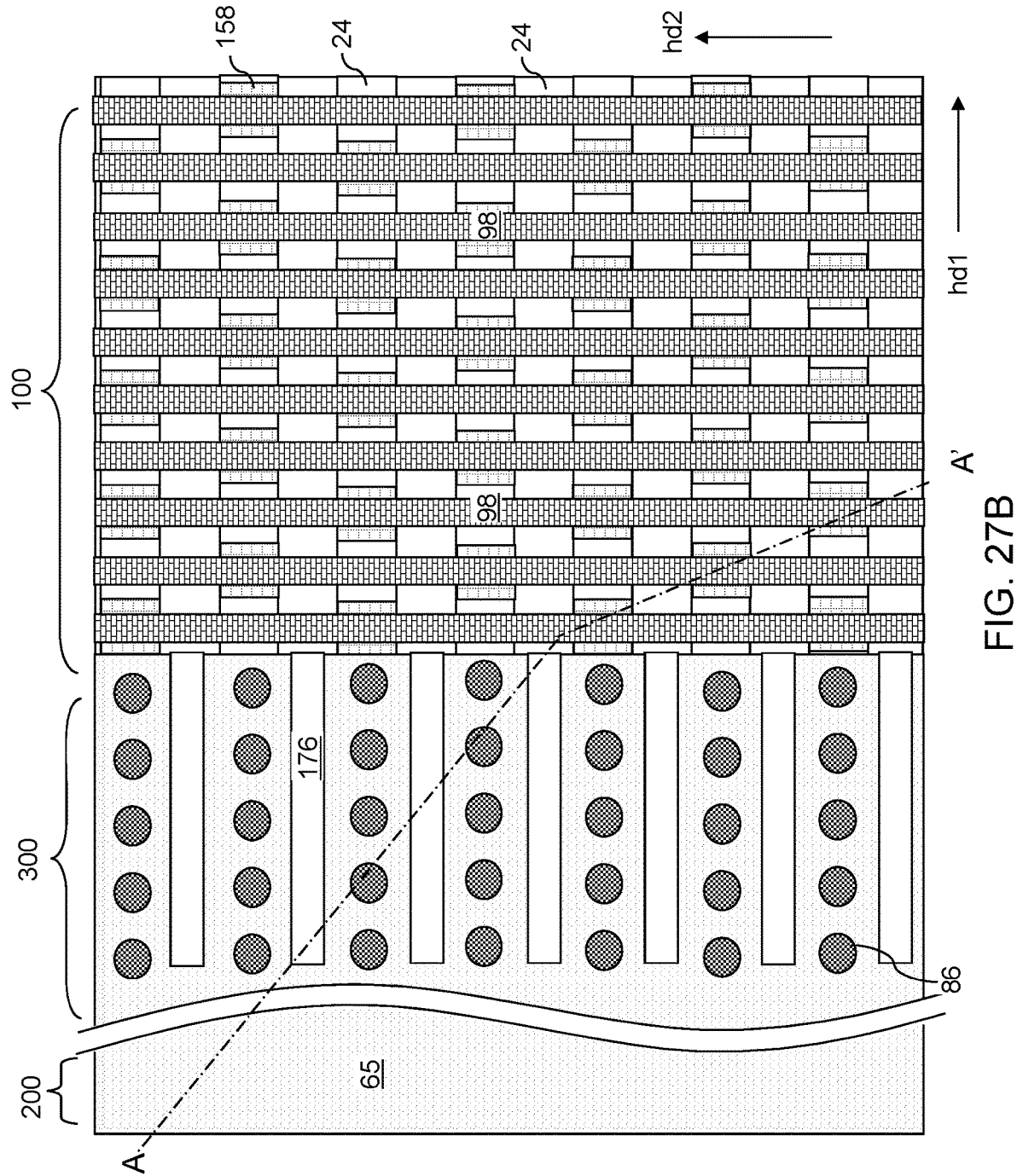
FIG. 27B is a top-down view of the region of the second exemplary structure of FIG. 27A.

Referring to FIGS. 27A and 27B, the backside openings are filled with a dielectric material such as silicon oxide to form backside opening fill structures 176. An interconnect-level dielectric layer 80 can be deposited over the insulating cap layer 70. Word line contact via structures 86 can be formed through the interconnect-level dielectric layer 80 and the retro-stepped dielectric material portion 65 on a respective one of the electrically conductive layers 46 in the staircase region 200. Bit lines 98 laterally extending along the second horizontal direction hd2 can be formed in a manner that is electrically connected to a respective subset of the drain regions 163. Each bit lines 98 may directly contact the respective subset of the drain regions 163, or a set of contact via structures (not shown) may be employed to electrically connect each bit line 98 to the respective subset of the drain regions 163.

Referring to all drawings and according to various embodiments of the present disclosure, a three-dimensional memory device is provided, which comprises: an alternating stack of insulating layers 32 and electrically conductive layers 46 located over a substrate (9, 10); and memory stack structures extending through the alternating stack (32, 46), wherein each of the memory stack structures (160, 44E) comprises a vertical stack of single crystalline ferroelectric dielectric layers 44E and a respective vertical semiconductor channel 160.

In one embodiment, the vertical semiconductor channel 160 of each of the memory stack structures (160, 44E) is single crystalline throughout, and the single crystalline ferroelectric dielectric layers 44E are textured. In one embodiment, the three-dimensional memory device comprises a single crystalline semiconductor material (10 and/or 9) located in an upper portion of the substrate (9, 10), wherein each vertical semiconductor channel 160 is epitaxially aligned to the single crystalline semiconductor material (10 and/or 9).

In one embodiment, the respective vertical semiconductor channel 160 directly contacts each single crystalline ferroelectric dielectric layer 44E in each memory stack structure (160, 44E). Each single crystalline ferroelectric dielectric layer 44E within the vertical stack is epitaxially aligned to the vertical semiconductor channel 160 within each of the memory stack structures (160, 44E).

In another embodiment, the respective vertical semiconductor channel 160 is spaced apart from each single crystalline ferroelectric dielectric layer 44E within the vertical stack 44E in each memory stack structure (160, 44E) by the interfacial dielectric material layer 124, such as yttria stabilized zirconia layer. Thus, vertical semiconductor channel 160 directly contacts interfacial dielectric material layer 124, and the interfacial dielectric material layer 124 directly contacts each single crystalline ferroelectric dielectric layer 44E.

In one embodiment, each vertically neighboring pair of an insulating layer 32 and an electrically conductive layer 46 is vertically spaced from each other by a respective polycrystalline ferroelectric material layer 44P. In one embodiment, the polycrystalline ferroelectric material layer 44P has a same material composition and a same thickness as the single crystalline ferroelectric dielectric layers 44E in the vertical stacks of single crystalline ferroelectric dielectric layers 44E.

In one embodiment, the three-dimensional memory device comprises an array of discrete memory openings 49 vertically extending through the alternating stack (32, 46), wherein each of the vertical semiconductor channels 160 is located within a respective memory opening 49 of the array of discrete memory openings 49.

In one embodiment, interfaces between each vertical semiconductor channel 160 and a respective vertical stack of single crystalline dielectric material layers 44E are vertically coincident with interfaces between the insulating layers 32 and the vertical semiconductor channels 160.

In one embodiment, interfaces between each vertical semiconductor channel 160 and a respective vertical stack of single crystalline dielectric material layers 44E are laterally offset outward from interfaces between the insulating layers 32 and the vertical semiconductor channels 160.

In one embodiment, the three-dimensional memory device comprises an array of line trenches 149 vertically extending through the alternating stack (32, 46), laterally extending along a first horizontal direction hd1, and laterally spaced apart along a second horizontal direction hd2, wherein each of the line trenches 149 is filled with a respective laterally alternating sequence of dielectric pillar structures 24 and memory opening fill structures 158.

In one embodiment, each neighboring pair of memory opening fill structures 158 is laterally spaced apart by, and is laterally contacted by, a respective dielectric core 24.

In one embodiment, the three-dimensional memory device comprises drain regions 163 contacting a top end of a respective one of the vertical semiconductor channels 160.

The various embodiments of the present disclosure include single crystalline ferroelectric dielectric layers 44E, which do not include grain boundaries and have a lower defect density than a polycrystalline ferroelectric dielectric material having a same composition. Absence of grain boundaries and the lower defect density in the single crystalline ferroelectric dielectric layers 44E provide superior device characteristics for the single crystalline ferroelectric dielectric layers 44E through uniformity of ferroelectric response to applied bias voltages, improved program slope and reduction of leakage current therethrough during operation of the three-dimensional ferroelectric memory device.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
an alternating stack of insulating layers and electrically conductive layers located over a substrate; and
memory stack structures extending through the alternating stack, wherein each of the memory stack structures comprises a vertical stack of single crystalline ferroelectric dielectric layers and a respective vertical semiconductor channel;
wherein the vertical semiconductor channel of each of the memory stack structures directly contacts each single crystalline ferroelectric dielectric layer in the same memory stack structure.

2. The three-dimensional memory device of claim 1, wherein each single crystalline ferroelectric dielectric layer within the vertical stack is epitaxially aligned to the vertical semiconductor channel within each of the memory stack structures.

3. A three-dimensional memory device, comprising:
an alternating stack of insulating layers and electrically conductive layers located over a substrate; and
memory stack structures extending through the alternating stack, wherein each of the memory stack structures comprises a vertical stack of single crystalline ferroelectric dielectric layers and a respective vertical semiconductor channel;
wherein:
each vertically neighboring pair of an insulating layer and an electrically conductive layer is vertically spaced from each other by a respective polycrystalline ferroelectric material layer; and
the polycrystalline ferroelectric material layer has a same material composition and a same thickness as the single crystalline ferroelectric dielectric layers in the vertical stacks of single crystalline ferroelectric dielectric layers.

4. A method of forming a three-dimensional memory device, comprising:
forming an alternating stack of insulating layers and sacrificial material layers over a substrate;
forming openings through the alternating stack;
forming vertical semiconductor channels comprising a respective single crystalline semiconductor material in the openings through the alternating stack;
forming backside recesses by removing the sacrificial material layers;
forming vertical stacks of single crystalline ferroelectric dielectric layers, wherein each vertical stack of single crystalline ferroelectric dielectric layers is formed adjacent to a respective one of the vertical semiconductor channels; and
forming electrically conductive layers on the vertical stacks of single crystalline ferroelectric dielectric layers in remaining volumes of the backside recesses;
wherein each of the single crystalline ferroelectric dielectric layers is formed in epitaxial alignment with, and in direct contact with, a respective one of the vertical semiconductor channels.

5. The method of claim 4, further comprising:
conformally depositing an amorphous ferroelectric dielectric material layer in the backside recesses and directly on physically exposed outer sidewalls of the vertical semiconductor channels; and
inducing a templated crystalline growth of the amorphous ferroelectric dielectric material layer employing the vertical semiconductor channels as an epitaxial template by performing an anneal process, wherein portions of the amorphous ferroelectric dielectric material layer that are proximal to the vertical semiconductor channels are transformed into the single crystalline ferroelectric dielectric layers and portions of the amorphous ferroelectric dielectric material layer that are not proximal to the vertical semiconductor channels are transformed into polycrystalline ferroelectric dielectric layers or remain amorphous.

6. A method of forming a three-dimensional memory device, comprising:
forming an alternating stack of insulating layers and sacrificial material layers over a substrate;
forming openings through the alternating stack;
forming vertical semiconductor channels comprising a respective single crystalline semiconductor material in the openings through the alternating stack;
forming backside recesses by removing the sacrificial material layers;

forming vertical stacks of single crystalline ferroelectric dielectric layers, wherein each vertical stack of single crystalline ferroelectric dielectric layers is formed adjacent to a respective one of the vertical semiconductor channels;

forming electrically conductive layers on the vertical stacks of single crystalline ferroelectric dielectric layers in remaining volumes of the backside recesses;

forming an array of line trenches through the alternating stack, wherein the line trenches laterally extend along a first horizontal direction and are laterally spaced apart along a second horizontal direction;

filling each of the line trenches with a respective set of dielectric material portions that define rows of vertical cavities, wherein each of the vertical semiconductor channels is formed within a respective one of the vertical cavities;

forming a combination of a pair of sacrificial material rails and a dielectric material rail in each of the line trenches;

dividing each combination of the pair of sacrificial material rails and the dielectric material rail into multiple composite pillar structures including a respective dielectric core and a respective pair of sacrificial material strips, wherein pillar cavities are formed in volumes from which portions of the sacrificial material rails and the dielectric material rails are removed;

forming dielectric pillar structures in the pillar cavities; and forming the vertical cavities by removing the sacrificial material strips selective to the dielectric pillar structures and the dielectric cores.

* * * * *